(12) United States Patent
Yamazaki

(10) Patent No.: US 9,570,484 B2
(45) Date of Patent: Feb. 14, 2017

(54) SEMICONDUCTOR DEVICE AND MANUFACTURING METHOD THEREOF

(71) Applicant: Semiconductor Energy Laboratory Co., Ltd., Atsugi-shi, Kanagawa-ken (JP)

(72) Inventor: Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/518,125

(22) Filed: Oct. 20, 2014

(65) Prior Publication Data
US 2015/0037934 A1    Feb. 5, 2015

Related U.S. Application Data

(62) Division of application No. 13/345,795, filed on Jan. 9, 2012, now Pat. No. 8,921,948.

(30) Foreign Application Priority Data

Jan. 12, 2011 (JP) ................................ 2011-004418

(51) Int. Cl.
    *H01L 27/12*       (2006.01)
    *H01L 29/786*     (2006.01)
    (Continued)

(52) U.S. Cl.
    CPC ......... *H01L 27/1288* (2013.01); *H01L 21/467* (2013.01); *H01L 21/469* (2013.01);
    (Continued)

(58) Field of Classification Search
    CPC ............. H01L 27/1214; H01L 27/1222; H01L 27/124; H01L 27/1251; H01L 27/1259; H01L 27/127; H01L 27/1274; H01L 27/1288

See application file for complete search history.

(56) References Cited

U.S. PATENT DOCUMENTS 5,528,032 A    6/1996   Uchiyama
5,731,856 A    3/1998   Kim et al.
(Continued)

FOREIGN PATENT DOCUMENTS

EP     1737044 A    12/2006
EP     2226847 A    9/2010
(Continued)

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

(Continued)

*Primary Examiner* — Eduardo A Rodela
(74) *Attorney, Agent, or Firm* — Robinson Intellectual Property Law Office; Eric J. Robinson

(57) ABSTRACT

The semiconductor device includes a gate electrode over a substrate, a gate insulating layer over the gate electrode, an oxide semiconductor layer over the gate insulating layer, and a source electrode and a drain electrode over the oxide semiconductor layer. A length of part of an outer edge of the oxide semiconductor layer from an outer edge of the source electrode to an outer edge of the drain electrode is more than three times, preferably more than five times as long as a channel length of the semiconductor device. Further, oxygen is supplied from the gate insulating layer to the oxide semiconductor layer by heat treatment. In addition, an insulating layer is formed after the oxide semiconductor layer is selectively etched.

12 Claims, 26 Drawing Sheets

(51) Int. Cl.
*H01L 21/467* (2006.01)
*H01L 21/469* (2006.01)
*H01L 21/477* (2006.01)
*H01L 29/66* (2006.01)
*H01L 21/02* (2006.01)

(52) U.S. Cl.
CPC .......... *H01L 21/477* (2013.01); *H01L 27/127* (2013.01); *H01L 27/1214* (2013.01); *H01L 27/1259* (2013.01); *H01L 29/66969* (2013.01); *H01L 29/7869* (2013.01); *H01L 21/02554* (2013.01); *H01L 21/02565* (2013.01); *H01L 21/02631* (2013.01); *H01L 29/78693* (2013.01)

(56) References Cited

U.S. PATENT DOCUMENTS

| | | | |
|---|---|---|---|
| 5,744,864 | A | 4/1998 | Cillessen et al. |
| 6,180,957 | B1 | 1/2001 | Miyasaka et al. |
| 6,294,274 | B1 | 9/2001 | Kawazoe et al. |
| 6,493,048 | B1 | 12/2002 | Baek et al. |
| 6,563,174 | B2 | 5/2003 | Kawasaki et al. |
| 6,727,522 | B1 | 4/2004 | Kawasaki et al. |
| 6,740,927 | B1 | 5/2004 | Jeng |
| 7,005,717 | B2 | 2/2006 | Eisenbeiser et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,198,968 | B2 | 4/2007 | Chae et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,341,899 | B2 | 3/2008 | Huang |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,601,984 | B2 | 10/2009 | Sano et al. |
| 7,615,488 | B2 | 11/2009 | Maekawa et al. |
| 7,674,650 | B2 | 3/2010 | Akimoto et al. |
| 7,732,819 | B2 | 6/2010 | Akimoto et al. |
| 7,749,820 | B2 | 7/2010 | Miyairi |
| 7,821,002 | B2 | 10/2010 | Yamazaki et al. |
| 7,910,490 | B2 | 3/2011 | Akimoto et al. |
| 7,932,521 | B2 | 4/2011 | Akimoto et al. |
| 7,994,500 | B2 | 8/2011 | Kim et al. |
| 8,058,645 | B2 | 11/2011 | Jeong et al. |
| 8,067,770 | B2 | 11/2011 | Ha et al. |
| 8,129,719 | B2 | 3/2012 | Yamazaki et al. |
| 8,148,721 | B2 * | 4/2012 | Hayashi .............. H01L 29/7869 257/43 |
| 8,148,779 | B2 | 4/2012 | Jeong et al. |
| 8,174,021 | B2 | 5/2012 | Oikawa et al. |
| 8,183,099 | B2 | 5/2012 | Sakata |
| 8,188,480 | B2 | 5/2012 | Itai |
| 8,202,365 | B2 | 6/2012 | Umeda et al. |
| 8,203,143 | B2 | 6/2012 | Imai |
| 8,236,635 | B2 | 8/2012 | Suzawa et al. |
| 8,253,905 | B2 | 8/2012 | Lu et al. |
| 8,274,077 | B2 | 9/2012 | Akimoto et al. |
| 8,274,078 | B2 | 9/2012 | Itagaki et al. |
| 8,309,966 | B2 | 11/2012 | Tsai et al. |
| 8,338,226 | B2 | 12/2012 | Asano et al. |
| 8,350,261 | B2 | 1/2013 | Sakata et al. |
| 8,367,486 | B2 | 2/2013 | Sakata |
| 8,536,571 | B2 | 9/2013 | Yamazaki |
| 8,729,546 | B2 | 5/2014 | Suzawa et al. |
| 8,741,702 | B2 | 6/2014 | Ito et al. |
| 8,822,991 | B2 | 9/2014 | Sakata |
| 9,196,742 | B2 * | 11/2015 | Kanzaki .............. G02F 1/1368 |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0104128 | A1 | 5/2005 | Okumura |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0170336 | A1 * | 7/2008 | Tsuchiya .............. B82Y 10/00 360/324 |
| 2008/0182358 | A1 | 7/2008 | Cowdery-Corvan et al. |
| 2008/0224133 | A1 | 9/2008 | Park et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/1025456 | | 10/2008 | Hoffman et al. |
| 2008/0296568 | A1 | 12/2008 | Ryu et al. |
| 2008/0308796 | A1 | 12/2008 | Akimoto et al. |
| 2008/0308805 | A1 | 12/2008 | Akimoto et al. |
| 2008/0308806 | A1 | 12/2008 | Akimoto et al. |
| 2009/0008639 | A1 | 1/2009 | Akimoto et al. |
| 2009/0068773 | A1 | 3/2009 | Lai et al. |
| 2009/1007332 | | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0250694 | A1 * | 10/2009 | Tanaka .............. H01L 27/1225 257/43 |
| 2009/0278122 | A1 | 11/2009 | Hosono et al. |

(56) References Cited

U.S. PATENT DOCUMENTS

| | | | |
|---|---|---|---|
| 2009/0280600 A1 | 11/2009 | Hosono et al. | |
| 2009/0305461 A1 | 12/2009 | Akimoto et al. | |
| 2010/0035379 A1 | 2/2010 | Miyairi et al. | |
| 2010/0051949 A1 | 3/2010 | Yamazaki et al. | |
| 2010/0065844 A1 | 3/2010 | Tokunaga | |
| 2010/0092800 A1 | 4/2010 | Itagaki et al. | |
| 2010/0102313 A1* | 4/2010 | Miyairi | H01L 27/1225 257/43 |
| 2010/0105163 A1 | 4/2010 | Ito et al. | |
| 2010/0109002 A1 | 5/2010 | Itagaki et al. | |
| 2010/0136743 A1 | 6/2010 | Akimoto et al. | |
| 2010/0155717 A1* | 6/2010 | Yano | C23C 14/086 257/43 |
| 2010/0155719 A1* | 6/2010 | Sakata | H01L 29/7869 257/43 |
| 2010/0159639 A1 | 6/2010 | Sakata | |
| 2010/0200851 A1 | 8/2010 | Oikawa et al. | |
| 2010/0224872 A1 | 9/2010 | Kimura | |
| 2010/0230683 A1 | 9/2010 | Miyairi | |
| 2010/0244034 A1 | 9/2010 | Miyairi | |
| 2010/0320458 A1 | 12/2010 | Umeda et al. | |
| 2010/0320459 A1 | 12/2010 | Umeda et al. | |
| 2011/0012106 A1 | 1/2011 | Yamazaki et al. | |
| 2011/0012118 A1 | 1/2011 | Yamazaki et al. | |
| 2011/0017995 A1 | 1/2011 | Yamazaki et al. | |
| 2011/0024740 A1 | 2/2011 | Yamazaki et al. | |
| 2011/0024750 A1 | 2/2011 | Yamazaki et al. | |
| 2011/0024751 A1 | 2/2011 | Yamazaki et al. | |
| 2011/0027980 A1 | 2/2011 | Yamazaki et al. | |
| 2011/0031491 A1 | 2/2011 | Yamazaki et al. | |
| 2011/0031492 A1 | 2/2011 | Yamazaki et al. | |
| 2011/0031493 A1 | 2/2011 | Yamazaki et al. | |
| 2011/0031499 A1 | 2/2011 | Kimura et al. | |
| 2011/0037068 A1 | 2/2011 | Yamazaki et al. | |
| 2011/0079777 A1 | 4/2011 | Akimoto | |
| 2011/0104851 A1 | 5/2011 | Akimoto et al. | |
| 2011/0117697 A1 | 5/2011 | Akimoto et al. | |
| 2011/0121290 A1 | 5/2011 | Akimoto et al. | |
| 2011/0133180 A1 | 6/2011 | Yamazaki | |
| 2011/0136302 A1 | 6/2011 | Yamazaki et al. | |
| 2011/0147737 A1 | 6/2011 | Yamazaki et al. | |
| 2011/0163311 A1 | 7/2011 | Akimoto et al. | |
| 2011/0193083 A1 | 8/2011 | Kim et al. | |
| 2011/0215328 A1 | 9/2011 | Morosawa et al. | |
| 2011/0312111 A1 | 12/2011 | Yamazaki et al. | |
| 2012/0119205 A1 | 5/2012 | Taniguchi et al. | |
| 2012/0122277 A1 | 5/2012 | Yamazaki et al. | |
| 2012/0175609 A1 | 7/2012 | Yamazaki | |
| 2012/0175625 A1 | 7/2012 | Yamazaki | |
| 2012/0178224 A1 | 7/2012 | Yamazaki | |
| 2012/0178249 A1 | 7/2012 | Yamazaki | |
| 2014/0080253 A1 | 3/2014 | Yamazaki | |
| 2014/0273343 A1 | 9/2014 | Ito et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2009-224479 A | 10/2009 |
| JP | 2009-231613 A | 10/2009 |
| JP | 2010-016347 A | 1/2010 |
| JP | 4415062 | 2/2010 |
| JP | 2010-067954 A | 3/2010 |
| JP | 2010-177431 A | 8/2010 |
| JP | 2010-212673 A | 9/2010 |
| JP | 4571221 | 10/2010 |
| JP | 2010-251732 A | 11/2010 |
| JP | 2012-160679 A | 8/2012 |
| TW | 201044581 | 12/2010 |
| WO | WO-2004/114391 | 12/2004 |
| WO | WO-2008/133345 | 11/2008 |

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTs", SID Digest '08 : SID International Symposium Digest of Technical Papers, May 20, 2008, vol. 39, pp. 621-624.

Prins.M et al "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the $In_2O_3$-$Ga_2ZnO_4$-ZnO system at 1350°C", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$-$ZnGa_2O_4$-ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

Osada.T et al., "15.2: Development of Driver-Integrated Panel using Amorphous In-Ga-Zn-Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters), Sep. 13, 2004, vol. 85, No. 11, pp. 1993-1995.

Li.C et al., "Modulated Structures of Homologous Compounds $InMO_3(ZnO)_m$ (M=In,Ga; m=Integer) Described by Four-Dimensional Superspace Group", Journal of Solid State Chemistry, 1998, vol. 139, pp. 347-355.

(56) References Cited

OTHER PUBLICATIONS

Son.K et al., "42.4L: Late-News Paper: 4 Inch QVGA AMOLED Driven by the Threshold Voltage Controlled Amorphous GIZO (Ga2O3-In2O3-ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector with Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs ", IDW '02 : Proceedings of The 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D at al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5Δ) Flexible Full Color Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-In. AMOLED Display with Driver Circuit Using Amorphous In-Ga-Zn-Oxide TFTs", IDW '09 : Proceedings of the 16th International Display Workshops, 2009, pp. 689-692.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by PEALD Grown ZnO TFT", IMID '07 Digest, 2007, pp. 1249-1252.

Godo.H et al., "Temperature Dependence of Characteristics and Electronic Structure for Amorphous In-Ga-Zn-Oxide TFT", AM-FPD '09 Digest of Technical Papers, Jul. 1, 2009, pp. 41-44.

Osada.T et al., "Development of Driver-Integrated Panel Using Amorphous In-Ga-Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT", SID Digest '09 : SID International Symposium Digest of Technical Papers, May 31, 2009, pp. 1110-1112.

Ohara.H et al., "21.3:4.0 In. QVGA AMOLED Display Using In-Ga-Zn-Oxide TFTs with a Novel Passivation Layer", SID Digest '09 : SID International Symposium Digest of Technical Papers, May 31, 2009, pp. 284-287.

Miyasaka.M, "Suftla Flexible Microelectronics on Their Way to Business", SID Digest '07 : SID International Symposium Digest of Technical Papers, 2007, vol. 27, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1: Polarizer-Free Reflective LCD Combined with Ultra Low-Power Driving Technology", SID Digest '09 : SID International Symposium of Technical Papers, May 31, 2009, pp. 395-398.

Lee.H et al., "Current Status of, Challenges to, and Perspective View of AM-OLED ", IDW '06 : Proceedings of the 13th International Display Workshop, Dec. 7, 2006, pp. 663-666.

Kikuchi.H et al., "62.2:Invited Paper:Fast Electro-Optical Switching in Polymer-Stabilized Liquid Crystalline Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "Spinel, YBFE2O4, and YB2FE3O7 Types of Structures for Compounds in the IN2O3 and SC2O3-A2O3-BO Systems [A; Fe, Ga, or Al; B: Mg, Fe, Ni, Cu, or Zn] at Temperatures over 1000°C", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K at al., "Amorphous Oxide Semiconductors for High-Performance Flexible Thin- Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

(56) References Cited

OTHER PUBLICATIONS

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters), 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nakayama et al., "17a-TL-8 Effect of GaO Layer on IGZO-TFT Channel", Extended Abstracts (The 57th Spring Meeting 2010), The Japan Society of Applied Physics and Related Societies, Mar. 17, 2010, pp. 21-008.

Taiwanese Office Action (Application No. 101101102) Dated Mar. 14, 2016.

\* cited by examiner

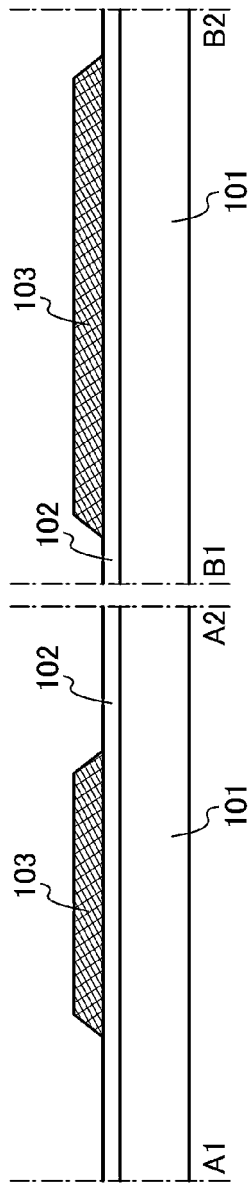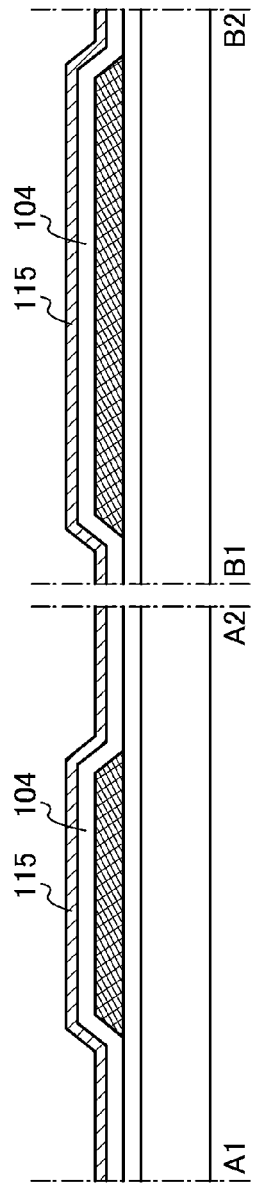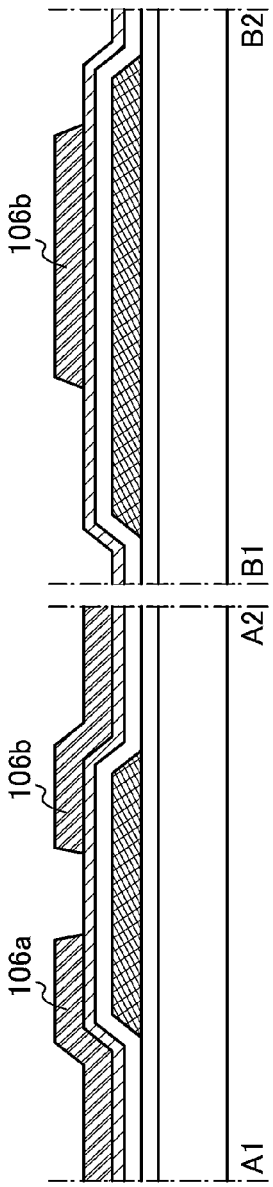

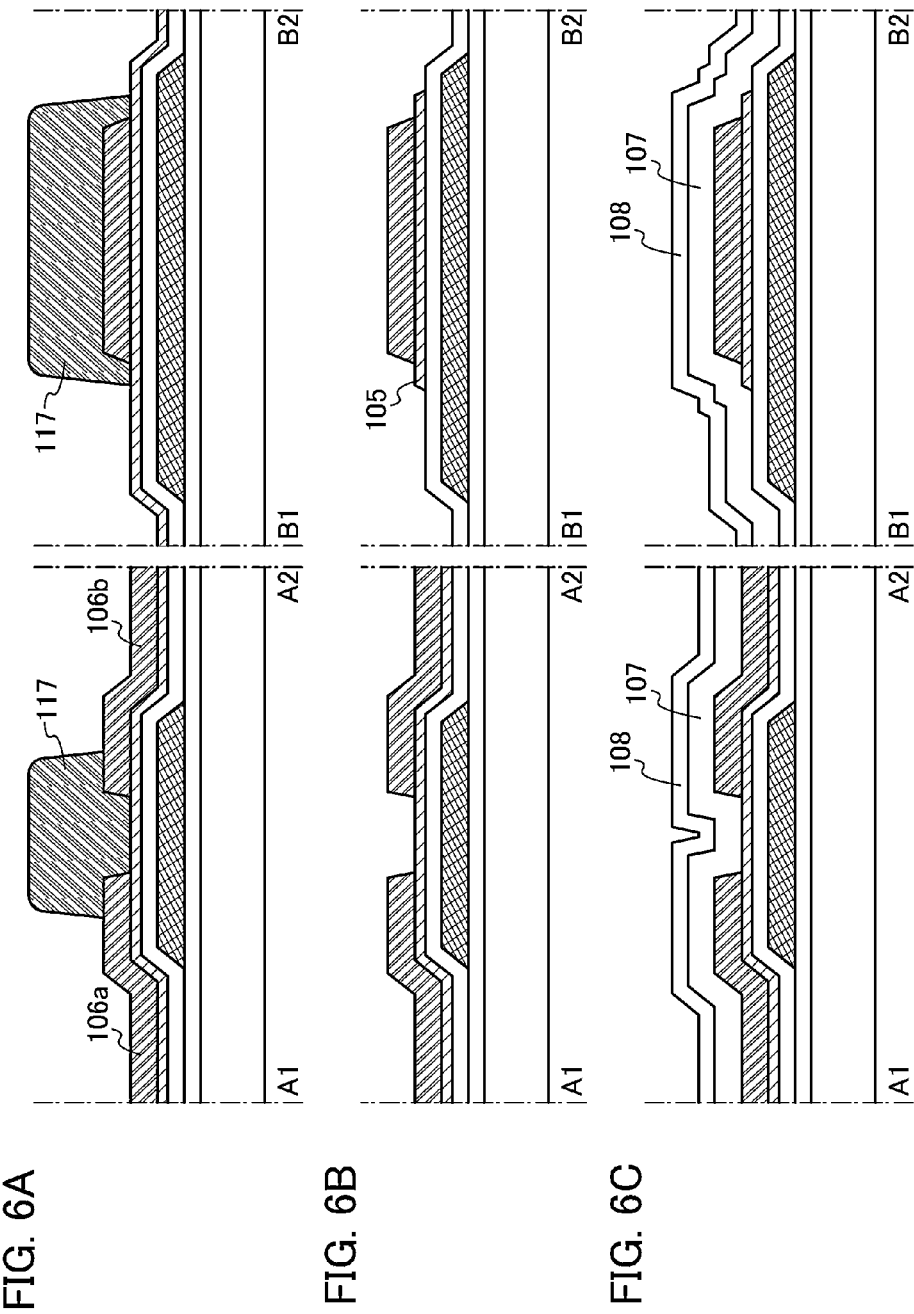

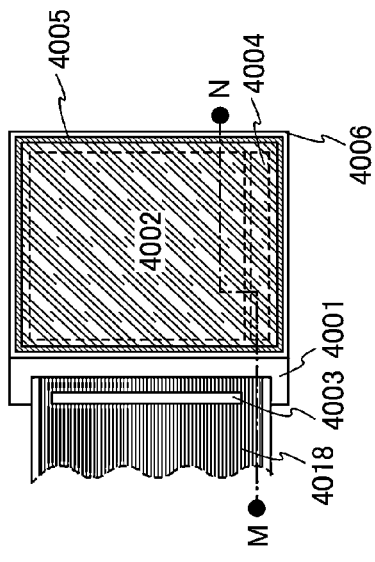
FIG. 10A1
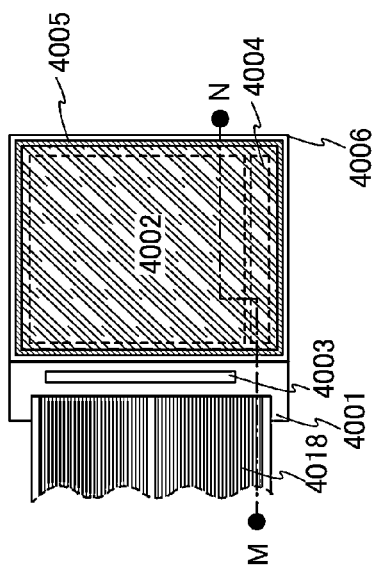
FIG. 10A2
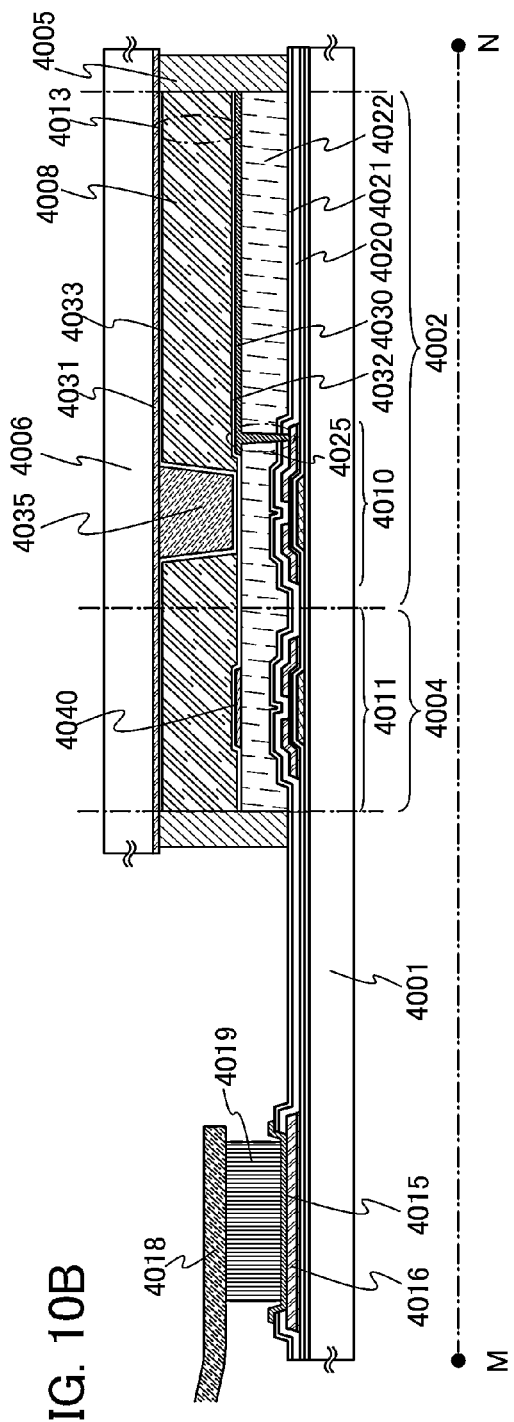
FIG. 10B

FIG. 12A1
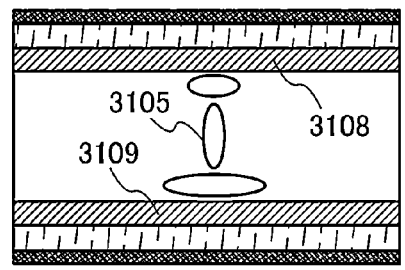
FIG. 12A2
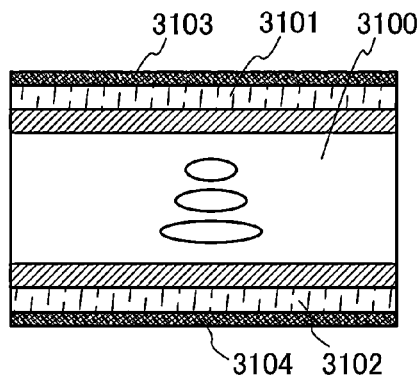
FIG. 12B1
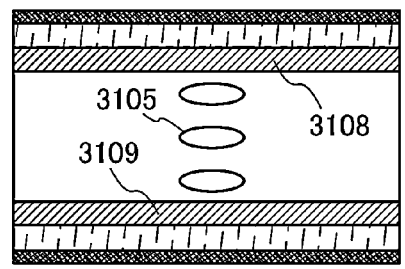
FIG. 12B2
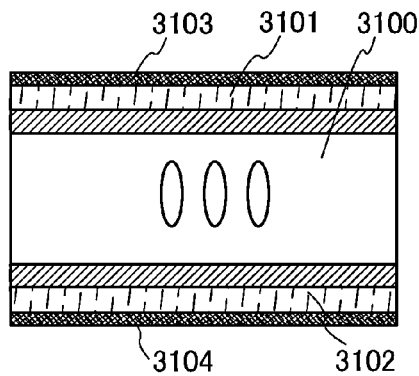
FIG. 12C1
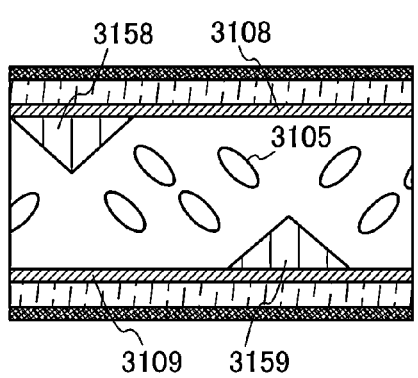
FIG. 12C2
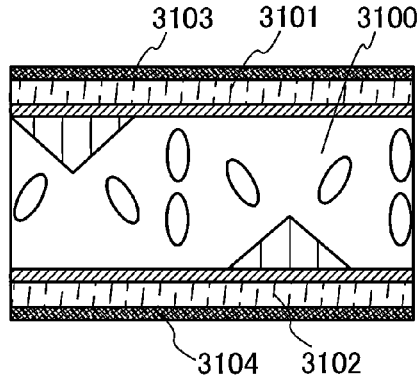

FIG. 13A1
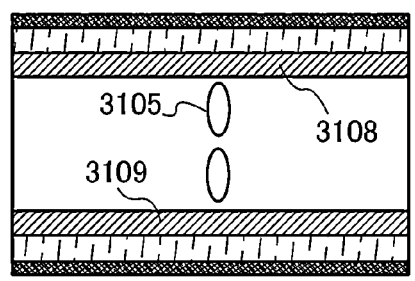
FIG. 13A2
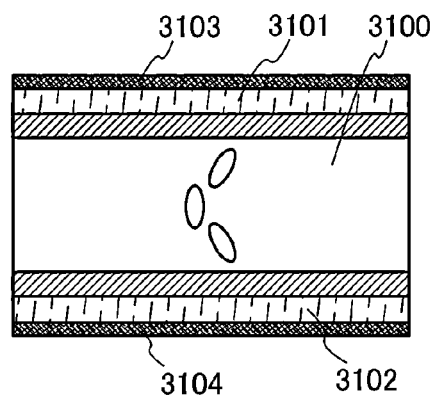
FIG. 13B1
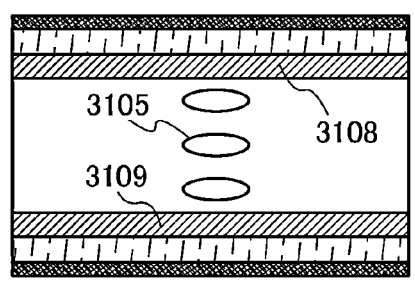
FIG. 13B2
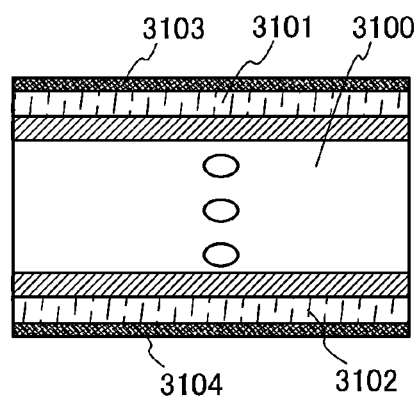

FIG. 14A1
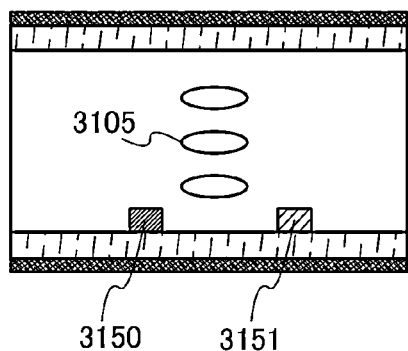
FIG. 14A2
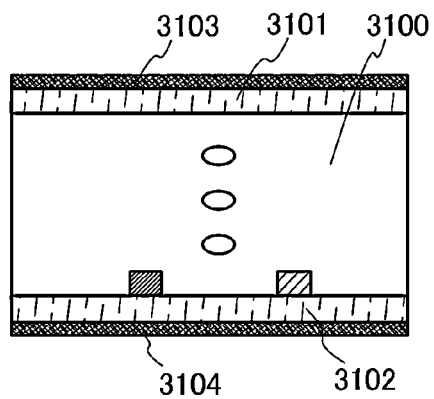
FIG. 14B1
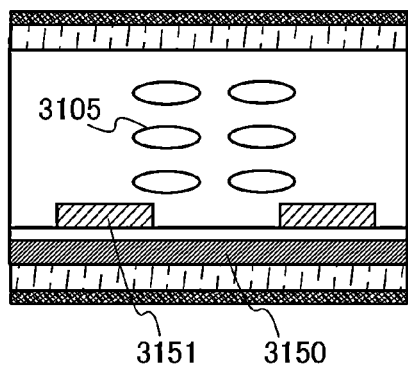
FIG. 14B2
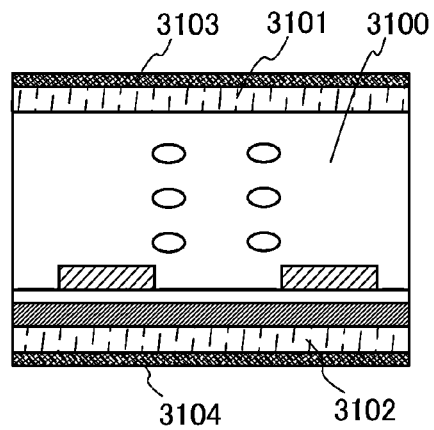

FIG. 26A
(100)
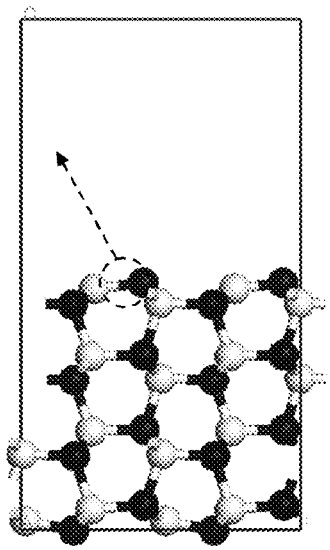
FIG. 26B
(110)
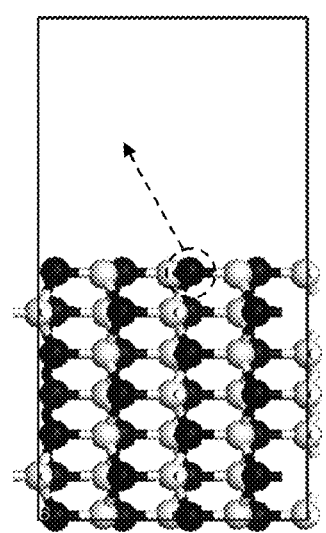
FIG. 26C (001)
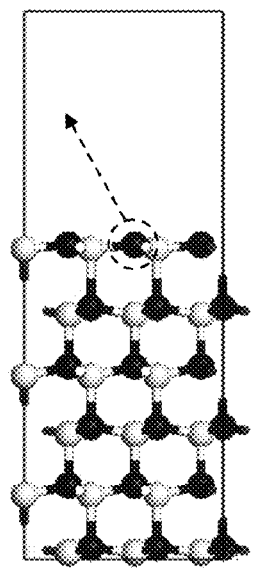

SEMICONDUCTOR DEVICE AND MANUFACTURING METHOD THEREOF

BACKGROUND OF THE INVENTION

1. Field of the Invention

The present invention relates to a semiconductor device which includes a circuit including a semiconductor element such as a transistor, and a manufacturing method of the semiconductor device. For example, the present invention relates to a power device which is mounted on a power supply circuit; a semiconductor integrated circuit including a memory, a thyristor, a converter, an image sensor, or the like; and an electronic device on which an electro-optical device typified by a liquid crystal display panel, a light-emitting display device including a light-emitting element, or the like is mounted as a component.

In this specification, a semiconductor device generally refers to a device which can function by utilizing semiconductor characteristics; an electro-optical device, a light-emitting display device, a semiconductor circuit, and an electronic device are all included in the category of the semiconductor device.

2. Description of the Related Art

Many transistors formed over a glass substrate or the like are manufactured using amorphous silicon, polycrystalline silicon, or the like, as typically seen in liquid crystal display devices. Although a transistor manufactured using amorphous silicon has low field-effect mobility, it can be formed over a larger glass substrate. On the other hand, although a transistor manufactured using polycrystalline silicon has high field-effect mobility, it is not suitable for being formed over a larger glass substrate.

Other than a transistor manufactured using silicon, a technique in which a transistor is manufactured using an oxide semiconductor and applied to an electronic device or an optical device has attracted attention in recent years. For example, Patent Document 1 and Patent Document 2 disclose a technique by which a transistor is manufactured using zinc oxide or In—Ga—Zn-based oxide as an oxide semiconductor and is used as a switching element of a pixel of a display device or the like.

REFERENCE

Patent Document

[Patent Document 1] Japanese Published Patent Application No. 2007-123861

[Patent Document 2] Japanese Published Patent Application No. 2007-096055

SUMMARY OF THE INVENTION

An object of one embodiment of the present invention is to provide a semiconductor device including an oxide semiconductor layer with extremely small off-state current. Another object of one embodiment of the present invention is to provide a semiconductor device with extremely low power consumption by utilizing the semiconductor device.

One embodiment of the present invention includes a gate electrode over a substrate, a gate insulating layer over the gate electrode, an oxide semiconductor layer over the gate insulating layer, and a source electrode and a drain electrode over the oxide semiconductor layer. A length of part of an outer edge of the oxide semiconductor layer from an outer edge of the source electrode to an outer edge of the drain electrode is more than three times, preferably more than five times as long as a channel length of the semiconductor device.

In addition, a side surface of the oxide semiconductor layer may be covered with an insulating layer containing oxygen.

In addition, the oxide semiconductor layer may include at least one element selected from In, Ga, Sn, and Zn.

Further, the oxide semiconductor layer may be non-single-crystal.

Another embodiment of the present invention includes the following steps: forming a gate electrode over a substrate, forming a gate insulating layer over the gate electrode, forming an oxide semiconductor layer over the gate insulating layer, performing heat treatment after the oxide semiconductor layer is formed, forming a source electrode and a drain electrode over the oxide semiconductor layer after the heat treatment, etching the oxide semiconductor layer selectively after the source electrode and the drain electrode are formed so that an island-shaped oxide semiconductor layer is formed, and forming an insulating layer so as to cover the island-shaped oxide semiconductor layer, the source electrode, and the drain electrode.

Another embodiment of the present invention includes the following steps: forming a gate electrode over a substrate, forming a gate insulating layer over the gate electrode, forming an oxide semiconductor layer over the gate insulating layer, forming a conductive layer over the oxide semiconductor layer, performing heat treatment after the conductive layer is formed, etching the conductive layer selectively after the heat treatment so that a source electrode and a drain electrode are formed, etching the oxide semiconductor layer selectively after the source electrode and the drain electrode are formed so that an island-shaped oxide semiconductor layer is formed, and forming an insulating layer so as to cover the island-shaped oxide semiconductor layer, the source electrode, and the drain electrode.

The insulating layer covering the source electrode and the drain electrode is preferably formed immediately after the island-shaped oxide semiconductor layer is formed. In addition, the gate insulating layer is formed using a material containing excessive oxygen with respect to the stoichiometry proportion and is subjected to heat treatment after the oxide semiconductor layer is formed so that oxygen is supplied from the gate insulating layer to the oxide semiconductor layer.

The heat treatment is preferably performed at a temperature higher than or equal to 150° C. and lower than strain point of the substrate, preferably higher than or equal to 250° C. and lower than or equal to 450° C., further preferably higher than or equal to 300° C. and lower than or equal to 450° C. in an inert gas atmosphere such as a nitrogen atmosphere or a rare gas atmosphere, an oxygen gas atmosphere, or an ultra dry air atmosphere (in air whose moisture content is less than or equal to 20 ppm (the dew point: −55° C.), preferably less than or equal to 1 ppm, further preferably less than or equal to 10 ppb in the case where measurement is performed using a dew-point meter of a cavity ring-down laser spectroscopy (CRDS) system).

In the above-described oxide semiconductor layer, the concentrations of hydrogen, an alkali metal, an alkaline earth metal, and the like are reduced and the concentration of impurities is very low. Therefore, in a transistor whose channel region is formed using an oxide semiconductor, off-state current can be reduced.

An alkali metal is not an element constituting an oxide semiconductor, and therefore, is an impurity. Also, an alkaline earth metal is an impurity in the case where an alkaline earth metal does not constitute an oxide semiconductor. An alkali metal, in particular, Na becomes Na$^+$ when an insulating film in contact with the oxide semiconductor layer is an oxide and Na diffuses into the insulating layer. Further, in the oxide semiconductor layer, Na cuts or enters a bond between a metal and oxygen which constitute the oxide semiconductor. As a result, for example, deterioration of characteristics of the transistor such as a normally-on state of the transistor due to shift of a threshold voltage in the negative direction or a reduction in field-effect mobility occurs; in addition, variation in characteristics is also caused. Such deterioration of characteristics of the transistor and variation in characteristics due to the impurity remarkably appear when the concentration of hydrogen in the oxide semiconductor layer is sufficiently low. Therefore, when the concentration of hydrogen in the oxide semiconductor layer is lower than or equal to $1\times10^{18}$/cm$^3$, preferably lower than or equal to $1\times10^{17}$/cm$^3$, the concentration of the above impurity is preferably reduced. Specifically, a measurement value of the concentration of Na by secondary ion mass spectrometry is preferably lower than or equal to $5\times10^{16}$/cm$^3$, more preferably lower than or equal to $1\times10^{16}$/cm$^3$, still more preferably lower than or equal to $1\times10^{15}$/cm$^3$. In a manner similar to the above, a measurement value of the concentration of Li is preferably lower than or equal to $5\times10^{15}$/cm$^3$, more preferably lower than or equal to $1\times10^{15}$/cm$^3$. In a manner similar to the above, a measurement value of the concentration of K is preferably lower than or equal to $5\times10^{15}$/cm$^3$, more preferably lower than or equal to $1\times10^{15}$/cm$^3$.

When a channel region of a transistor is formed using the above-described oxide semiconductor layer, the off-state current of the transistor can be reduced.

Now, in terms of a reduction in off-state current of the transistor, current which flows in the side surface of the island-shaped oxide semiconductor layer is explained.

In selective etching of the oxide semiconductor layer, for example, in dry etching, when the side surface of the oxide semiconductor layer is exposed to plasma including chlorine radicals, fluorine radicals, or the like, a metal atom existing at the side surface of the oxide semiconductor film is bonded to the chlorine radial, the fluorine radical, or the like. At this time, the metal atom and the chlorine atom or the metal atom and the fluorine atom are bonded to each other and detached from the oxide semiconductor layer, so that an oxygen atom which has been bonded to the metal atom in the oxide semiconductor layer becomes active. The oxygen atom which has become active is easily reacted and detached from the oxide semiconductor layer. Therefore, oxygen deficiency is likely to be caused in the side surface of the oxide semiconductor layer.

Oxygen is extracted therefrom particularly in a reduced-pressure atmosphere or a reducing atmosphere, and oxygen deficiency is caused in the side surface of the oxide semiconductor layer. In addition, oxygen deficiency is likely to be caused in the heated atmosphere.

Oxygen deficiency in the oxide semiconductor serves as a donor and generates a carrier. That is, oxygen deficiency makes the side surface of the oxide semiconductor layer n-type, which causes unintended current (leakage current) in the side surface of the oxide semiconductor layer. Current which flows in the side surface of the oxide semiconductor layer increases the off-state current of the transistor.

The side surface of the oxide semiconductor layer is covered with an insulating layer containing oxygen, so that current flowing at the side surface of the oxide semiconductor layer can be reduced.

Since current easily flows in the side surface of the oxide semiconductor layer, preferably, the source electrode and the drain electrode are not connected to the side surfaces of the oxide semiconductor layer as possible. For example, the source electrode and the drain electrode are provided over the oxide semiconductor layer inside the outer edge of the oxide semiconductor layer, whereby the source electrode and the drain electrode can be prevented from being electrically connected to the side surfaces of the oxide semiconductor layer.

It is possible to provide a transistor in which an oxide semiconductor layer is used and off-state current is very small. In addition, it is possible to provide a semiconductor device in which very low power consumption is achieved by employing the transistor.

BRIEF DESCRIPTION OF THE DRAWINGS

FIGS. 5A to 5C are cross-sectional views illustrating one embodiment of the present invention.

FIGS. 6A to 6C are cross-sectional views illustrating one embodiment of the present invention.

FIGS. 10A1 and 10A2 are top views and FIG. 10B is a cross-sectional view illustrating one embodiment of the present invention.

FIGS. 12A1, 12A2, 12B1, 12B2, 12C1, and 12C2 are cross-sectional views each illustrating a liquid crystal display device.

FIGS. 13A1, 13A2, 13B1, and 13B2 are cross-sectional views each illustrating a liquid crystal display device.

FIGS. 14A1, 14A2, 14B1, and 14B2 are cross-sectional views each illustrating a liquid crystal display device.

FIGS. 26A to 26C are diagrams each illustrating a model used for calculation.

DETAILED DESCRIPTION OF THE INVENTION

Figure 1A:
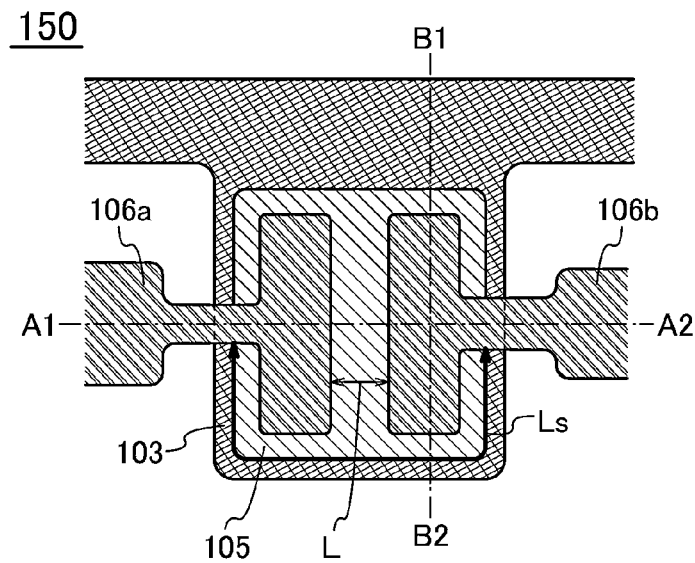
FIGS. 1A to 1C are a top view and cross-sectional views illustrating one embodiment of the present invention.

Embodiments of the invention will be described below with reference to the accompanying drawings. Note that the present invention is not limited to the description below, and it is easily understood by those skilled in the art that various changes and modifications can be made without departing from the spirit and scope of the present invention. Therefore, the invention should not be construed as being limited to the description in the following embodiments. Note that the same portions or portions having the same function in the structure of the present invention described below are denoted by the same reference numerals in common among different drawings and repetitive description thereof will be omitted.

Note that the position, size, range, or the like of each structure illustrated in drawings and the like is not accurately represented in some cases for easy understanding. Therefore, the disclosed invention is not necessarily limited to the position, size, range, or the like as disclosed in the drawings and the like.

Note that terms such as "first", "second", and "third" in this specification are used in order to avoid confusion among components, and the terms do not limit the components numerically. Therefore, for example, the term "first" can be replaced with the term "second", "third", or the like as appropriate.

A transistor is one embodiment of a semiconductor device and can amplify current or voltage and perform a switching operation for controlling conduction or non-conduction, for example. A transistor in this specification includes an insulated-gate field effect transistor (IGFET) and a thin film transistor (TFT).

Functions of a "source" and a "drain" of a transistor are sometimes replaced with each other when a transistor of opposite polarity is used or when the direction of current flowing is changed in circuit operation, for example. Therefore, the terms "source" and "drain" can be used to denote the drain and the source, respectively, in this specification.

In addition, the term such as "electrode" or "wiring" in this specification and the like does not limit a function of a component. For example, an "electrode" is sometimes used as part of a "wiring", and vice versa. Furthermore, the term "electrode" or "wiring" can include the case where a plurality of "electrodes" or "wirings" is formed in an integrated manner.

Embodiment 1

In this embodiment, a transistor in which an oxide semiconductor is used for a semiconductor layer where a channel is formed and a manufacturing method thereof will be described with reference to FIGS. 1A to 1C, FIGS. 2A to 2C, FIGS. 3A to 3C, FIGS. 4A to 4C, FIGS. 5A to 5C, FIGS. 6A to 6C, FIGS. 7A to 7C, and FIGS. 8A and 8B.

Figure 1B:
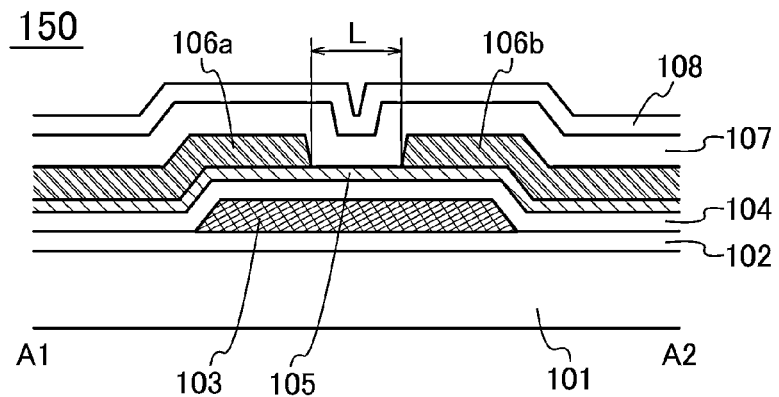
Figure 1C:
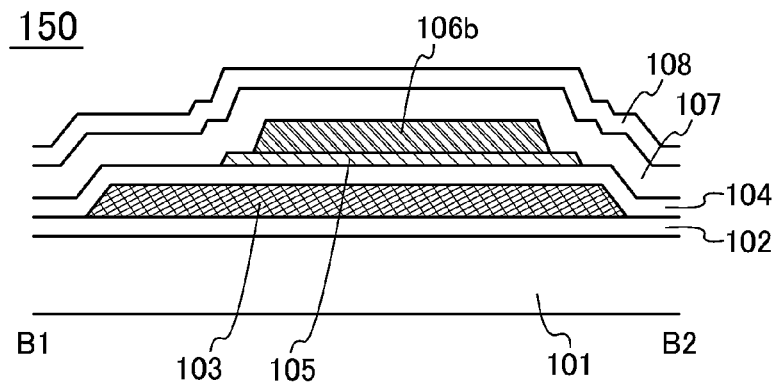

FIG. 1A is a top-view illustrating a structure of a transistor 150 which is one embodiment of a semiconductor device. FIG. 1B is a cross-sectional view illustrating a stacked-layer structure of a portion taken along the chain line A1-A2 in FIG. 1A. FIG. 1C is a cross-sectional view illustrating a stacked-layer structure of a portion taken along the chain line B1-B2 in FIG. 1A. Note that the description of a substrate and an insulating layer are omitted in FIG. 1A.

The transistor 150 in FIGS. 1A to 1C includes a base layer 102 formed over a substrate 101 and a gate electrode 103 formed over the base layer 102. The transistor 150 further includes a gate insulating layer 104 formed over the gate electrode 103 and an island-shaped oxide semiconductor layer 105 formed over the gate insulating layer 104. In addition, the transistor 150 includes a source electrode 106a and a drain electrode 106b formed over the oxide semiconductor layer 105. Furthermore, the transistor 150 includes an insulating layer 107 in contact with part of the oxide semiconductor layer 105 and formed over the source electrode 106a and the drain electrode 106b. In addition, a protective insulating layer 108 is formed over the insulating layer 107.

The channel length L of the transistor 150 is determined by a distance between the source electrode 106a and the drain electrode 106b which are in contact with the oxide semiconductor layer 105 and face to each other. Note that the channel length L is also referred to as a shortest distance between the source electrode 106a and the drain electrode 106b which are in contact with the oxide semiconductor layer 105.

Figure 2A:
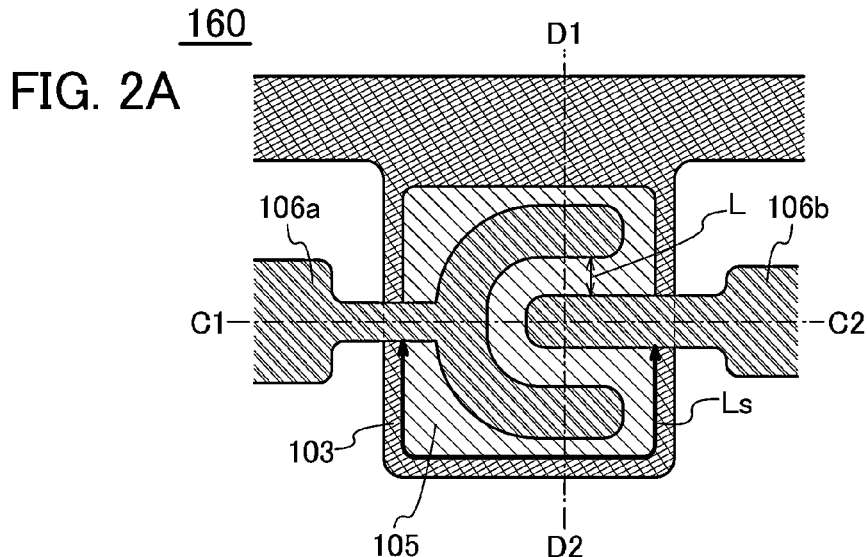
FIGS. 2A to 2C are a top view and cross-sectional views illustrating one embodiment of the present invention.
Figure 2B:
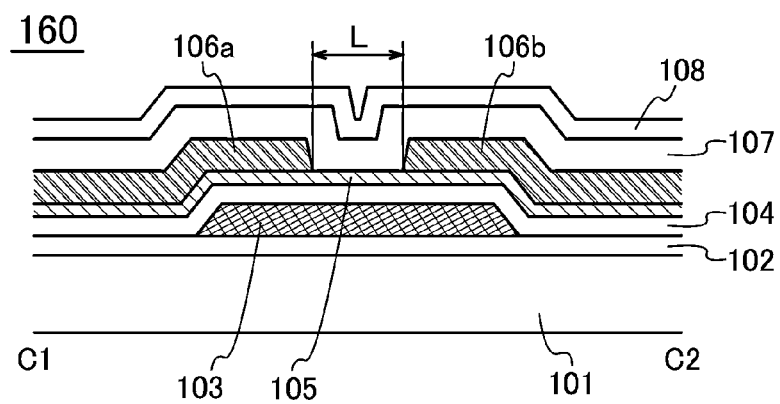
Figure 2C:
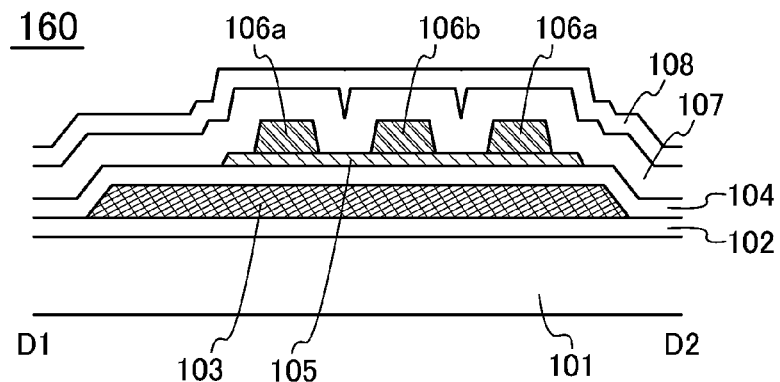

FIG. 2A is a top-view illustrating a structure of a transistor 160 which is one embodiment of a semiconductor device. FIG. 2B is a cross-sectional view illustrating a stacked-layer structure of a portion taken along the chain line C1-C2 in FIG. 2A. FIG. 2C is a cross-sectional view illustrating a stacked-layer structure of a portion taken along the chain line D1-D2 in FIG. 2A. Note that the description of a substrate and an insulating layer are omitted in FIG. 2A.

Although the transistor 160 has a stacked-layer structure similar to the structure of the transistor 150, shapes of the source electrode 106a and the drain electrode 106b are different from the shapes of the source electrode 106a and the drain electrode 106b of the transistor 150. In the transistor 160, the drain electrode 106b is surrounded by the source electrode 106a that is U-shaped (or C-shaped, square-bracket-like shaped, or horseshoe-shaped). With such a shape, an enough channel width can be ensured even when the area occupied by the transistor is small, and accordingly, the amount of current flowing at the time of conduction of the transistor (also referred to as an on-state current) can be increased.

In general, the larger the channel width is, the larger parasitic capacitance between the gate electrode 103 and the source electrode 106a and between the gate electrode 103 and the drain electrode 106b becomes. However, with the structure in which the drain electrode 106b is surrounded by the U-shaped source electrode 106a, increase in parasitic capacitance, particularly parasitic capacitance between the gate electrode 103 and the drain electrode 106b can be suppressed.

For example, in a pixel transistor of an active matrix liquid crystal display device, when parasitic capacitance generated between a gate electrode and a drain electrode which is electrically connected to the pixel electrode is large, the liquid crystal display device is easily influenced by feed through, and potential (video data) supplied to a pixel cannot be kept accurately, which may debase the display quality. With the use of the transistor 160 which is disclosed in this embodiment as a pixel transistor of an active matrix liquid crystal display device, an enough channel width can be ensured and parasitic capacitance generated between the drain electrode 106b and the gate electrode 103 can be reduced; accordingly, the display quality of the display device can be improved.

Figure 3A:
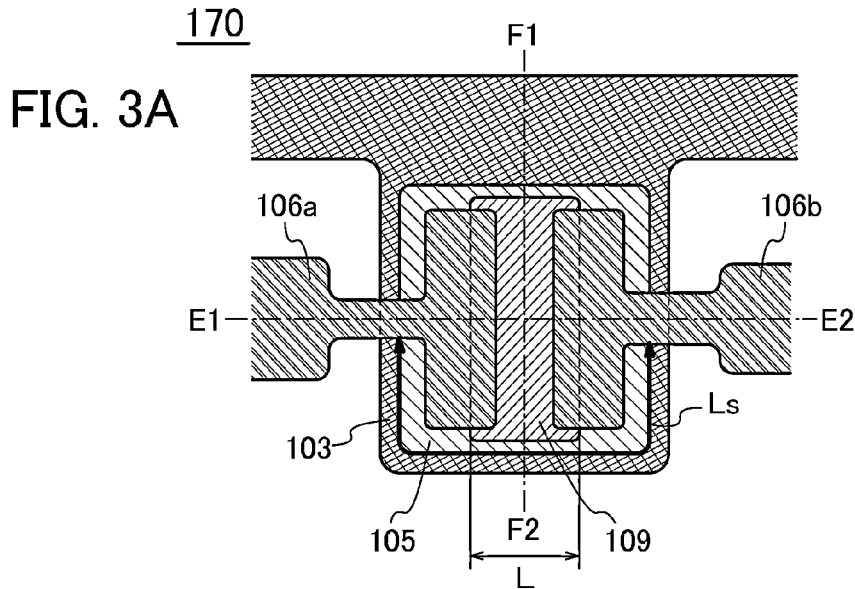
FIGS. 3A to 3C are a top view and cross-sectional views illustrating one embodiment of the present invention.
Figure 3B:
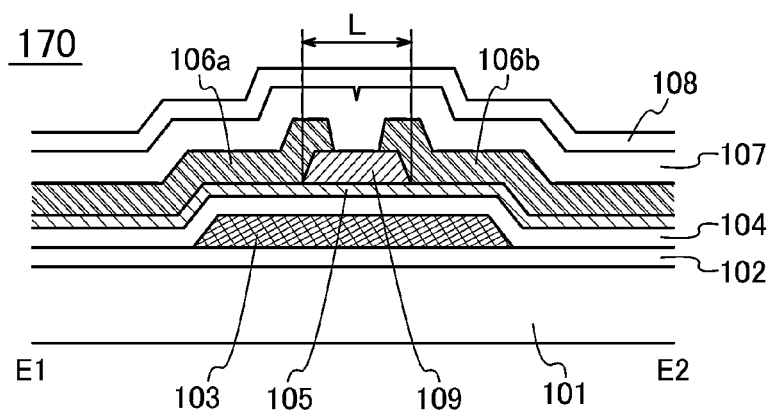
Figure 3C:
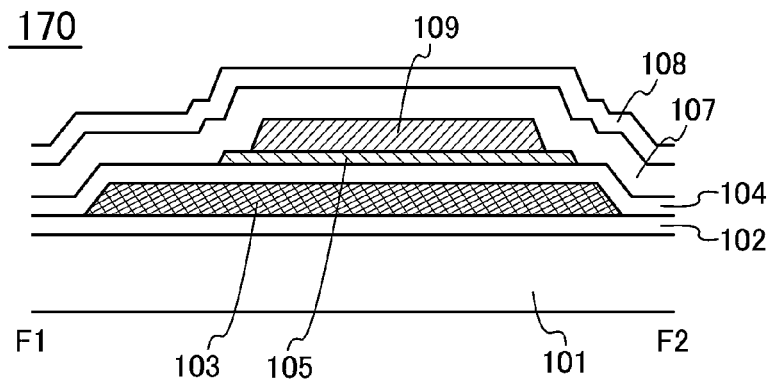

FIG. 3A is a top-view illustrating a structure of a transistor 170 which is one embodiment of a semiconductor device. FIG. 3B is a cross-sectional view illustrating a stacked-layer structure of a portion taken along the chain line E1-E2 in FIG. 3A. FIG. 3C is a cross-sectional view illustrating a stacked-layer structure of a portion taken along the chain line F1-F2 in FIG. 3A. Note that the description of a substrate and an insulating layer are omitted in FIG. 3A.

The transistor 170 has a structure in which a channel protective layer 109 is additionally provided in the transistor 150 described using FIGS. 1A to 1C. The channel protective layer 109 is provided over the oxide semiconductor layer 105. The channel length L of the transistor 170 is determined by the width of the channel protective layer 109, that is, the length of the channel protective layer 109 in a direction parallel with a carrier flow direction.

Although the provision of the channel protective layer 109 results in more number of manufacturing steps than those of the transistor 150, increase in oxygen deficiency generated on the back channel side can be suppressed in the subsequent manufacturing steps. Thus, in the subsequent manufacturing steps, the range of treatment conditions can be widened, leading to a semiconductor device with high productivity and high reliability. Note that the term "back channel" in this specification refers to the vicinity of an interface between an oxide semiconductor layer and another layer, which is opposite to an interface between the oxide semiconductor layer and a gate insulating layer.

Figure 4A:
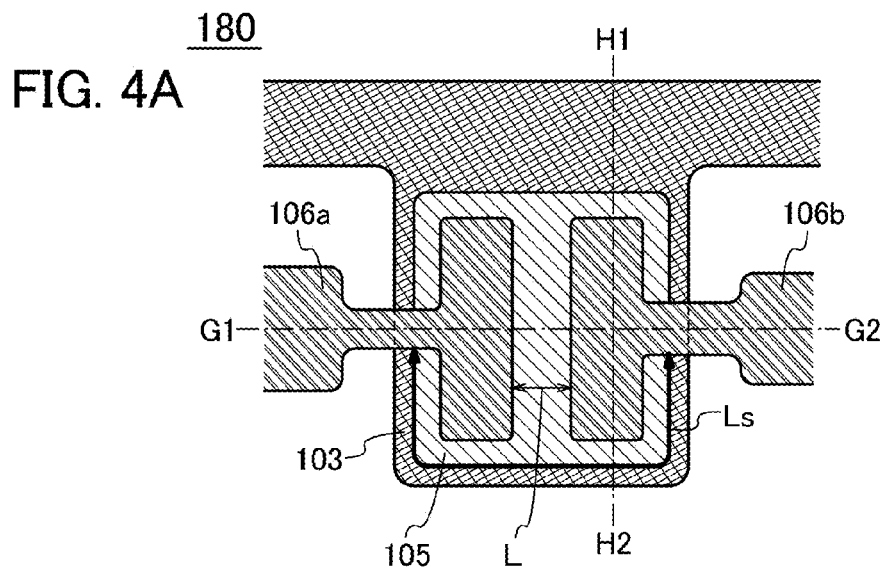
FIGS. 4A to 4C are a top view and cross-sectional views illustrating one embodiment of the present invention.
Figure 4B:
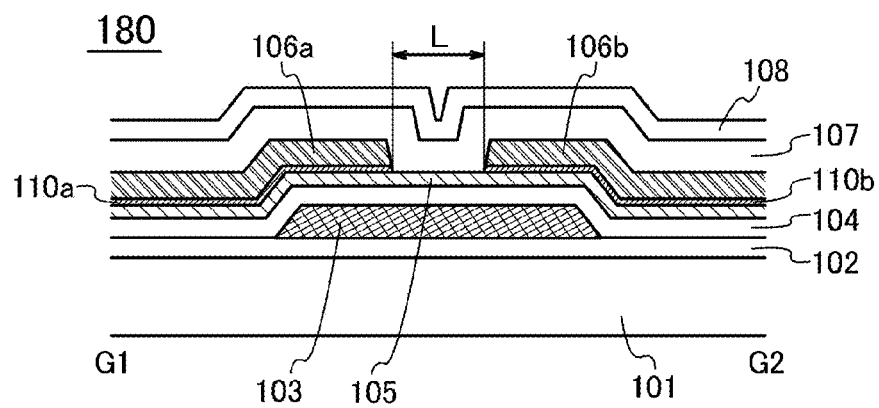
Figure 4C:
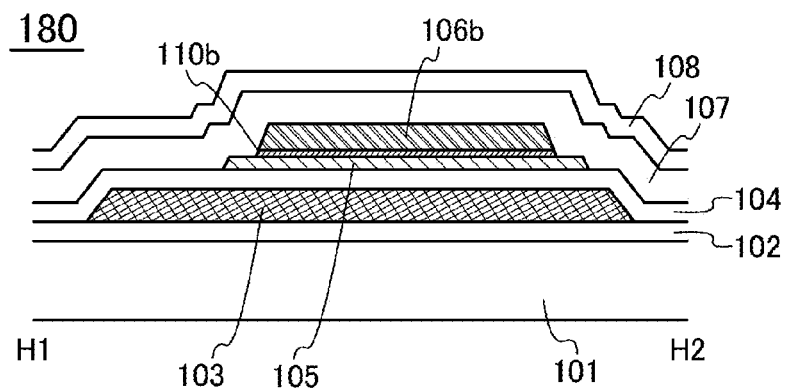

FIG. 4A is a top-view illustrating a structure of a transistor 180 which is one embodiment of a semiconductor device. FIG. 4B is a cross-sectional view illustrating a stacked-layer structure of a portion taken along the chain line G1-G2 in FIG. 4A. FIG. 4C is a cross-sectional view illustrating a stacked-layer structure of a portion taken along the chain line H1-H2 in FIG. 4A. Note that the description of a substrate and an insulating layer are omitted in FIG. 4A.

The transistor 180 in FIGS. 4A to 4C includes the base layer 102 formed over the substrate 101 and the gate electrode 103 formed over the base layer 102. The transistor 180 further includes the gate insulating layer 104 formed over the gate electrode 103 and the island-shaped oxide semiconductor layer 105 formed over the gate insulating layer 104. In addition, the transistor 180 includes the source electrode 106a and the drain electrode 106b formed over the oxide semiconductor layer 105. The source electrode 106a and the drain electrode 106b of the transistor 180 are electrically connected to the oxide semiconductor layer 105 through the source region 110a and the drain region 110b. In addition, the transistor 180 includes the insulating layer 107 in contact with part of the oxide semiconductor layer 105, over the source electrode 106a and the drain electrode 106b. In addition, the protective insulating layer 108 is formed over the insulating layer 107.

The source region 110a and the drain region 110b may be formed using a conductive metal oxide such as indium oxide, tin oxide, zinc oxide, indium tin oxide (abbreviated to ITO), or indium zinc oxide to have a thickness greater than or equal to 1 nm and less than or equal to 100 nm, preferably greater than or equal to 5 nm and less than or equal to 50 nm.

Alternatively, the source region 110a and the drain region 110b may be formed using indium gallium zinc oxide (In—Ga—Zn—O) containing nitrogen, indium tin oxide (In—Sn—O) containing nitrogen, indium gallium oxide (In—Ga—O) containing nitrogen, indium zinc oxide (In—Zn—O) containing nitrogen, tin oxide (Sn—O) containing nitrogen, indium oxide (In—O) containing nitrogen, or metal nitride (InN, ZnN, or the like). Alternatively, a material formed of 1 to 10 graphene sheets (corresponding to one layer of graphite) may be used.

Etching of the above material for forming the source region 110a and the drain region 110b can be performed in such a manner that the source electrode 106a and the drain electrode 106b are formed and then are used as masks. Depending on etching conditions, etching for forming the source electrode 106a and the drain electrode 106b and etching for forming the source region 110a and the drain region 110b can be performed in the same step.

Since the source region 110a and the drain region 110b are formed between the oxide semiconductor layer 105 and the source and drain electrodes 106a and 106b, contact resistance between the source and drain electrodes 106a and 106b and the oxide semiconductor layer 105 can be lowered.

The channel length L of the transistor 180 is determined by a distance between the source region 110a and the drain region 110b which are in contact with the oxide semiconductor layer 105 and face to each other. Note that the channel length L is also referred to as a shortest distance between the source region 110a and the drain region 110b which are in contact with the oxide semiconductor layer 105.

The transistor 150, the transistor 160, the transistor 170, and the transistor 180 are each one mode of bottom gate transistors, and an inverted staggered transistor. The transistor 150, the transistor 160, and the transistor 180 are also called channel-etched transistors, and the transistor 170 is also called a channel-protective (channel-stop) transistor.

Note that an oxide semiconductor that is purified (purified OS) by reduction of impurities such as moisture or hydrogen serving as an electron donor (donor) is used for the island-shaped oxide semiconductor layer 105 in this embodiment. The purified oxide semiconductor can be made to be an i-type oxide semiconductor (an intrinsic semiconductor) or an oxide semiconductor extremely close to an i-type semiconductor (a substantially i-type semiconductor) by supplying oxygen to the oxide semiconductor to reduce oxygen deficiency in the oxide semiconductor. A transistor including the i-type or substantially i-type oxide semiconductor in a semiconductor layer where a channel is formed has characteristics of very small off-state current.

Specifically, the concentration of hydrogen in the oxide semiconductor, which is measured by secondary ion mass spectrometry (SIMS), is lower than $5 \times 10^{18}/cm^3$, preferably lower than or equal to $1 \times 10^{18}/cm^3$, further preferably lower than or equal to $5 \times 10^{17}/cm^3$, still further preferably lower than or equal to $1 \times 10^{16}/cm^3$. In addition, the carrier density of the i-type or substantially i-type purified oxide semiconductor, which is measured by Hall effect measurement, is less than $1 \times 10^{14}/cm^3$, preferably less than $1 \times 10^{12}/cm^3$, further preferably less than $1 \times 10^{11}/cm^3$. Furthermore, the band gap of the oxide semiconductor is 2 eV or more, preferably 2.5 eV or more, more preferably 3 eV or more. With the use of the i-type or substantially i-type oxide semiconductor for a semiconductor layer where a channel is formed, off-state current of the transistor can be reduced.

The SIMS analysis of the hydrogen concentration of the oxide semiconductor is described here. It is known that it is difficult to obtain accurate data in the proximity of a surface of a sample or in the proximity of an interface between stacked films formed using different materials by the SIMS analysis in principle. Thus, in the case where distributions of the hydrogen concentrations of the films in thickness directions are analyzed by SIMS, an average value in a region where the films are provided, the value is not greatly changed, and almost the same value can be obtained are employed as the hydrogen concentration. Further, in the case where the thickness of the film is small, a region where almost the same value can be obtained cannot be found in some cases due to the influence of the hydrogen concentration of the films adjacent to each other. In this case, the maximum value or the minimum value of the hydrogen concentration of a region where the films are provided is employed as the hydrogen concentration of the film. Furthermore, in the case where a mountain-shaped peak having the maximum value and a valley-shaped peak having the minimum value do not exist in the region where the films are provided, the value of the inflection point is employed as the hydrogen concentration.

When oxygen in an oxide semiconductor is detached and oxygen deficiency occurs, a carrier may be generated due to the oxygen deficiency. When oxygen deficiency occurs in an oxide semiconductor, an electron is generated as a carrier, so that the oxide semiconductor is likely to be n-type. Oxygen in an oxide semiconductor is likely to be detached on the side surface of an island-shaped oxide semiconductor and thus the side surface of an oxide semiconductor is likely to be n-type.

When the source electrode 106a and the drain electrode 106b are electrically connected to each other through the side surface of the oxide semiconductor which turned to be n-type, unintended current (leakage current) flow regardless of the operation of the transistor. An increase in leakage current leads to an increase in off-state current of the transistor and contributes to increase power consumption of a semiconductor device, which is not preferable. For this reason, the length of part of the outer edge of the oxide semiconductor from an outer edge of the source electrode 106a to an outer edge of the drain electrode 106b is preferably made to be long. Specifically, the length Ls of the part of the outer edge of the oxide semiconductor from the outer edge of the source electrode 106a to the outer edge of the drain electrode 106b is three times or more as long as the channel length L, preferably five times or more as long as the channel length L (see FIG. 1A, FIG. 2A, FIG. 3A, and FIG. 4A).

Next, a method for manufacturing the transistor 150 illustrated in FIGS. 1A to 1C will be described with reference to FIGS. 5A to 5C, FIGS. 6A to 6C, FIGS. 7A to 7C, and FIGS. 8A and 8B. Note that FIGS. 5A to 5C and FIGS. 6A to 6C are cross-sectional views illustrating the method for manufacturing the transistor 150 and correspond to the cross section in a portion taken along the chain line A1-A2 and B1-B2 in FIG. 1A.

FIGS. 7A to 7C and FIGS. 8A and 8B are cross-sectional views illustrating the method for manufacturing the transistor 150 and portions taken along the chain line A1-A2 and B1-B2 correspond to cross-sectional views of FIG. 5A to 5C and FIGS. 6A to 6C. Note that the description of a substrate and an insulating layer are omitted in FIGS. 7A to 7C and FIGS. 8A and 8B.

First, the base layer 102 is formed with a thickness of 50 nm to 300 nm, preferably 100 nm to 200 nm, over the substrate 101. As the substrate 101, a glass substrate, a ceramic substrate, a plastic substrate that has high heat resistance enough to withstand a process temperature of this manufacturing process, or the like can be used. In the case where a substrate does not need a light-transmitting property, a substrate in which an insulating layer is provided over a surface of a substrate of a metal such as a stainless steel alloy may be used. As the glass substrate, for example, an alkali-free glass substrate of barium borosilicate glass, aluminoborosilicate glass, aluminosilicate glass, or the like may be used. Alternatively, a quartz substrate, a sapphire substrate, or the like can be used. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 101. Still alternatively, any of these substrates further provided with a semiconductor element may be used as the substrate 101.

The base layer 102 can be formed using a signal layer or a stacked layer using one or more of materials selected from aluminum nitride, aluminum oxide, aluminum nitride oxide, aluminum oxynitride, silicon nitride, silicon oxide, silicon nitride oxide, and silicon oxynitride. The base layer 102 has a function of preventing diffusion of an impurity element from the substrate 101. Note that in this specification, a nitride oxide is a substance which includes more nitrogen than oxygen, and an oxynitride is a substance which includes more oxygen than nitrogen. Note that the content of each element can be measured by Rutherford backscattering spectrometry (RBS) or the like, for example.

The base layer 102 can be formed by a sputtering method, a CVD method, a coating method, a printing method, or the like, as appropriate. In this embodiment, a stack of a silicon nitride layer and a silicon oxide layer is used as the base layer 102. Specifically, a 50-nm-thick silicon nitride layer is formed over the substrate 101, and a 150-nm-thick silicon oxide layer is formed over the silicon nitride layer. Note that the base layer 102 may be doped with phosphorus (P) or boron (B).

When a halogen element such as chlorine or fluorine is contained in the base layer 102, a function of preventing diffusion of an impurity element from the substrate 101 can be further improved. The concentration of a halogen element contained in the base layer 102 is measured by secondary ion mass spectrometry (SIMS) and its peak is preferably greater than or equal to $1\times10^{15}/cm^3$ and less than or equal to $1\times10^{20}/cm^3$.

Next, a conductive layer is formed over the base layer 102 by a sputtering method, a vacuum evaporation method, or a plating method, a mask is formed over the conductive layer, and the conductive layer is selectively etched to form the gate electrode 103. The mask formed over the conductive layer can be formed by a printing method, an inkjet method, or a photolithography method, as appropriate.

As a material used for forming the gate electrode 103, a metal element selected from aluminum (Al), chromium (Cr), copper (Cu), tantalum (Ta), titanium (Ti), molybdenum (Mo), tungsten (W), neodymium (Nd), and scandium (Sc), an alloy containing any of these metal elements as a component, an alloy containing these metal elements in combination, a nitride of any of these metal elements, or the like can be used. Further, one or more metal elements selected from manganese (Mn), magnesium (Mg), zirconium (Zr), and beryllium (Be) may be used.

Further, the gate electrode 103 may have a single-layer structure or a stacked structure of two or more layers. For example, a single-layer structure of aluminum containing silicon, a two-layer structure in which titanium is stacked over aluminum, a two-layer structure in which titanium is stacked over titanium nitride, a two-layer structure in which tungsten is stacked over titanium nitride, a two-layer structure in which tungsten is stacked over tantalum nitride, a two-layer structure in which Cu is stacked over a Cu—Mg—Al alloy, a three-layer structure in which titanium, aluminum, and titanium are stacked in this order, and the like can be given.

The gate electrode 103 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked structure formed using the above light-transmitting conductive material and the above metal element.

Indium gallium zinc oxide containing nitrogen, indium tin oxide containing nitrogen, indium gallium oxide containing nitrogen, indium zinc oxide containing nitrogen, tin oxide containing nitrogen, indium oxide containing nitrogen, or a metal nitride (InN, ZnN, or the like) may be formed so as to overlap with the gate electrode 103 and the oxide semiconductor layer 105 and to be in contact with the gate electrode 103 and the gate insulating layer 104.

These materials each have a work function of 5 eV or higher, preferably 5.5 eV or higher. The gate electrode 103 formed of these materials is formed so as to overlap with the oxide semiconductor layer 105 with the gate insulating layer 104 provided therebetween, whereby the threshold voltage of the electric characteristics of the transistor can be positive. Accordingly, a so-called normally-off switching element can be obtained. For example, in the case where In—Ga—Zn—O containing nitrogen is used for the gate electrode 103, In—Ga—Zn—O having a nitrogen concentration higher than at least that of the oxide semiconductor layer 105, specifically, In—Ga—Zn—O having a nitrogen concentration of higher than or equal to 7 at. % is used.

Figure 7A:
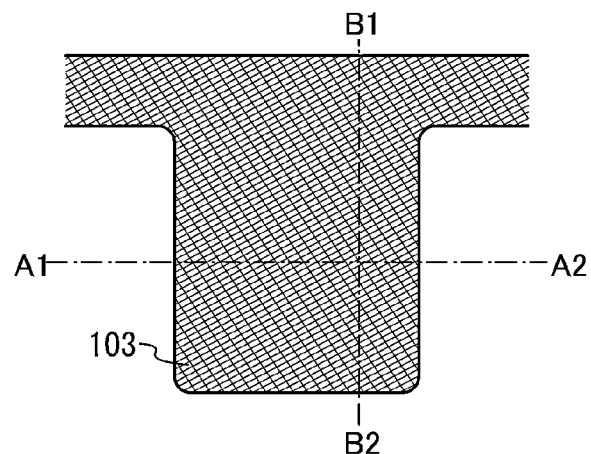
FIGS. 7A to 7C are top views illustrating one embodiment of the present invention.
Figure 7B:
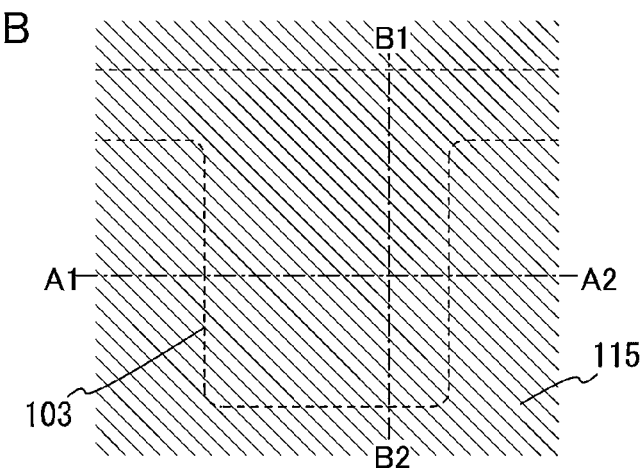
Figure 7C:
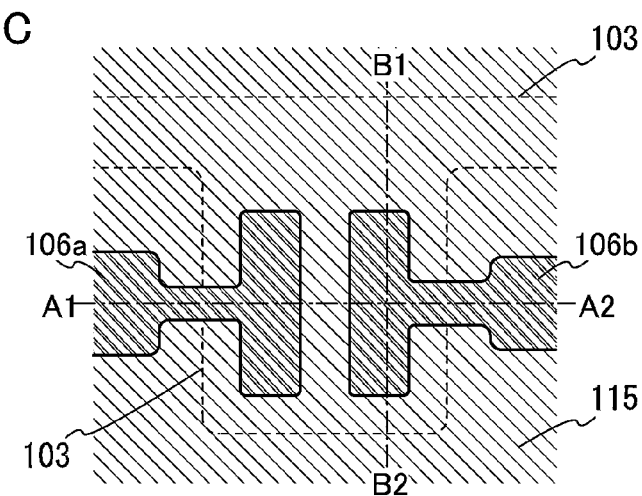

In this embodiment, two-layer structure in which tungsten is stacked over titanium nitrogen is used for the gate electrode 103 (see FIG. 5B and FIG. 7A). Note that end portions of the formed gate electrode 103 preferably have a tapered shape, so that the coverage with a layer formed later is improved.

Next, the gate insulating layer 104 is formed over the gate electrode 103. The gate insulating layer 104 can be formed using a single layer or a stacked layer using one or more of materials selected from aluminum nitride, aluminum oxide, aluminum nitride oxide, aluminum oxynitride, silicon nitride, silicon oxide, silicon nitride oxide, silicon oxynitride, tantalum oxide, and lanthanum oxide.

When a high-k material such as hafnium silicate (HfSi$O_x$), hafnium silicate to which nitrogen is added (HfSi$_x$O$_y$N$_z$), hafnium aluminate to which nitrogen is added (HfAl$_x$O$_y$N$_z$), hafnium oxide, or yttrium oxide is used as the gate insulating layer 104, while the substantial (e.g., silicon oxide equivalent) thickness of the gate insulating film is not changed, the physical thickness of the gate insulating film can be increased so that gate leakage current can be reduced. Further, a stacked structure can be used in which a high-k material and one or more of silicon oxide, silicon oxynitride, silicon nitride, silicon nitride oxide, aluminum oxide, aluminum oxynitride, and gallium oxide are stacked. For example, the thickness of the gate insulating layer 104 is preferably greater than or equal to 1 nm and less than or equal to 300 nm, and more preferably greater than or equal to 5 nm and less than or equal to 50 nm.

The gate insulating layer 104 is formed by a sputtering method, a CVD method, or the like. The gate insulating layer 104 is not limited to a single layer, and a stacked layer of different layers may also be used. Other than a sputtering method and a plasma CVD method, a film formation method such as a high-density plasma CVD method using microwaves (e.g., a frequency of 2.45 GHz) may be used for forming the gate insulating layer 104.

The gate insulating layer 104 is preferably formed using a material from which oxygen is released by heating. "Oxygen is released by heating" means that the amount of released oxygen which is converted into oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy (TDS).

Here, a method in which the amount of released oxygen is measured by being converted into oxygen atoms using TDS analysis will be described below.

The amount of released gas in TDS analysis is proportional to the integral value of a spectrum. Therefore, the amount of released gas can be calculated from the ratio between the integral value of spectrum of the insulating layer and the reference value of a standard sample. The reference value of a standard sample refers to the ratio of the density of a predetermined atom contained in a sample to the integral value of a spectrum.

For example, the number of the released oxygen molecules ($N_{O2}$) from an insulating layer can be found according to Equation 1 with the TDS analysis results of a silicon wafer containing hydrogen at a predetermined density which is the standard sample and the TDS analysis results of the insulating layer. Here, all spectra having a mass number of 32 which are obtained by the TDS analysis are assumed to originate from an oxygen molecule. CH$_3$OH, which is given as a gas having a mass number of 32, is not taken into consideration on the assumption that it is unlikely to be present. Further, an oxygen molecule including an oxygen atom having a mass number of 17 or 18 which is an isotope of an oxygen atom is also not taken into consideration because the proportion of such a molecule in the natural world is minimal.

$$N_{O2} = N_{H2}/S_{H2} \times S_{O2} \times \alpha \qquad [\text{FORMULA 1}]$$

$N_{H2}$ is the value obtained by conversion of the number of hydrogen molecules desorbed from the standard sample into density. $S_{H2}$ is the integral value of a spectrum when the standard sample is subjected to TDS analysis. Here, the reference value of the standard sample is set to $N_{H2}/S_{H2}$. $S_{O2}$ is the integral value of a spectrum when the insulating layer is subjected to TDS analysis. $\alpha$ is a coefficient which influences spectrum intensity in TDS analysis. Refer to Japanese Published Patent Application No. H6-275697 for details of Equation 1. Note that the amount of released oxygen from the above insulating layer is measured with a thermal desorption spectroscopy apparatus produced by ESCO Ltd., EMD-WA1000SW using a silicon wafer containing a hydrogen atom at $1 \times 10^{16}$ atoms/cm$^3$ as the standard sample.

Further, in the TDS analysis, oxygen is partly detected as an oxygen atom. The ratio between oxygen molecules and oxygen atoms can be calculated from the ionization rate of the oxygen molecules. Note that, since the above $\alpha$ includes the ionization rate of the oxygen molecules, the number of the released oxygen atoms can also be estimated through the evaluation of the number of the released oxygen molecules.

Note that $N_{O2}$ is the number of the released oxygen molecules. For the oxide insulating layer, the amount of released oxygen when converted into oxygen atoms is twice the number of the released oxygen molecules.

In the above structure, an insulating layer containing excessive oxygen with respect to the stoichiometry proportion is used as the insulating layer from which oxygen is released by heating. For example, oxygen-excess silicon oxide ($SiO_X(X>2)$) may be used. In the oxygen-excess silicon oxide ($SiO_X(X>2)$), the number of oxygen atoms per unit volume is more than twice the number of silicon atoms per unit volume. The number of silicon atoms and the number of oxygen atoms per unit volume are measured by Rutherford backscattering spectrometry.

Note that oxygen is supplied to the oxide semiconductor from the gate insulating layer 104 by performing heat treatment after forming an oxide semiconductor layer described later over the gate insulating layer 104, so that the interface state between the gate insulating layer 104 and the oxide semiconductor can be reduced. As a result, charge or the like, which is generated due to the operation of the transistor or the like, can be prevented from being trapped at the interface between the gate insulating layer 104 and the oxide semiconductor, so that the transistor with little degradation of electric characteristics can be obtained.

Further, in some cases, charge is generated due to oxygen deficiency in the oxide semiconductor. In general, part of oxygen deficiency in an oxide semiconductor serves as a donor to generate an electron which is a carrier. As a result, the threshold voltage of a transistor shifts in the negative direction. Sufficient release of oxygen from the gate insulating layer to the oxide semiconductor can compensate oxygen deficiency in the oxide semiconductor which causes negative shift of the threshold voltage, so that characteristics of the transistor can be improved.

In other words, when oxygen deficiency is caused in the oxide semiconductor, it is difficult to suppress trapping of a charge at an interface between the gate insulating layer and the oxide semiconductor. However, by providing an insulating layer from which oxygen is released by heating, for the gate insulating layer, the interface state between the oxide semiconductor and the gate insulating layer and the oxygen deficiency in the oxide semiconductor can be reduced and the adverse effect of the trapping of a charge at the interface between the oxide semiconductor and the gate insulating layer can be made small.

In this embodiment, an 100-nm-thick oxide silicon layer is formed over the gate electrode 103, as the gate insulating layer 104.

Next, an oxide semiconductor layer 115 is formed over the gate insulating layer 104. Before the oxide semiconductor layer is formed, in order that hydrogen, a hydroxyl group, and moisture are contained in the oxide semiconductor layer 115 as little as possible, it is preferable to preheat the substrate 101 in a preheating chamber of a deposition apparatus so that an impurity such as hydrogen or moisture adsorbed on the substrate 101 or the gate insulating layer 104 is removed and exhausted. As an exhaustion unit provided in the preheating chamber, a cryopump is preferable. Note that this preheating treatment can be omitted. Further, this preheating treatment may be performed in a similar manner before formation of the base layer 102, the gate electrode 103 or the gate insulating layer 104.

An oxide semiconductor used for the oxide semiconductor layer 115 preferably contains at least indium (In) or zinc (Zn). It is particularly preferable that In and Zn be contained. As a stabilizer for reducing change in electrical characteristics of a transistor including the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or more lanthanoids which include lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, for example, indium oxide, tin oxide, zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used. Further, $SiO_2$ may be contained in the above oxide semiconductor. An oxide semiconductor includes at least one or more elements selected from In, Ga, Sn, and Zn.

Here, for example, an In—Ga—Zn-based oxide means an oxide containing indium (In), gallium (Ga), and zinc (Zn) and there is no particular limitation on the ratio of In:Ga:Zn. The In—Ga—Zn-based oxide may contain a metal element other than In, Ga, and Zn. Note that the amount of oxygen is preferably in excess of stoichiometry in the oxide semiconductor. When the amount of oxygen is in excess of stoichiometry, generation of carriers which results from oxygen deficiency in the oxide semiconductor can be suppressed.

For the oxide semiconductor layer, a thin film expressed by the chemical formula, $InMO_3(ZnO)_m$ (m>0), can be used. Note that M represents one or more metal elements selected from Sn, Zn, Ga, Al, Mn, and Co. Alternatively, a material represented by $In_3SnO_5(ZnO)_n$ (n>0) may be used as the oxide semiconductor.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios may be used.

However, the composition is not limited to those described above, and a material having an appropriate composition may be used in accordance with necessary semiconductor characteristics (such as mobility, threshold voltage, and variation). In order to obtain necessary semiconductor characteristics, it is preferable that the carrier density, the impurity concentration, the defect density, the atomic ratio of a metal element to oxygen, the interatomic distance, the density, and the like be set as appropriate.

For example, with the In—Sn—Zn-based oxide, a high mobility can be relatively easily obtained. However, the mobility can be increased by reducing the defect density in the bulk also in the case of using the In—Ga—Zn-based oxide.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

The oxide semiconductor may be either single crystal or non-single-crystal. In the latter case, the oxide semiconductor may be either amorphous or polycrystalline. Further, the oxide semiconductor may have either an amorphous structure including a crystalline portion or a non-amorphous structure.

An amorphous oxide semiconductor can have a flat surface with relative ease; therefore, when a transistor is manufactured with the use of the oxide semiconductor, interface scattering can be reduced, and relatively high mobility can be obtained with relative ease.

In a crystalline oxide semiconductor, defects in the bulk can be further reduced and when a surface flatness is improved, mobility higher than that of an amorphous oxide semiconductor can be obtained. In order to improve the surface flatness, the oxide semiconductor is preferably formed over a flat surface. Specifically, the oxide semiconductor is preferably formed over a surface with an average surface roughness ($R_a$) of less than or equal to 1 nm, preferably less than or equal to 0.3 nm, more preferably less than or equal to 0.1 nm. Note that $R_a$ can be measured using an atomic force microscope (AFM).

In the case where an In—Zn-based oxide material is used for the oxide semiconductor, any of the following is employed: In/Zn is 0.5 to 50 in an atomic ratio, preferably In/Zn is 1 to 20 in an atomic ratio, or further preferably In/Zn is 1.5 to 15 in an atomic ratio. When the atomic ratio of Zn is in the above preferred range, the field-effect mobility of a transistor can be improved. Here, when the atomic ratio of the compound is In:Zn:O=X:Y:Z, the relation Z>1.5X+Y is satisfied.

In this embodiment, the oxide semiconductor is formed to a thickness of 30 nm by a sputtering method using an In—Ga—Zn-based oxide target. The oxide semiconductor layer can be formed by a sputtering method in a rare gas (typically, argon) atmosphere, an oxygen atmosphere, or a mixed atmosphere of a rare gas and oxygen (see FIG. 7B and FIG. 5B).

A sputtering apparatus used for formation of the oxide semiconductor will be described in detail below.

The leakage rate of a deposition chamber used for forming an oxide semiconductor is preferably lower than or equal to $1 \times 10^{-10}$ Pa·m³/second. Thus, entry of an impurity into a film to be formed by a sputtering method can be decreased.

In order to decrease the leakage rate, internal leakage as well as external leakage needs to be reduced. The external leakage refers to inflow of gas from the outside of a vacuum system through a minute hole, a sealing defect, or the like. The internal leakage is due to leakage through a partition, such as a valve, in a vacuum system or due to released gas from an internal member. Measures need to be taken from both aspects of external leakage and internal leakage in order that the leakage rate be lower than or equal to $1 \times 10^{-10}$ Pa·m³/second.

In order to decrease external leakage, an open/close portion of the deposition chamber is preferably sealed with a metal gasket. For the metal gasket, a metal material covered with iron fluoride, aluminum oxide, or chromium oxide is preferably used. The metal gasket realizes higher adhesion than an O-ring, and can reduce the external leakage. Further, by use of a metal material covered with iron fluoride, aluminum oxide, chromium oxide, or the like which is in the passive state, released gas containing hydrogen generated from the metal gasket is suppressed, so that the internal leakage can also be reduced.

As a member forming an inner wall of the deposition chamber, aluminum, chromium, titanium, zirconium, nickel, or vanadium, from which the amount of a released gas containing hydrogen is smaller, is used. An alloy material containing iron, chromium, nickel, and the like covered with the above-mentioned material may be used. The alloy material containing iron, chromium, nickel, and the like is rigid, resistant to heat, and suitable for processing. Here, when surface unevenness of the member is decreased by polishing or the like to reduce the surface area, the released gas can be reduced. Alternatively, the above-mentioned member of the deposition apparatus may be in the passive state in which the member is covered with iron fluoride, aluminum oxide, chromium oxide, or the like.

Furthermore, it is preferable to provide a gas refiner for a sputtering gas just in front of the deposition chamber. At this time, the length of a pipe between the gas refiner and the deposition chamber is less than or equal to 5 m, preferably less than or equal to 1 m. When the length of the pipe is less than or equal to 5 m or less than or equal to 1 m, the effect of the released gas from the pipe can be reduced accordingly.

Evacuation of the deposition chamber is preferably performed with a rough vacuum pump, such as a dry pump, and a high vacuum pump, such as a sputter ion pump, a turbo molecular pump, or a cryopump, in appropriate combination. In order to remove moisture remaining in the deposition chamber, an entrapment vacuum pump such as a cryopump, an ion pump, or a titanium sublimation pump is preferably used. The turbo molecular pump has an outstanding capability in evacuating a large-sized molecule, whereas it has a low capability in evacuating hydrogen or water. Hence, combination of a cryopump having a high capability in evacuating water and a sputter ion pump having a high capability in evacuating hydrogen is effective. The evacuation unit may be a turbo molecular pump provided with a cold trap. In the deposition chamber which is evacuated with an entrapment vacuum pump such as a cryopump, a hydrogen atom, a compound containing a hydrogen atom such as water ($H_2O$) (more preferably, also a compound containing a carbon atom), and the like are removed, whereby the impurity concentration in the oxide semiconductor layer formed in the deposition chamber can be reduced.

An adsorbate present at the inner wall of the treatment chamber does not affect the pressure in the deposition chamber because it is adsorbed on the inner wall, but the adsorbate leads to release of gas at the time of the evacuation of the deposition chamber. Therefore, although the leakage rate and the evacuation rate do not have a correlation, it is important that the adsorbate present in the deposition chamber be desorbed as much as possible and evacuation be performed in advance with the use of a pump having high evacuation capability. Note that the deposition chamber may be subjected to baking for promotion of desorption of the adsorbate. By the baking, the rate of desorption of the adsorbate can be increased about tenfold. The baking should be performed at a temperature greater than or equal to 100° C. and less than or equal to 450° C. At this time, when the adsorbate is removed while an inert gas is introduced, the rate of desorption of water or the like, which is difficult to be detached only by evacuation, can be further increased.

In a sputtering method, an RF power supply device, an AC power supply device, a DC power supply device, or the like can be used as a power supply device for generating plasma as appropriate.

As a target for forming an In—Ga—Zn-based oxide material as an oxide semiconductor by a sputtering method, for example, a target including a metal oxide containing In, Ga, and Zn, having a composition ratio of $In_2O_3:Ga_2O_3:ZnO=1:1:1$ [molar ratio] can be used. Alternatively, a target having a composition ratio of $In_2O_3:Ga_2O_3:ZnO=1:1:2$ [molar ratio], a target having a composition ratio of $In_2O_3:Ga_2O_3:ZnO=1:1:4$ [molar ratio], or a target having a composition ratio of $In_2O_3:Ga_2O_3:ZnO=2:1:8$ [molar ratio] can be used. Further, an In—Ga—Zn-based oxide target having an atomic ratio of In:Ga:Zn=1:1:1, 4:2:3, 3:1:2, 1:1:2, 2:1:3, or 3:1:4 can be used.

An In—Sn—Zn-based oxide can be referred to as ITZO. In the case of forming an oxide semiconductor using an In—Sn—Zn-based oxide by a sputtering method, it is preferable to use an In—Sn—Zn-based oxide target having an atomic ratio of In:Sn:Zn=1:1:1, 2:1:3, 1:2:2, or 20:45:35.

The relative density of the metal oxide target for forming an oxide semiconductor is 90% to 100%, preferably, 95% to 99.9%. With the use of a metal oxide target with a high relative density, a dense oxide semiconductor layer can be deposited.

As a sputtering gas, a rare gas (typically argon), an oxygen, or a mixed gas of a rare gas and oxygen is used as appropriate. It is preferable that a high-purity gas from which impurities such as hydrogen, water, a hydroxide, and hydride are removed be used as a sputtering gas. For example, when argon is used as a sputtering gas, it is preferable that the purity be 9N, the dew point be −121° C., the content of $H_2O$ be 0.1 ppb or lower, and the content of $H_2$ be 0.5 ppb or lower. When oxygen is used as a sputtering gas, it is preferable that the purity be 8N, the dew point be −112° C., the content of $H_2O$ be 1 ppb or lower, and the content of $H_2$ be 1 ppb or lower.

When the oxide semiconductor is formed, the substrate is maintained in a deposition chamber kept under a reduced pressure and the substrate temperature is set at higher than or equal to 100° C. and lower than or equal to 600° C., preferably higher than or equal to 300° C. and lower than or equal to 500° C.

By heating the substrate during the film formation, the concentration of impurities such as hydrogen, moisture, hydride, or hydroxide in the oxide semiconductor can be reduced. In addition, damage by sputtering can be reduced. Then, a sputtering gas from which hydrogen and moisture are removed is introduced into the deposition chamber while moisture remaining therein is removed, and the oxide semiconductor layer 115 is formed with the use of the above target.

An example of the film formation condition is as follows: the distance between the substrate and the target is 100 mm, the pressure is 0.6 Pa, the electric power of the DC power source is 0.5 kW, and oxygen (the flow rate of oxygen is 100%) is used as a sputtering gas. Note that a pulsed direct-current power source is preferably used, in which case powder substances (also referred to as particles or dust) that are generated in deposition can be reduced and the film thickness can be uniform.

In some cases, the oxide semiconductor layer 115 is formed containing a certain amount of nitrogen even when the sputtering apparatus is used. For example, the nitrogen may be contained in the oxide semiconductor layer 115 at a concentration of less than $5\times10^{18}$ atoms/cm$^3$.

Further, it is preferable that the gate insulating layer 104 and the oxide semiconductor layer 115 are successively formed without exposure to the air. The successive formation without exposure to the air makes it possible that impurities such as water, hydrogen, or hydrocarbon can be prevented from being attached to the interface between the gate insulating layer 104 and the oxide semiconductor layer 115.

The oxide semiconductor layer 115 is formed and then heat treatment is performed. By the heat treatment, excessive hydrogen (including water and a hydroxyl group) in the oxide semiconductor layer 115 is removed (dehydration or dehydrogenation), so that defect levels in the energy gap can be reduced. In addition, oxygen is supplied from the gate insulating layer 104 to the oxide semiconductor layer 115 through the heat treatment and thus defects in the oxide semiconductor layer 115 can be reduced.

The heat treatment is preferably performed at a temperature higher than or equal to 150° C. and lower than strain point of the substrate, preferably higher than or equal to 250° C. and lower than or equal to 450° C., further preferably higher than or equal to 300° C. and lower than or equal to 450° C. in an inert gas atmosphere such as a nitrogen atmosphere or a rare gas atmosphere, an oxygen gas atmosphere, or an ultra dry air atmosphere (in air whose moisture content is less than or equal to 20 ppm (the dew point: −55° C.), preferably less than or equal to 1 ppm, further preferably less than or equal to 10 ppb in the case where measurement is performed using a dew-point meter of a cavity ring-down laser spectroscopy (CRDS) system). In this embodiment, the substrate is introduced into an electric furnace which is a kind of heat treatment apparatuses, and heat treatment is performed on the oxide semiconductor layer 115 at 450° C. in a nitrogen atmosphere for 1 hour.

Note that a heat treatment apparatus is not limited to an electrical furnace, and may include a device for heating an object to be processed by heat conduction or heat radiation from a heating element such as a resistance heating element. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object to be processed by heat treatment, such as nitrogen or a rare gas like argon, is used.

For example, as the heat treatment, GRTA may be performed in the following manner: the substrate is moved into an inert gas heated to a high temperature and is heated for several minutes, and then the substrate is moved out of the inert gas.

When the heat treatment is performed in an atmosphere of an inert gas such as nitrogen or a rare gas, oxygen, or ultra-dry air, it is preferable that the atmosphere do not contain water, hydrogen, or the like. It is also preferable that the purity of nitrogen, oxygen, or the rare gas which is introduced into a heat treatment apparatus be set to be 6N (99.9999%) or higher, preferably 7N (99.99999%) or higher (that is, the impurity concentration is 1 ppm or lower, preferably 0.1 ppm or lower).

The carrier concentration of the oxide semiconductor, in which hydrogen is reduced to a sufficiently low concentration so that the oxide semiconductor is purified and in which defect states in an energy gap due to oxygen deficiency are reduced by sufficiently supplying oxygen, is lower than $1 \times 10^{12}/cm^3$, preferably lower than $1 \times 10^{11}/cm^3$, further preferably lower than $1.45 \times 10^{10}/cm^3$. For example, the off-state current (per unit channel width (1 μm) here) at room temperature (25° C.) is 100 zA/μm (1 zA (zeptoampere) is $1 \times 10^{-21}$ A) or less, preferably 10 zA/μm or less. The off-state current at 85° C. is 100 zA/μm ($1 \times 10^{-19}$ A/μm) or lower, preferably 10 zA/μm ($1 \times 10^{-20}$ A/μm) or lower. The transistor 111 with very excellent off-state current characteristics can be obtained with the use of such an i-type (intrinsic) or substantially i-type oxide semiconductor.

Since alkali metal such as Li or Na is an impurity, the amount of the alkali metal which enters the transistor is preferably reduced. The concentration of the alkali metal in the oxide semiconductor layer 115 is preferably lower than or equal to $2 \times 10^{16}$ cm$^{-3}$, preferably, lower than or equal to $1 \times 10^{15}$ cm$^{-3}$. Further the content of alkaline earth metal is preferably low because alkaline earth metal is also an impurity.

As described above, variation in electric characteristics of a transistor including a highly purified and electrically i-type (intrinsic) oxide semiconductor obtained by reducing the oxygen deficiency is suppressed and thus, the transistor is electrically stable. Consequently, a semiconductor device using an oxide semiconductor, which has high reliability and stable electric characteristics, can be provided.

Next, a conductive layer for forming the source electrode 106a and the drain electrode 106b are formed over the oxide semiconductor layer 115. The conductive layer used for the source electrode 106a and the drain electrode 106b can be formed using a material and a method similar to those of the gate electrode 103.

Note that the above described heat treatment which is performed after the oxide semiconductor layer 115 is formed may be performed after the conductive layer is formed over the oxide semiconductor layer 115. When the heat treatment is performed after the conductive layer is formed over the oxide semiconductor layer 115, the conductive layer prevents detachment of oxygen during the heat treatment, so that oxygen is efficiently supplied from the gate insulating layer 104 to the oxide semiconductor layer 115 through the heat treatment and thus defects in the oxide semiconductor layer 115 can be reduced.

In this embodiment, as the conductive layer, a 5-nm-thick titanium layer is formed over the oxide semiconductor layer 115 and a 250-nm-thick tungsten layer is formed over the titanium layer. Then, a mask is formed over the conductive layer, the conductive layer is selectively etched to form the source electrode 106a and the drain electrode 106b (see FIG. 7C and FIG. 5C). The mask formed over the conductive layer can be formed by a printing method, an inkjet method, or a photolithography method, as appropriate.

Further, the source region 110a and the drain region 110b may be formed between the source and drain electrodes 106a and 106b and the oxide semiconductor layer 115. As the conductive layer for forming the source region 110a and the drain region 110b, a conductive metal oxide such as indium oxide, tin oxide, zinc oxide, indium tin oxide (abbreviated to ITO), or indium zinc oxide can be used. Indium gallium zinc oxide containing nitrogen, indium tin oxide containing nitrogen, indium gallium oxide containing nitrogen, indium zinc oxide containing nitrogen, tin oxide containing nitrogen, indium oxide containing nitrogen, or a metal nitride (InN, ZnN, or the like) may be used. Alternatively, a material formed of 1 to 10 graphene sheets (corresponding to one layer of graphite) may be used.

The resistance of the source region 110a and the drain region 110b is higher than that of the source electrode 106a and the drain electrode 106b and is lower than that of the oxide semiconductor layer 115 (or that of the oxide semiconductor layer 105). Since the source region 110a and the drain region 110b are formed between the oxide semiconductor layer 115 and the source and drain electrodes 106a and 106b, contact resistance between the source and drain electrodes 106a and 106b and the oxide semiconductor layer 115 (or the oxide semiconductor layer 105) can be lowered.

The etching of the conductive layer for forming the source electrode 106a and the drain electrode 106b may be dry etching, wet etching, or a combination thereof.

A gas containing chlorine (a chlorine-based gas, such as chlorine ($Cl_2$), boron trichloride ($BCl_3$), silicon tetrachloride ($SiCl_4$), or carbon tetrachloride ($CCl_4$)) can be employed as an etching gas used for dry etching.

Alternatively, a gas containing fluorine (a fluorine-based gas, such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As the dry etching method, a parallel plate reactive ion etching (RIE) method or an inductively coupled plasma etching (ICP) method can be used. In order to process the film into a desired shape, the etching conditions (the amount of electric power applied to a coil-shaped electrode, the amount of electric power applied to an electrode on the substrate side, the temperature of the electrode on the substrate side, and the like) are adjusted as appropriate.

The conductive layer is etched under a condition where the oxide semiconductor layer 115 is not etched as much as possible.

Note that in the case where the source region 110a and the drain region 110b are formed between the source and drain electrodes 106a and 106b and the oxide semiconductor layer 115, the source and drain electrodes 106a and 106b can be formed at the same time as the source and drain regions 110a and 110b.

Figure 8A:
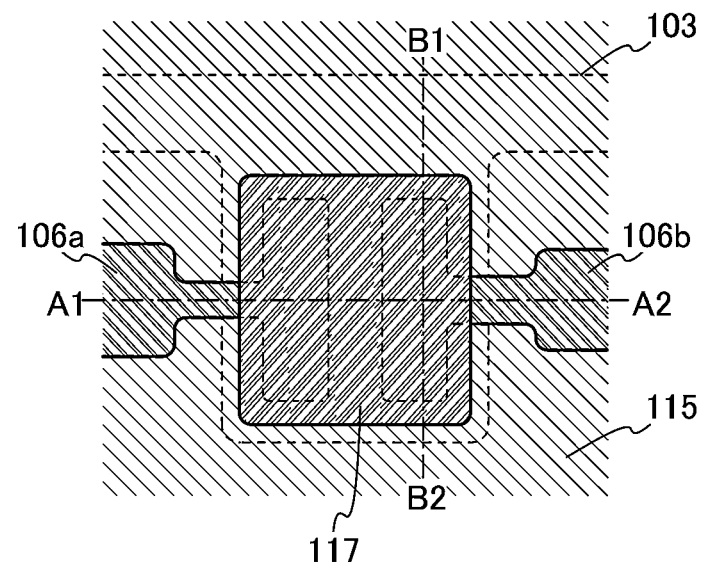
FIGS. 8A and 8B are top views illustrating one embodiment of the present invention.
Figure 8B:
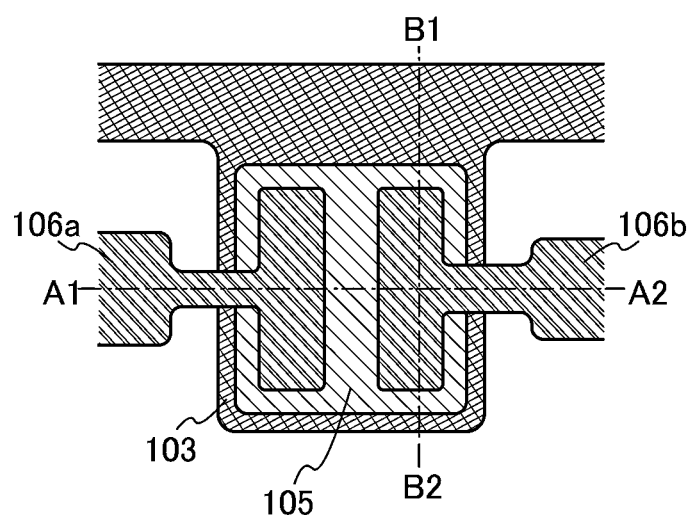

Next, a mask 117 for forming an island-shaped oxide semiconductor layer is formed so as to overlap with the gate electrode 103, the source electrode 106a, and the drain electrode 106b (see FIG. 6A and FIG. 8A). The mask 117 can be formed by a printing method, an inkjet method, a photolithography method, or the like, as appropriate.

The oxide semiconductor layer 115 is selectively etched using the mask 117, the source electrode 106a, and the drain electrode 106b as masks so that the island-shaped oxide semiconductor layer 105 is formed. For the etching of the oxide semiconductor, either dry etching or wet etching may be employed. It is needless to say that both of them may be employed in combination. As an etchant used for wet etching of the oxide semiconductor, for example, a mixed solution of phosphoric acid, acetic acid, and nitric acid, or the like can be used. Alternatively, ITO-07N (produced by KANTO CHEMICAL CO., INC.) may be used.

In this embodiment, a resist mask is formed as the mask 117 by a photolithography method, the oxide semiconductor layer 115 is selectively etched, and then, ashing treatment is performed in an oxygen atmosphere to decompose and remove the mask 117. As the ashing treatment, photoexcitation ashing in which the resist mask is removed by promoting chemical reaction with oxygen by irradiation with light such as ultraviolet light in an atmosphere of oxygen such as ozone, or plasma ashing in which the resist mask is decomposed and removed by oxygen that is made into plasma by using radio-frequency power or the like can be used.

Although the mask 117 may be removed using a resist stripper solution, the removal of the mask 117 by the ashing treatment makes it possible that the oxide semiconductor layer 105 contains water, hydrogen, or hydrocarbon as little as possible. Moreover, since the treatment is performed in an excited oxygen atmosphere, oxygen deficiency in the oxide semiconductor layer 105 which is exposed through the removal of the mask 117 can be reduced.

Then, the insulating layer 107 is formed to cover the oxide semiconductor layer 105. Note that the insulating layer 107 is preferably formed immediately after the oxide semiconductor layer 105 is formed in order to prevent detachment of impurities such as water, hydrogen, or hydrocarbon to a surface of the oxide semiconductor layer 105 as possible. The insulating layer 107 can be formed using a material and a method similar to those of the gate insulating layer 104. The thickness of the insulating layer 107 may be 10 nm to 500 nm, preferably 20 nm to 300 nm. In this embodiment, a 300-nm-thick silicon oxide layer is formed as the insulating layer 107.

After the insulating layer 107 is formed, heat treatment may be performed at 150° C. to 450° C., preferably 250° C. to 325° C. Alternatively, the heat treatment may be performed by gradually increasing the temperature from 250° C. to 325° C. Oxygen is supplied from the insulating layer 107 to the oxide semiconductor layer 105 through the heat treatment and thus defects in the oxide semiconductor layer 105 can be reduced. In this embodiment, the substrate is introduced into an electric furnace which is a kind of heat treatment apparatuses, and heat treatment is performed on the oxide semiconductor layer 115 at 300° C. in a nitrogen atmosphere for one hour. This heat treatment may be performed after the protective insulating layer 108 is formed.

Next, the protective insulating layer 108 may be formed over the insulating layer 107. The protective insulating layer 108 can be formed using a material and a method similar to those of the base layer 102. In this embodiment, a 100-nm-thick aluminum oxide layer is formed as the protective insulating layer 108 by a sputtering method (see FIG. 6C and FIG. 8B). Through the above process, the transistor 150 can be manufactured.

In addition, a method for manufacturing the transistor 170 in which the channel protection layer 109 is formed over the oxide semiconductor layer 105, which is different from the method for manufacturing the transistor 150, will be described.

First, steps up to the formation of the oxide semiconductor layer 115 are performed as the method for manufacturing the transistor 150. After that, heat treatment similar to that in the case of the transistor 150 may be performed. Then, an insulating layer for forming the channel protective layer 109 is formed over the oxide semiconductor layer 115 with a thickness of 10 nm to 500 nm, preferably 20 nm to 300 nm. The insulating layer for forming the channel protective layer 109 can be formed using a material and a method similar to those of the gate insulating layer 104. In this embodiment, a 200-nm-thick silicon oxide layer is formed by a sputtering method.

It is preferable that the gate insulating layer 104, the oxide semiconductor layer 115, and the insulating layer for forming the channel protective layer 109 are formed successively without exposure to the air. The successive formation without exposure to the air makes it possible that impurities such as water, hydrogen, or hydrocarbon can be prevented from being attached to the interface between the gate insulating layer 104 and the oxide semiconductor layer 115, and the interface between the insulating layer for forming the channel protective layer 109 and the oxide semiconductor layer 115; thus, reliability of the semiconductor device can be improved.

When the gate insulating layer 104 and the insulating layer for forming the oxide semiconductor layer 115 and the channel protective layer 109 are formed successively, the heat treatment after the oxide semiconductor layer 115 is formed is preferably performed after the successive formation is completed. The heat treatment is performed on the oxide semiconductor layer 115 sandwiched between the gate insulating layer 104 and the insulating layer for forming the channel protective layer 109 and thus oxygen is supplied from both the insulating layers to the oxide semiconductor layer 115, so that defects in the oxide semiconductor layer 115 can be reduced.

Next, a mask is formed over the insulating layer for forming the channel protective layer 109 and the insulating layer is selectively etched to form the channel protective layer 109. The mask formed over the insulating layer can be formed by a printing method, an inkjet method, or a photolithography method as appropriate.

Then, the mask is removed and a conductive layer for forming the source electrode 106a and the drain electrode 106b is formed over the oxide semiconductor layer 115. The following steps can be performed in a manner similar to the steps for manufacturing the transistor 150.

This embodiment can be combined with any of the other embodiments as appropriate.

Embodiment 2

Figure 9A:
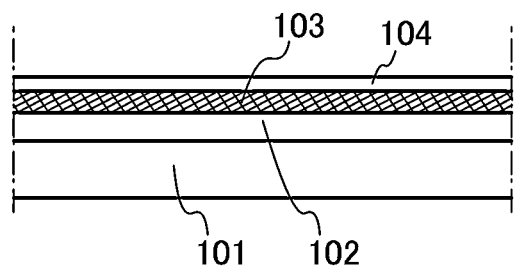
FIGS. 9A to 9C are cross-sectional views illustrating one embodiment of the present invention.
Figure 9B:
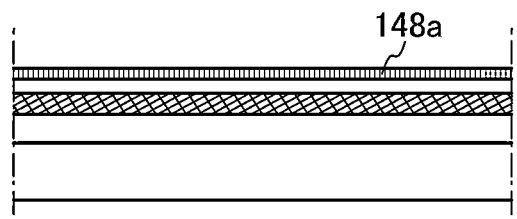
Figure 9C:
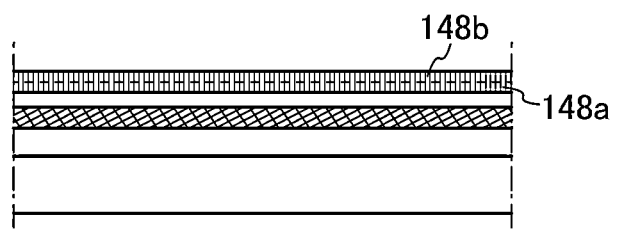

In this embodiment, an example of a process which is partly different from that described in Embodiment 1 will be described with reference to FIGS. 9A to 9C. Note that the same reference numerals are used for the same parts as those in Embodiment 1, and specific description of the parts with the same reference numerals is omitted here.

First, as in Embodiment 1, the base layer 102 is formed over the substrate 101, and the gate electrode 103 is formed over the base layer 102.

Then, the gate insulating layer 104 is formed over the gate electrode 103, and a first oxide semiconductor layer with a thickness of 1 nm to 10 nm is formed over the gate insulating layer 104. In this embodiment, the first oxide semiconductor layer is formed to a thickness of 5 nm by using a sputtering gas of oxygen under such conditions that a target for an oxide semiconductor (a target for an In—Ga—Zn-based oxide semiconductor ($In_2O_3$:$Ga_2O_3$:ZnO=1:1:2 [molar ratio]) is used, the distance between the substrate and the target is 170 mm, the substrate temperature is 250° C., the pressure is 0.4 Pa, and the direct current (DC) power is 0.5 kW.

Then, first heat treatment is performed by setting an atmosphere where the substrate is placed to a nitrogen atmosphere or dry air. The first heat treatment is performed at 200° C. to 450° C. In the first heat treatment, heating is performed for 1 hour to 24 hours. By the first heat treatment, the first oxide semiconductor layer is crystallized and a first crystalline oxide semiconductor layer 148a is formed (see FIG. 9B).

Next, a second oxide semiconductor layer is formed to a thickness greater than 10 nm over the first crystalline oxide semiconductor layer 148a. In this embodiment, the second oxide semiconductor layer is formed to a thickness of 25 nm by using a sputtering gas of oxygen under such conditions that a target for an oxide semiconductor (a target for an In—Ga—Zn-based oxide semiconductor ($In_2O_3$:$Ga_2O_3$:ZnO=1:1:2 [molar ratio]) is used, the distance between the substrate and the target is 170 mm, the substrate temperature is 400° C., the pressure is 0.4 Pa, and the direct current (DC) power is 0.5 kW.

Then, second heat treatment is performed by setting an atmosphere where the substrate is placed to a nitrogen atmosphere or dry air. The second heat treatment is performed at 200° C. to 450° C. In the second heat treatment, heating is performed for 1 hour to 24 hours. By the second heat treatment, the second oxide semiconductor layer is crystallized and a second crystalline oxide semiconductor layer 148b is formed (see FIG. 9C).

In the following process, the transistor 150 can be obtained in accordance with Embodiment 1. Note that in the case where this embodiment is employed, the semiconductor layer including channel formation regions of the transistor 150 has a stacked-layer structure of the first crystalline oxide semiconductor layer 148a and the second crystalline oxide semiconductor layer 148b.

The first crystalline oxide semiconductor layer 148a and the second crystalline oxide semiconductor layer 148b are non-single crystal and include a crystal (also referred to as a c-axis aligned crystal (CAAC-OS)), which has a triangular or hexagonal atomic arrangement when seen from the direction of an a-b plane, a surface, or an interface, and in which metal atoms are arranged in a layered manner, or metal atoms and oxygen atoms are arranged in a layered manner along the c-axis, and the directions of the a-axis or the b-axis is varied in the a-b plane (the crystal rotates around the c-axis).

The CAAC-OS is not a single crystal oxide, but this does not mean that the CAAC-OS is composed of only an amorphous component. Although the CAAC-OS includes a crystallized portion (crystalline portion), a boundary between one crystalline portion and another crystalline portion is not clear in some cases. Nitrogen may be substituted for part of oxygen included in the CAAC-OS. Alternatively, the normals of the a-b planes (c-axes) of the individual crystalline portions included in the oxide including CAAC-OS may be aligned in a certain direction (e.g., a direction perpendicular to a surface of a substrate over which the oxide including CAAC-OS is formed or a surface of the oxide including CAAC-OS).

The CAAC-OS may become a conductor or an insulator depending on its composition or the like. The CAAC transmits or does not transmit visible light depending on its composition or the like. As an example of such a CAAC, there is a material which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

Through the second heat treatment, oxygen can be supplied from the gate insulating layer 104 to the first crystalline oxide semiconductor layer 148a and the second crystalline oxide semiconductor layer 148b, so that oxygen deficiency in the first crystalline oxide semiconductor layer 148a and the second crystalline oxide semiconductor layer 148b can be reduced. Further, heat treatment is preferably performed after the second heat treatment is completed in such a manner that the atmosphere is changed to an oxidation atmosphere with the temperature maintained. The heat treatment in an oxidation atmosphere enables to reduce the oxygen deficiency in the oxide semiconductor. Note that heat treatment to reduce oxygen deficiency may be performed in a step after the CAAC-OS is formed.

The transistor whose semiconductor layer includes CAAC-OS has stable electric characteristics: when the transistor is irradiated with light or subjected to a bias-temperature (BT) test, the amount of change of threshold voltage of the transistor can be reduced.

This embodiment can be implemented combining with any of the other embodiments as appropriate.

Embodiment 3

In this embodiment, a method for forming an oxide semiconductor including CAAC-OS, which is different from the method disclosed in Embodiment 2, will be described.

First, over the gate insulating layer 104, an oxide semiconductor is formed with a thickness of 1 nm to 50 nm.

The substrate temperature in the film formation is 150° C. to 450° C., preferably 200° C. to 350° C. The deposition is performed while the substrate is heated in the range of 150° C. to 450° C., preferably 200° C. to 350° C., whereby moisture (including hydrogen) or the like is prevented from entering a film. Further, CAAC-OS which is an oxide semiconductor including crystal can be formed.

Further, it is preferable that hydrogen be further released from the oxide semiconductor and oxygen contained in the gate insulating layer 104 be partly diffused into the oxide semiconductor and the vicinity of the interface of the oxide semiconductor in the gate insulating layer 104 by performing heat treatment on the substrate 101 after formation of the oxide semiconductor. An oxide semiconductor including more highly crystalline CAAC-OS can be formed by the heat treatment.

The temperature of the heat treatment is preferably a temperature at which hydrogen is released from the oxide semiconductor and oxygen contained in the gate insulating layer 104 is partly released and diffused into the oxide semiconductor. The temperature is typically higher than or equal to 150° C. and lower than the strain point of the substrate, preferably higher than or equal to 250° C. and lower than or equal to 450° C., further preferably higher than or equal to 300° C. and lower than or equal to 450° C.

A rapid thermal annealing (RTA) apparatus can be used in the heat treatment. With the use of the RTA apparatus, heat treatment can be performed at a temperature of higher than or equal to the strain point of a substrate if the heating time is short. Consequently, time taken to form an oxide semiconductor layer in which the proportion of a crystalline region is higher than that of an amorphous region can be shortened.

The heat treatment can be performed in an inert gas atmosphere; typically the heat treatment is preferably performed in a rare gas (such as helium, neon, argon, xenon, or krypton) atmosphere or a nitrogen atmosphere. Alternatively, the heat treatment may be performed in an oxygen atmosphere or a reduced-pressure atmosphere. The treatment time is from 3 minutes to 24 hours. As the treatment time is increased, the proportion of a crystalline region with respect to an amorphous region in the oxide semiconductor layer can be increased; however, heat treatment for longer than 24 hours is not preferable because the productivity is reduced.

Through the above steps, CAAC-OS can be formed.

This embodiment can be combined as appropriate with any of the other embodiments.

Embodiment 4

In this embodiment, the case where a semiconductor device (also referred to as a display device) having a display function in which transistors disclosed in the above embodiments are used for a pixel portion and a driver circuit is manufactured will be described. When part or whole of the driver circuit is formed over the same substrate as the pixel portion with the use of the transistors, a system-on-panel can be obtained.

The display device includes a display element. As the display element, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Furthermore, a display medium whose contrast is changed by an electric effect, such as electronic ink, can be used.

In addition, the display device includes a panel in which the display element is sealed, and a module in which an IC or the like including a controller is mounted on the panel. The display device relates to one mode of an element substrate before the display element is completed in a manufacturing process of the display device, and the element substrate is provided with a means for supplying a current to the display element in each of a plurality of pixels. Specifically, the element substrate may be in a state where it is provided only with a pixel electrode of the display element, in a state where a conductive film to be a pixel electrode has been formed and the conductive film has not yet been etched to form the pixel electrode, or in any other state.

Note that a display device in this specification means an image display device, a display device, or a light source (including a lighting device). Further, the "display device" includes the following modules in its category: a module including a connector such as a flexible printed circuit (FPC), a tape automated bonding (TAB) tape, or a tape carrier package (TCP) attached; a module having a TAB tape or a TCP which is provided with a printed wiring board at the end thereof; and a module having an integrated circuit (IC) which is directly mounted on a display element by a chip on glass (COG) method.

In this embodiment, the appearance and the cross section of a liquid crystal display panel, which is an embodiment of a semiconductor device, will be described with reference to FIGS. 10A1, 10A2, and 10B. FIGS. 10A1 and 10A2 are top views of liquid crystal display panels in which transistors 4010 and 4011 and a liquid crystal element 4013 which are formed over a first substrate 4001 are sealed between the first substrate 4001 and a second substrate 4006 with a sealant 4005. FIG. 10B is a cross-sectional view taken along line M-N of FIGS. 10A1 and 10A2.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that the connection method of a driver circuit which is separately formed is not particularly limited, and a COG method, a wire bonding method, a TAB method, or the like can be used. FIG. 10A1 illustrates an example of mounting the signal line driver circuit 4003 by a COG method, and FIG. 10A2 illustrates an example of mounting the signal line driver circuit 4003 by a TAB method.

The pixel portion 4002 and the scan line driver circuit 4004 provided over the first substrate 4001 include a plurality of transistors. FIG. 10B illustrates the transistor 4010 included in the pixel portion 4002 and the transistor 4011 included in the scan line driver circuit 4004. Insulating layers 4020, 4021, and 4022 are provided over the transistors 4010 and 4011.

A transistor whose semiconductor layer where a channel is formed includes the oxide semiconductor described in any of the above embodiments can be used as the transistor 4010 and the transistor 4011. In this embodiment, the transistor 4010 and the transistor 4011 are n-channel transistors.

A conductive layer 4040 is provided over part of the insulating layer 4022 which overlaps with a channel formation region of an oxide semiconductor layer in the transistor 4011 for the driver circuit. The conductive layer 4040 is provided at the position overlapping with the channel formation region of the oxide semiconductor layer, whereby the amount of change in threshold voltage of the transistor 4011 in the BT test can be reduced. The conductive layer 4040 may have the same potential as or have potential different from that of the gate electrode of the transistor 4011 and can function as a second gate electrode. Alternatively, the potential of the conductive layer 4040 may be GND or 0 V, or the conductive layer 4040 may be in a floating state.

The conductive layer 4040 can also serve as a back gate electrode. The back gate electrode is positioned so that the channel formation region of the semiconductor layer is interposed between the gate electrode and the back gate electrode. The back gate electrode is formed using a conductive layer and can function in a manner similar to that of the gate electrode. By changing a potential of the back gate electrode, the threshold voltage of the transistor can be changed.

The conductive layer 4040 may be formed using the same conductive layer and at the same time as a pixel electrode 4030. Alternatively, another conductive layer may be formed and selectively etched so that the conductive layer 4040 is formed. The conductive layer 4040 may be formed below the insulating layer 4022. Further, the conductive layer 4040 may be formed to overlap with a channel formation region of the semiconductor layer of the transistor 4010. The conductive layer 4040 formed using a light-blocking material can be served as a light-blocking layer.

In addition, the pixel electrode 4030 included in the liquid crystal element 4013 is electrically connected to the transistor 4010 through a contact hole 4025 in the insulating layers 4020, 4021, and 4022. A counter electrode 4031 of the liquid crystal element 4013 is formed on the second substrate 4006. The liquid crystal element 4013 corresponds to a region where the pixel electrode 4030, the counter electrode 4031, and the liquid crystal layer 4008 overlap with each other. Note that the pixel electrode 4030 and the counter electrode 4031 are provided with an insulating layer 4032 and an insulating layer 4033 respectively which each serve as an alignment film, and the liquid crystal layer 4008 is sandwiched between the pixel electrode 4030 and the counter electrode 4031 with the insulating layers 4032 and 4033 provided therebetween.

Note that the first substrate 4001 and the second substrate 4006 can be formed of glass, metal (typically, stainless steel), ceramic, or plastic. As plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

A spacer 4035 is a columnar spacer obtained by selective etching of an insulating layer and is provided in order to control the distance (a cell gap) between the pixel electrode layer 4030 and the counter electrode layer 4031. Alternatively, a spherical spacer may be used. The counter electrode 4031 is electrically connected to a common potential line provided over the same substrate as the transistor 4010. With use of the common connection portion, the counter electrode layer 4031 and the common potential line can be electrically connected to each other by conductive particles arranged between a pair of substrates. Note that the conductive particles are included in the sealant 4005.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase is only generated within a narrow range of temperatures, a liquid crystal composition containing a chiral agent at 5 wt % or more is used for the liquid crystal layer 4008 in order to improve the temperature range. The liquid crystal composition which includes a liquid crystal exhibiting a blue phase and a chiral agent has a short response time of 1 msec or less, and has optical isotropy, which makes the alignment process unneeded and viewing angle dependence small.

Note that the liquid crystal display device described in this embodiment is an example of a transmissive liquid crystal display device; however, the liquid crystal display device can be applied to either a reflective liquid crystal display device or a semi-transmissive liquid crystal display device.

In this embodiment, in order to reduce surface unevenness of the transistors and to improve reliability of the transistors, the transistors are covered with a protective layer or an insulating layer which functions as a planarizing insulating layer (the insulating layer 4020, the insulating layer 4021, and the insulating layer 4022). Note that the protective layer is provided to prevent entry of a contaminant impurity such as an organic substance, a metal substance, or moisture floating in air and is preferably a dense film. As the protective layer, a single layer or a stacked layer of any of a silicon oxide film, a silicon nitride film, a silicon oxynitride film, a silicon nitride oxide film, an aluminum oxide film, an aluminum nitride film, an aluminum oxynitride film, or an aluminum nitride oxide film may be formed by a sputtering method. In this embodiment, an example in which the protective layer is formed by a sputtering method is described; however, there is no particular limitation on a method, and various kinds of methods may be used.

Here, a silicon oxide film is formed by a sputtering method as the insulating layer 4020, and an aluminum oxide film is formed by a sputtering method as the insulating layer 4021.

The insulating layer 4022 is formed as the planarizing insulating layer. As the insulating layer 4022, an organic material having heat resistance such as polyimide, an acrylic resin, a benzocyclobutene-based resin, polyamide, or an epoxy resin can be used. Other than such organic materials, it is also possible to use a low-dielectric constant material (a low-k material), a siloxane-based resin, PSG (phosphosilicate glass), BPSG (borophosphosilicate glass), or the like. Note that the insulating layer 4022 may be formed by stacking a plurality of insulating layers formed using any of these materials.

Note that the siloxane-based resin corresponds to a resin including a Si—O—Si bond formed using a siloxane-based material as a starting material. The siloxane-based resin may include as a substituent an organic group (e.g., an alkyl group or an aryl group) or a fluoro group. In addition, the organic group may include a fluoro group.

There is no particular limitation on the method for forming the insulating layer 4022, and any of the following methods which depend on a material thereof can be used: a sputtering method; a CVD method; an evaporation method; a SOG method; spin coating; dipping; spray coating; a droplet discharging method (e.g., an ink-jet method, screen printing, or offset printing). In the case of forming the insulating layer 4022 using a material solution, heat treatment of the semiconductor layer may be performed at the same time as a baking step. The baking step of the insulating layer 4022 also serves as heat treatment of the semiconductor layer, whereby a semiconductor device can be manufactured efficiently.

The pixel electrode 4030 and the counter electrode 4031 can be formed of a light-transmitting conductive material such as indium oxide containing tungsten oxide, indium zinc oxide containing tungsten oxide, indium oxide containing titanium oxide, indium tin oxide containing titanium oxide, indium tin oxide, indium zinc oxide, or indium tin oxide to which silicon oxide is added.

Alternatively, a conductive composition including a conductive high molecule (also referred to as a conductive polymer) can be used for the pixel electrode 4030 and the counter electrode 4031. The pixel electrode formed using the conductive composition preferably has a sheet resistance of less than or equal to 10000 Ω·per square and a transmittance of greater than or equal to 70% at a wavelength of 550 nm. Further, the resistivity of the conductive high molecule included in the conductive composition is preferably less than or equal to 0.1 Ω·cm.

As the conductive high molecule, a so-called π-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof, and the like can be given.

Further, a variety of signals and potentials are supplied to the signal line driver circuit 4003 which is formed separately, the scan line driver circuit 4004, or the pixel portion 4002 from an FPC 4018.

FIGS. 10A1, 10A2, and 10B illustrate an example in which the signal line driver circuit 4003 is formed separately and mounted on the first substrate 4001; however, this embodiment is not limited to this structure. The scan line driver circuit may be separately formed and then mounted, or only part of the signal line driver circuit or part of the scan line driver circuit may be separately formed and then mounted.

Figure 11:
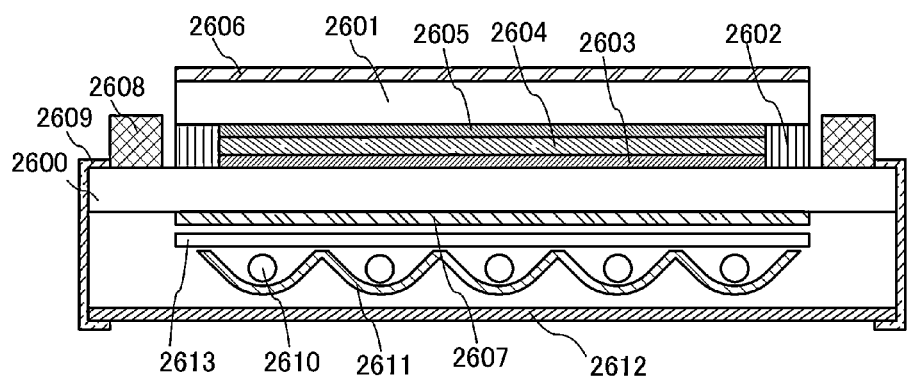
FIG. 11 is a cross-sectional view illustrating one embodiment of the present invention.

FIG. 11 illustrates an example in which a substrate 2600 is used for a liquid crystal display module corresponding to one mode of a semiconductor device.

FIG. 11 illustrates an example of the liquid crystal display module, in which the substrate 2600 and a counter substrate 2601 are fixed to each other with a sealant 2602, and a pixel portion 2603 including a transistor and the like, a display element 2604 including a liquid crystal layer, and a coloring layer 2605 are provided between the substrates to form a display region. The coloring layer 2605 is necessary to perform color display. In the RGB system, respective coloring layers corresponding to colors of red, green, and blue are provided for respective pixels. Polarizing plates 2606 and 2607 and a diffusion plate 2613 are provided outside the substrate 2600 and the counter substrate 2601. A light source includes a cold cathode tube 2610 and a reflective plate 2611. A circuit board 2612 is connected to a wiring circuit portion 2608 of the substrate 2600 through a flexible wiring board 2609 and includes an external circuit such as a control circuit or a power source circuit. The polarizing plate and the liquid crystal layer may be stacked with a retardation plate therebetween.

An example of the liquid crystal display device described in this embodiment is illustrated in which a polarizing plate is provided on the outer surface of the substrate (on the viewer side) and a coloring layer and an electrode layer used for a display element are provided on the inner surface of the substrate in that order; however, the polarizing plate may be provided on the inner surface of the substrate. The stacked structure of the polarizing plate and the coloring layer is not limited to this embodiment and may be set as appropriate depending on materials of the polarizing plate and the coloring layer or conditions of manufacturing process. Further, a light-blocking film serving as a black matrix may be provided as needed.

For the liquid crystal display module, a twisted nematic (TN) mode, an in-plane-switching (IPS) mode, a fringe field switching (FFS) mode, a multi-domain vertical alignment (MVA) mode, a patterned vertical alignment (PVA) mode, an axially symmetric aligned micro-cell (ASM) mode, an optical compensated birefringence (OCB) mode, a ferroelectric liquid crystal (FLC) mode, an antiferroelectric liquid crystal (AFLC) mode, transverse bend alignment (TBA) mode, or the like can be used.

Through the process, a highly reliable liquid crystal display device as a semiconductor device can be manufactured.

In the case where a transistor in a pixel portion of the above-described liquid crystal display device is manufactured using the manufacturing method of a transistor described in the above embodiments, display unevenness due to variations in the threshold voltage of transistors of respective pixels can be suppressed.

Further, the transistors in the driver circuit portion of the liquid crystal display device are manufactured by the manufacturing method of the thin film transistor which is described in the above embodiments, whereby high-speed operation of the thin film transistors in the driver circuit portion can be realized and power saving can be achieved.

Note that when a light-emitting element is used instead of a liquid crystal element, a self-luminous display device in which a light source or a polarizing plate is not needed and power consumption is low can be obtained. The self-luminous display device can be obtained by replacing the liquid crystal element 4013 in the liquid crystal panel in FIGS. 10A1, 10A2, and 10B with an inorganic EL element or an organic EL element.

In an organic EL element, by application of voltage to a light-emitting element, electrons and holes are separately injected from a pair of electrodes into a layer containing a light-emitting organic compound, and current flows. Then, the carriers (electrons and holes) are recombined, so that light is emitted. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions.

In order to extract light emitted from the light-emitting element, at least one of a pair of electrodes may be transparent. Then, a transistor and a light-emitting element are formed over a substrate. The light-emitting element may have any of the following structure: a top emission structure in which light emission is extracted through the surface opposite to the substrate; a bottom emission structure in which light emission is extracted through the surface on the substrate side; or a dual emission structure in which light emission is extracted through the surface on the substrate side and the surface opposite to the substrate.

For example, an organic EL element is an element in which a light-emitting organic compound layer is sandwiched between at least a pair of electrodes, and the organic compound layer has, in general, a stacked-layer structure. For example, the organic compound layer has a stacked-layer structure in which a hole-injection layer, a hole-transport layer, a light-emitting layer, and an electron-transport layer are stacked in this order between a pair of electrodes (a pixel electrode and a counter electrode), or a hole-injection layer, a hole-transport layer, a light-emitting layer, an electron-transport layer, and an electron injection layer are stacked in this order therebetween. In addition, the light-emitting layer may be doped with a phosphorescence pigment and the like. Each layer included in the EL element may be formed of a low molecular weight material or a high molecular weight material.

In an active matrix liquid crystal display device, a liquid crystal element may be controlled by one transistor in each pixel, whereas in the case where a light-emitting element configures a pixel, it is preferable that current flowing in the light-emitting element be properly controlled by two or more transistors. Note that the transistors described in any of the above embodiments can be used as the transistor.

In such a manner, a display device with high display quality, high reliability, and low power consumption can be obtained with the use of the transistor manufactured by a manufacturing method which is one embodiment of the present invention.

This embodiment can be implemented in appropriate combination with the structures described in any of the other embodiments.

Embodiment 5

In this embodiment, a typical driving method of a liquid crystal display device which is one embodiment of the present invention will be described showing some modes of operating liquid crystals as examples. As driving methods for liquid crystals in liquid crystal display devices, there is a vertical electric field method in which voltage is applied perpendicular to a substrate, and a horizontal electric field method in which voltage is applied parallel to a substrate.

First, FIGS. 12A1 and 12A2 are cross-sectional schematic views illustrating a pixel structure of a TN-mode liquid crystal display device.

A layer 3100 including a display element is held between a first substrate 3101 and a second substrate 3102 which are provided so as to face each other. A first polarizing plate 3103 is formed on the first substrate 3101 side, and a second polarizing plate 3104 is formed on the second substrate 3102 side. An absorption axis of the first polarizing plate 3103 and an absorption axis of the second polarizing plate 3104 are arranged in a cross-Nicol state.

Although not illustrated, a backlight and the like are provided outside the second polarizing plate 3104. A first electrode 3108 is provided on the first substrate 3101 and a second electrode 3109 is provided on the second substrate 3102. The first electrode 3108 on the opposite side to the backlight, that is, on the viewing side, is formed to have a light-transmitting property.

In the case where the liquid crystal display device having such a structure is in a normally white mode, when a voltage is applied between the first electrode 3108 and the second electrode 3109 (referred to as a vertical electric field method), liquid crystal molecules 3105 are aligned vertically as illustrated in FIG. 12A1. Thus, light from the backlight cannot pass through the first polarizing plate 3103, which leads to black display.

When no voltage is applied between the first electrode 3108 and the second electrode 3109, the liquid crystal molecules 3105 are aligned horizontally and twisted on a plane surface as illustrated in FIG. 12A2. As a result, light from the backlight can pass through the first polarizing plate 3103, which leads to white display. In addition, adjustment of a voltage applied between the first electrode 3108 and the second electrode 3109 makes a gray scale possible. In this manner, a predetermined image is displayed.

Full color display can be performed once a color filter is placed. The color filter can be placed on either the first substrate 3101 side or the second substrate 3102 side.

A known liquid crystal material may be used for a TN-mode liquid crystal display device.

FIGS. 12B1 and 12B2 are cross-sectional schematic views illustrating a pixel structure of a VA-mode liquid crystal display device. In the VA mode, the liquid crystal molecules 3105 are aligned to be vertical to the substrate when there is no electric field.

As in FIGS. 12A1 and 12A2, the first electrode 3108 is provided on the first substrate 3101 and the second electrode 3109 is provided on the second substrate 3102. The first electrode 3108 on the opposite side to the backlight, that is, on the viewing side, is formed to have a light-transmitting property. The first polarizing plate 3103 is formed on the first substrate 3101 side, and second polarizing plate 3104 is formed on the second substrate 3102 side. The absorption axis of the first polarizing plate 3103 and the absorption axis of the second polarizing plate 3104 are arranged in a cross-Nicol state.

In the liquid crystal display device having such a structure, when a voltage is applied between the first electrode 3108 and the second electrode 3109 (the vertical electric field method), the liquid crystal molecules 3105 are aligned horizontally as illustrated in FIG. 12B1. Thus, light from the backlight can pass through the first polarizing plate 3103, which leads to white display.

When no voltage is applied between the first electrode 3108 and the second electrode 3109, the liquid crystal molecules 3105 are aligned vertically as illustrated in FIG. 12B2. As a result, light from the backlight which is polarized by the second polarizing plate 3104 passes through a cell without being influenced by birefringence of the liquid crystal molecules 3105. Thus, the polarized light from the backlight cannot pass through the first polarizing plate 3103, which leads to black display. In addition, adjustment of a voltage applied between the first electrode 3108 and the second electrode 3109 makes a gray scale possible. In this manner, a predetermined image is displayed.

Full color display can be performed once a color filter is placed. The color filter can be placed on either the first substrate 3101 side or the second substrate 3102 side.

FIGS. 12C1 and 12C2 are cross-sectional schematic views illustrating a pixel structure of an MVA-mode liquid crystal display device. The MVA mode is a method in which one pixel is divided into a plurality of portions, and the portions have different alignment directions of the liquid crystal molecules 3105 and compensate the viewing angle dependencies with each other. As illustrated in FIG. 12C1, in the MVA mode, a projection 3158 whose cross section is a triangle is provided on the first electrode 3108 and a protrusion 3159 whose cross section is a triangle is provided on the second electrode 3109 for controlling alignment. Note that the structures other than the protrusions are in common with the structures in the VA mode.

When a voltage is applied between the first electrode 3108 and the second electrode 3109 (the vertical electric field method), the liquid crystal molecules 3105 are aligned so that a long axis of the liquid crystal molecule 3105 is substantially vertical to surfaces of the projections 3158 and 3159 as illustrated in FIG. 12C1. Thus, light from the backlight can pass through the first polarizing plate 3103, which leads to white display.

When no voltage is applied between the first electrode 3108 and the second electrode 3109, the liquid crystal molecules 3105 are aligned horizontally as illustrated in FIG. 12C2. As a result, light from the backlight cannot pass through the first polarizing plate 3103, which leads to black display. In addition, adjustment of a voltage applied between the first electrode 3108 and the second electrode 3109 makes a gray scale possible. In this manner, a predetermined image is displayed.

Full color display can be performed once a color filter is placed. The color filter can be placed on either the first substrate 3101 side or the second substrate 3102 side.

Figure 15A:
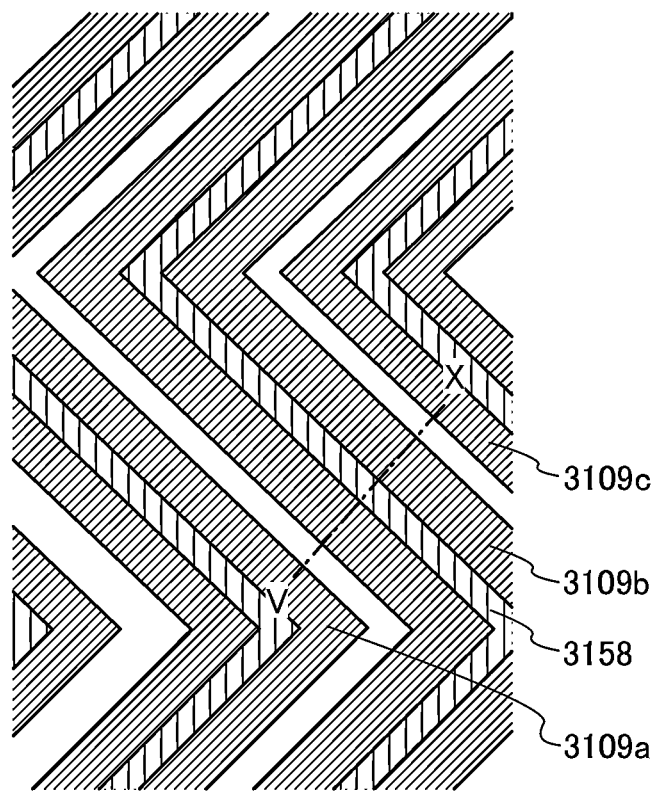
FIGS. 15A and 15B are a top view and a cross-sectional view illustrating a pixel structure of a liquid crystal display device.
Figure 15B:
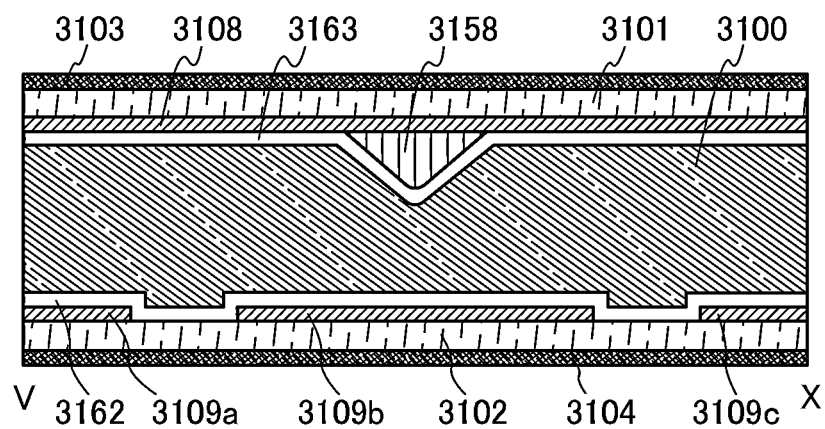

Another example of a structure of an MVA-mode liquid crystal display device will be described with reference to FIGS. 15A and 15B. FIG. 15A is a top view illustrating a pixel structure of an MVA-mode liquid crystal display device. FIG. 15B is a cross-sectional view of a portion take along line V-X in FIG. 15A. Note that in FIG. 15A, descriptions except for a second electrode 3109a, a second electrode 3109b, a second electrode 3109c, and the projection 3158 are not shown for easy understanding. As illustrated in FIG. 15A, the second electrode 3109a, the second electrode 3109b, and the second electrode 3109c are formed into a bent pattern of a dogleg-like shape. As illustrated in FIG. 15B, an insulating layer 3162 and an insulating layer 3163 which are alignment films are formed over the second electrodes 3109a, 3109b, and 3109c and over the first electrode 3108, respectively. The projection 3158 is formed on the first electrode 3108 and overlapping with the second electrode 3109b.

FIGS. 13A1 and 13A2 are cross-sectional schematic views illustrating a pixel structure of an OCB-mode liquid crystal display device. In the OCB mode, the liquid crystal molecules 3105 align so as to compensate the viewing angle dependencies in a liquid crystal layer (bend alignment).

As in FIGS. 12A1, 12A2, 12B1, 12B2, 12C1, and 12C2, the first electrode 3108 is provided on the first substrate 3101 and the second electrode 3109 is provided on the second substrate 3102. The first electrode 3108 on the opposite side to the backlight, that is, on the viewing side, is formed to have a light-transmitting property. The first polarizing plate 3103 is formed on the first substrate 3101 side, and the second polarizing plate 3104 is formed on the second substrate 3102 side. The absorption axis of the first polarizing plate 3103 and the absorption axis of the second polarizing plate 3104 are arranged in a cross-Nicol state.

In the liquid crystal display device having such a structure, when a voltage is applied to the first electrode 3108 and the second electrode 3109 (the vertical electric field method), black display is performed as illustrated in FIG. 13A1. At that time, liquid crystal molecules 3105 are aligned vertically as illustrated in FIG. 13A1. Thus, light from the backlight cannot pass through the first polarizing plate 3103, which leads to black display.

When a voltage is not applied between the first electrode 3108 and the second electrode 3109, the liquid crystal molecules 3105 are in a bend alignment state as illustrated in FIG. 13A2. As a result, light from the backlight can pass through the first polarizing plate 3103, which leads to white display. In addition, adjustment of a voltage applied between the first electrode 3108 and the second electrode 3109 makes a gray scale possible. In this manner, a predetermined image is displayed.

Full color display can be performed once a color filter is placed. The color filter can be placed on either the first substrate 3101 side or the second substrate 3102 side.

In the OCB mode, since alignment of the liquid crystal molecules 3105 can compensate the viewing angle dependencies in a liquid crystal layer. In addition, a contrast ratio can be increased by a pair of stacked layers including polarizers.

FIGS. 13B1 and 13B2 are cross-sectional schematic views illustrating pixel structures of an FLC-mode liquid crystal display device and an AFLC-mode liquid crystal display device.

As in FIGS. 12A1, 12A2, 12B1, 12B2, 12C1, and 12C2, the first electrode 3108 is provided on the first substrate 3101 and the second electrode 3109 is provided on the second substrate 3102. The first electrode 3108 on the opposite side to the backlight, that is, on the viewing side, is formed to have a light-transmitting property. The first polarizing plate 3103 is formed on the first substrate 3101 side, and the second polarizing plate 3104 is formed on the second substrate 3102 side. The absorption axis of the first polarizing plate 3103 and the absorption axis of the second polarizing plate 3104 are arranged in a cross-Nicol state.

In the liquid crystal display device having such a structure, when a voltage is applied between the first electrode 3108 and the second electrode 3109 (the vertical electric field method), the liquid crystal molecules 3105 are aligned horizontally in a direction deviated from a rubbing direction. Thus, light from the backlight can pass through the first polarizing plate 3103, which leads to white display.

When no voltage is applied between the first electrode 3108 and the second electrode 3109, the liquid crystal molecules 3105 are aligned horizontally along the rubbing direction as shown in FIG. 13B2. As a result, light from the backlight cannot pass through the first polarizing plate 3103, which leads to black display. In addition, adjustment of a voltage applied between the first electrode 3108 and the second electrode 3109 makes a gray scale possible. In this manner, a predetermined image is displayed.

Full color display can be performed once a color filter is placed. The color filter can be placed on either the first substrate 3101 side or the second substrate 3102 side.

A known liquid crystal material may be used for the FLC-mode liquid crystal display device and the AFLC-mode liquid crystal display device.

FIGS. 14A1 and 14A2 are cross-sectional schematic views each illustrating a pixel structure of a liquid crystal display device of an IPS mode. In the IPS mode, liquid crystal molecules 3105 are rotated on a plane surface with respect to a substrate by a horizontal electric field of electrodes provided only on one substrate side.

The IPS mode is characterized in that liquid crystals are controlled by a pair of electrodes which is provided on one substrate. That is, a pair of electrodes 3150 and 3151 is provided over the second substrate 3102. The pair of electrodes 3150 and 3151 preferably has a light transmitting property. The first polarizing plate 3103 is formed on the first substrate 3101 side and the second polarizing plate 3104 is formed on the side of the second substrate 3102. The absorption axis of the first polarizing plate 3103 and the absorption axis of the second polarizing plate 3104 are in a cross-Nicol arrangement.

When a voltage is applied between the pair of electrodes 3150 and 3151 in a liquid crystal display device having such a structure, the liquid crystal molecules 3105 are aligned along a line of electric force which is deviated from the rubbing direction, as illustrated in FIG. 14A1. As a result, light from a backlight can pass through the first polarizing plate 3103, and white is displayed.

As long as a voltage is not applied between the pair of electrodes 3150 and 3151, the liquid crystal molecules 3105 are aligned horizontally along the rubbing direction, as illustrated in FIG. 14A2. As a result, light from a backlight cannot pass through the first polarizing plate 3103, and black is displayed. In addition, adjustment of a voltage applied between the pair of electrodes 3150 and 3151 makes a gray scale possible. In this manner, a predetermined image is displayed.

Full color display can be performed once a color filter is placed. The color filter may be placed on either the first substrate 3101 side or the second substrate 3102 side.

Figure 16A:
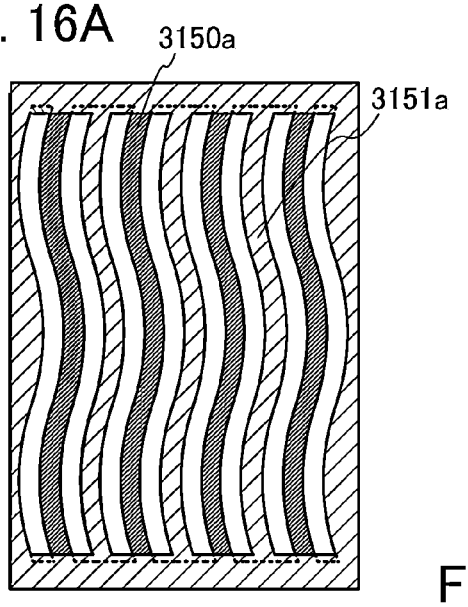
FIGS. 16A to 16C are top views each illustrating a pixel structure of a liquid crystal display device.
Figure 16B:
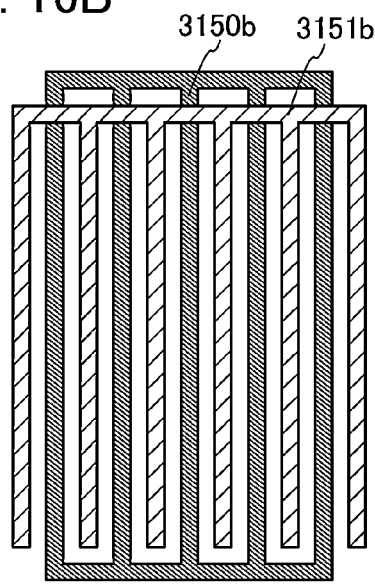
Figure 16C:
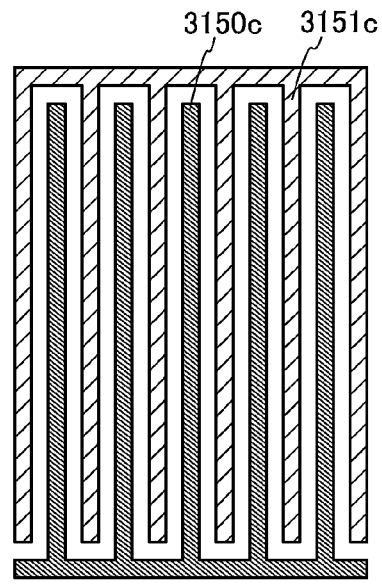

FIGS. 16A to 16C each illustrate an example of the pair of electrodes 3150 and 3151 that can be used in the IPS mode. As illustrated in top views of FIGS. 16A to 16C, the pair of electrodes 3150 and 3151 are alternatively formed. In FIG. 16A, electrodes 3150a and 3151a have an undulating wave shape. In FIG. 16B, electrodes 3150b and 3151b each have a comb-shape and partly overlap with each other. In FIG. 16C, electrodes 3150c and 3151c have a comb-like shape in which the electrodes are meshed with each other.

FIGS. 14B1 and 14B2 are cross-sectional schematic views each illustrating a pixel structure of a liquid crystal display device of an FFS mode. The FFS mode is also vertical electronic field type as the IPS mode and has a structure in which the electrode 3151 is formed over the electrode 3150 with an insulating film provided therebetween as shown in FIGS. 14B1 and 14B2.

The pair of electrodes 3150 and 3151 preferably has a light transmitting property. The first polarizing plate 3103 is formed on the side of the first substrate 3101 and the second polarizing plate 3104 is formed on the side of the second substrate 3102. The absorption axis of the first polarizing plate 3103 and the absorption axis of the second polarizing plate 3104 are in a cross-Nicol arrangement.

When a voltage is applied between the pair of electrodes 3150 and 3151 in a liquid crystal display device having such a structure, the liquid crystal molecules 3105 are aligned along a line of electric force which is deviated from the rubbing direction, as illustrated in FIG. 14B1. As a result, light from the backlight can pass through the first polarizing plate 3103, and white is displayed.

As long as a voltage is not applied between the pair of electrodes 3150 and 3151, the liquid crystal molecules 3105 are aligned horizontally along the rubbing direction, as illustrated in FIG. 14B2. As a result, light from a backlight cannot pass through the first polarizing plate 3103, and black is displayed. In addition, adjustment of a voltage applied between the pair of electrodes 3150 and 3151 makes a gray scale possible. In this manner, a predetermined image is displayed.

Full color display can be performed once a color filter is placed. The color filter may be placed on either the first substrate 3101 side or the second substrate 3102 side.

Figure 17A:
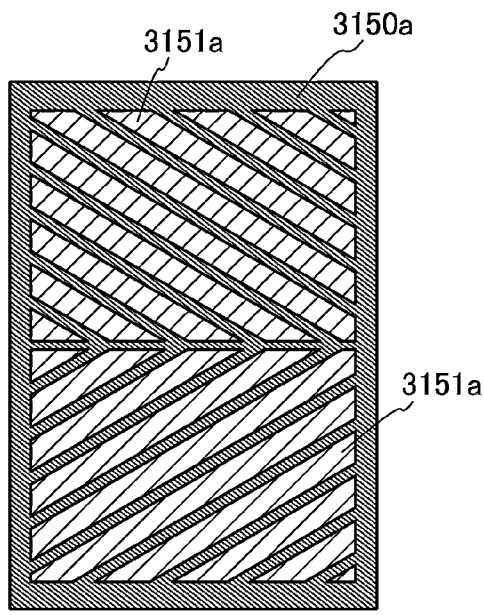
FIGS. 17A to 17C are top views each illustrating a pixel structure of a liquid crystal display device.
Figure 17B:
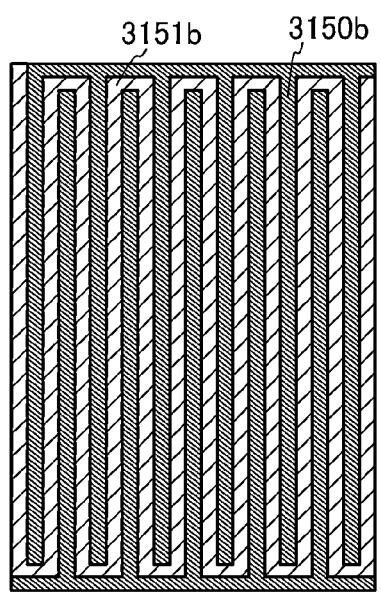
Figure 17C:
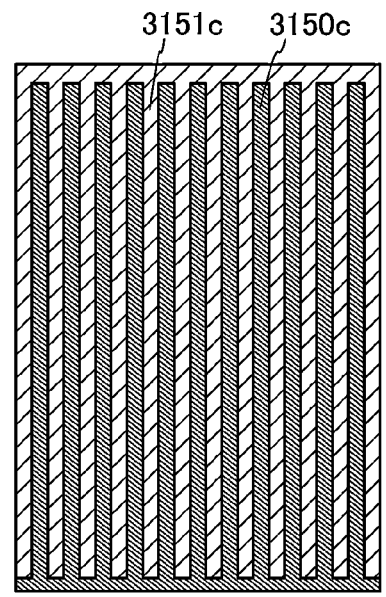

FIGS. 17A to 17C each show an example of the pair of electrodes 3150 and 3151 that can be used in the FFS mode. As illustrated in top views of FIGS. 17A to 17C, the electrodes 3151 are formed into various patterns over the electrodes 3150. In FIG. 17A, the electrode 3151a over the electrode 3150a has a bent dogleg-like shape. In FIG. 17B, the electrode 3151b over the electrode 3150b has a comb-like shape in which the electrodes are meshed with each other. In FIG. 17C, the electrode 3151c over the electrode 3150c has a comb-like shape.

A known material may be used for a liquid crystal material of the IPS mode and the FFS mode. Alternatively, a liquid crystal exhibiting a blue phase may be used.

Another liquid crystal mode such as a PVA mode, an ASM mode, or a TBA mode may be employed.

This embodiment can be implemented in appropriate combination with the structures described in the other embodiments.

Embodiment 6

In this embodiment, a protection circuit which is one embodiment of the present invention is described with reference to FIGS. 18A and 18B.

Figure 18A:
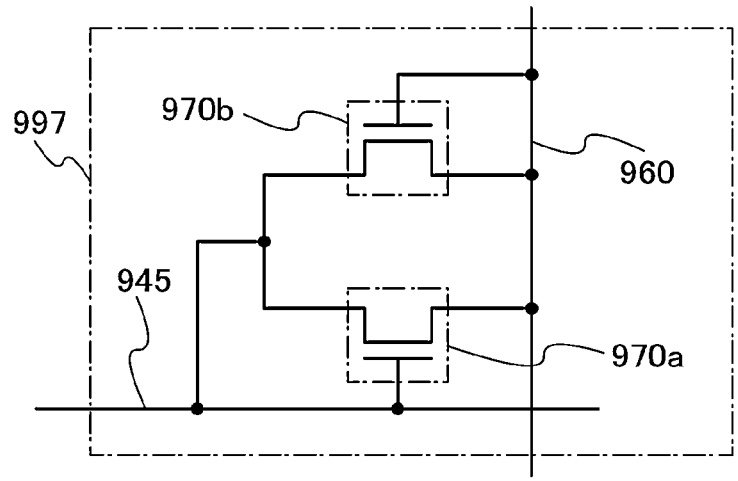
FIGS. 18A and 18B are a circuit diagram and a top view illustrating a semiconductor device.
Figure 18B:
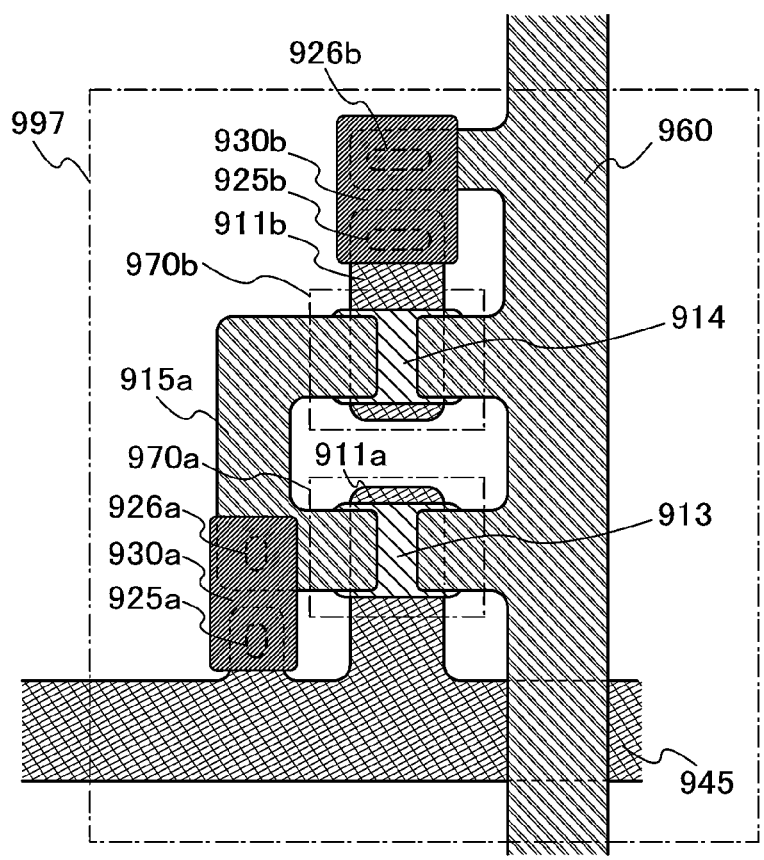

An example of a circuit that can be applied to the protection circuit is illustrated in FIG. 18A. A protection circuit 997 includes transistors 970a and 970b which are n-channel transistors. Each gate terminal of the transistors 970a and 970b is connected to each drain terminal to have similar characteristics as a diode. The transistors disclosed in the any of the above embodiments can be used as the transistors 970a and 970b.

A first terminal (a gate) and a third terminal (a drain) of the transistor 970a are electrically connected to a first wiring 945 and a second terminal (a source) of the transistor 970a is electrically connected to a second wiring 960. A first terminal (a gate) and a third terminal (a drain) of the transistor 970b are electrically connected to the second wiring 960 and a second terminal (a source) of the transistor 970b is electrically connected to the first wiring 945. That is, the protection circuit illustrated in FIG. 18A includes two transistors whose rectifying directions are opposite to each other and each of which connects the first wiring 945 and the second wiring 960. In other words, the protection circuit includes the transistor whose rectifying direction is from the first wiring 945 to the second wiring 960 and the transistor whose rectifying direction is from the second wiring 960 to the first wiring 945, between the first wiring 945 and the second wiring 960.

In the above protection circuit, when the second wiring 960 is positively or negatively charged due to static electricity or the like, current flows in a direction in which the charge is cancelled. For example, when the second wiring 960 is positively charged, current flows in a direction in which the positive charge is released to the first wiring 945. Owing to this operation, electrostatic breakdown or malfunctions of a circuit or an element connected to the charged second wiring 960 can be prevented. In the structure in which the charged second wiring 960 and another wiring intersect with an insulating layer interposed therebetween, this operation can further prevent dielectric breakdown of the insulating layer.

Note that the protection circuit is not limited to the above structure. For example, a structure in which a plurality of transistors whose rectifying direction is from the first wiring 945 to the second wiring 960 and a plurality of transistors whose rectifying direction is from the second wiring 960 to the first wiring 945 are connected may be employed. In addition, a protection circuit can be configured using an odd number of transistors.

The protection circuit shown in FIG. 18A as an example can be applied to various uses. For example, the first wiring 945 is used as a common wiring of a display device, the second wiring 960 is used as one of a plurality of signal lines, and the protection circuit can be provided therebetween. A pixel transistor connected to the signal line which is provided with the protection circuit is protected from malfunctions, such as electrostatic breakdown due to charged wirings, a shift in threshold voltage, and the like. Note that the protection circuit can be applied to semiconductor devices other than a display device.

Next, an example in which the protection circuit 997 is formed over a substrate will be described. An example of a top view of the protection circuit 997 is shown in FIG. 18B.

The transistor 970a includes a gate electrode 911a and a semiconductor layer including a channel formation region 913 which overlaps with the gate electrode 911a. The gate electrode 911a is electrically connected to the first wiring 945. A source electrode of the transistor 970a is electrically connected to the second wiring 960 and a drain electrode thereof is electrically connected to an electrode 930a through a contact hole 926a. The electrode 930a is electrically connected to the first wiring 945 through a contact hole 925a. That is, the gate electrode 911a of the transistor 970a is electrically connected to the drain electrode thereof through the electrode 930a.

The transistor 970b includes a gate electrode 911b and a semiconductor layer including a channel formation region 914 which overlaps with the gate electrode 911b. The gate electrode 911b is electrically connected to an electrode 930b through a contact hole 925b. A source electrode of the transistor 970b is electrically connected to the first wiring 945 through the first electrode 915a and the electrode 930a.

A drain electrode of the transistor 970b is electrically connected to the second wiring 960. The second wiring 960 is electrically connected to the electrode 930b through a contact hole 926b. That is, the gate electrode 911b of the transistor 970b is electrically connected to the drain electrode thereof through the electrode 930b.

In order to reduce contact resistance between the electrodes and the wirings which are connected to each other through the contact holes, the contact holes 925a, 925b, 926a, and 926b preferably have a larger area or the number of contact holes is preferably increased.

When the protection circuit disclosed in this embodiment is applied to a display device, the electrode 930a and the electrode 930b may be formed using the same layer as a pixel electrode of the display device.

This embodiment can be combined as appropriate with any of the other embodiments.

Embodiment 7

Figure 19A:
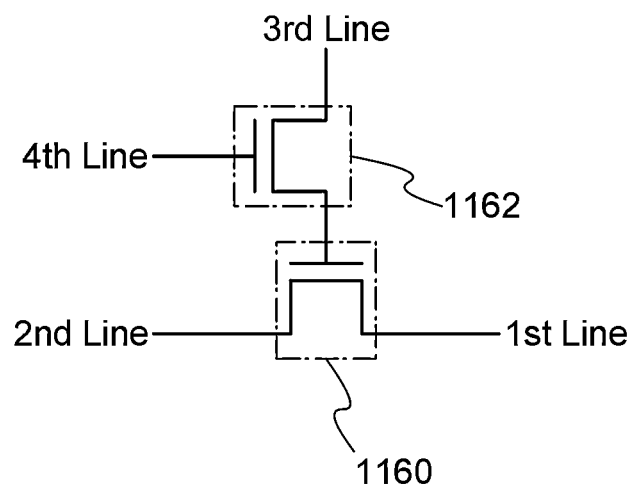
FIGS. 19A and 19B are circuit diagrams each illustrating one embodiment of the present invention.

An example of a circuit diagram of a memory element (hereinafter also referred to as a memory cell) included in a semiconductor device is illustrated in FIG. 19A. The memory cell includes a transistor 1160 whose channel formation region is formed using a material other than an oxide semiconductor and a transistor 1162 whose channel formation region is formed using an oxide semiconductor.

The transistor 1162 whose channel formation region is formed using an oxide semiconductor can be manufactured in accordance with any of the above embodiments.

As illustrated in FIG. 19A, a gate electrode of the transistor 1160 is electrically connected to one of a source electrode and a drain electrode of the transistor 1162. A first wiring SL (a 1st Line, also referred to as a source line) is electrically connected to a source electrode of the transistor 1160. A second wiring BL (a 2nd Line, also referred to as a bit line) is electrically connected to a drain electrode of the transistor 1160. A third wiring S1 (a 3rd Line, also referred to as a first signal line) is electrically connected to the other of the source electrode and the drain electrode of the transistor 1162. A fourth wiring S2 (a 4th Line, also referred to as a second signal line) is electrically connected to a gate electrode of the transistor 1162.

The transistor 1160 in which the channel formation region is formed using a material other than an oxide semiconductor, e.g., single crystal silicon can operate at sufficiently high speed. Therefore, with the use of the transistor 1160, high-speed reading of stored contents and the like are possible. The transistor 1162 in which the channel formation region is formed using an oxide semiconductor is characterized by its small off-state current. Therefore, when the transistor 1162 is turned off, a potential of the gate electrode of the transistor 1160 can be held for a very long time.

By utilizing a characteristic in which the potential of the gate electrode of the transistor 1160 can be held, writing, holding, and reading of data are possible as described below.

First, writing and holding of data will be described. First, a potential of the fourth wiring S2 is set to a potential at which the transistor 1162 is turned on, so that the transistor 1162 is turned on. Thus, a potential of the third wiring S1 is supplied to the gate electrode of the transistor 1160 (writing). After that, the potential of the fourth wiring S2 is set to a potential at which the transistor 1162 is turned off, so that the transistor 1162 is turned off, and thus, the potential of the gate electrode of the transistor 1160 is held (holding).

Since the off-state current of the transistor 1162 is small, the potential of the gate electrode of the transistor 1160 is held for a long time. For example, when the potential of the gate electrode of the transistor 1160 is a potential at which the transistor 1160 is in an on state, the on state of the transistor 1160 is held for a long time. In addition, when the potential of the gate electrode of the transistor 1160 is a potential at which the transistor 1160 is an off state, the off state of the transistor 1160 is held for a long time.

Secondly, reading of data will be described. When a predetermined potential (a potential lower than the potential of the second wiring) is supplied to the first wiring SL in a state where the on state or the off state of the transistor 1160 is held as described above, a potential of the second wiring BL varies depending on the on state or the off state of the transistor 1160. For example, when the transistor 1160 is in the on state, the potential of the second wiring BL is lowered to become closer to the potential of the first wiring SL. On the other hand, when the transistor 1160 is in the off state, the potential of the second wiring BL is not changed.

In such a manner, the potential of the second wiring BL and the predetermined potential are compared with each other in a state where data is held, whereby the data can be read out.

Then, rewriting of data will be described. Rewriting of data is performed in a manner similar to that of the writing and holding of data. That is, a potential of the fourth wiring S2 is set to a potential at which the transistor 1162 is turned on, so that the transistor 1162 is turned on. Thus, a potential of the third wiring S1 (a potential for new data) is supplied to the gate electrode of the transistor 1160. After that, the potential of the fourth wiring S2 is set to a potential at which the transistor 1162 is turned off, so that the transistor 1162 is turned off, and thus, the new data is held.

In the memory cell according to the disclosed invention, data can be directly rewritten by another writing of data as described above. For that reason, erasing operation which is necessary for a flash memory or the like is not needed, so that decrease in operation speed because of erasing operation can be suppressed. In other words, high-speed operation of the semiconductor device including the memory cell can be realized.

Figure 19B:
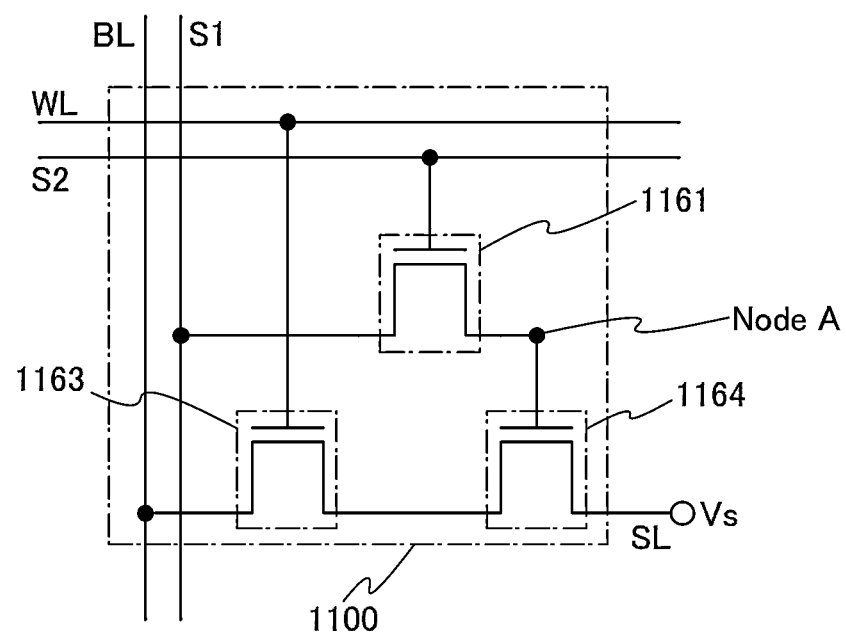

FIG. 19B is a circuit diagram illustrating an application example of the memory cell illustrated in FIG. 19A.

A memory cell 1100 illustrated in FIG. 19B includes a first wiring SL (a source line), a second wiring BL (a bit line), a third wiring S1 (a first signal line), a fourth wiring S2 (a second signal line), a fifth wiring WL (a word line), a transistor 1164 (a first transistor), a transistor 1161 (a second transistor), and a transistor 1163 (a third transistor). In each of the transistors 1164 and 1163, a channel formation region is formed using a material other than an oxide semiconductor, and in the transistor 1161, a channel formation region is formed using an oxide semiconductor.

Here, a gate electrode of the transistor 1164 is electrically connected to one of a source electrode and a drain electrode of the transistor 1161. In addition, the first wiring SL is electrically connected to a source electrode of the transistor 1164, and a drain electrode of the transistor 1164 is electrically connected to a source electrode of the transistor 1163. The second wiring BL is electrically connected to a drain electrode of the transistor 1163, and the third wiring S1 is electrically connected to the other of the source electrode and the drain electrode of the transistor 1161. The fourth wiring S2 is electrically connected to a gate electrode of the transistor 1161, and the fifth wiring WL is electrically connected to a gate electrode of the transistor 1163.

Next, operation of the circuit will be specifically described.

When data is written into the memory cell 1100, the first wiring SL is set to 0 V, the fifth wiring WL is set to 0 V, the second wiring BL is set to 0 V, and the fourth wiring S2 is set to 2 V. The third wiring S1 is set to 2 V in order to write data "1" and set to 0 V in order to write data "0". At this time, the transistor 1163 is in an off state and the transistor 1161 is in an on state. Note that, to finish writing, before the potential of the third wiring S1 is changed, the fourth wiring S2 is set to 0 V so that the transistor 1161 is turned off.

As a result, a potential of a node (referred to as a node A) connected to the gate electrode of the transistor 1164 is set to approximately 2 V after the writing of data "1" and set to approximately 0 V after the writing of data "0". Electric charge corresponding to a potential of the third wiring S1 is accumulated at the node A; since the off-state current of the transistor 1161 is small, the potential of the gate electrode of the transistor 1164 is held for a long time.

When data is read from the memory cell, the first wiring SL is set to 0 V, the fifth wiring WL is set to 2 V, the fourth wiring S2 is set to 0 V, the third wiring S1 is set to 0 V, and a reading circuit connected to the second wiring BL is set in an operation state. At this time, the transistor 1163 is in an on state and the transistor 1161 is in an off state.

The transistor 1164 is in an off state when data "0" has been written, that is, the node A is set to approximately 0 V, so that the resistance between the second wiring BL and the first wiring SL is high. On the other hand, the transistor 1164 is in an on state when data "1" has been written, that is, the node A is set to approximately 2 V, so that the resistance between the second wiring BL and the first wiring SL is low. The reading circuit can read data "0" or data "1" in accordance with the difference in resistance state of the memory cell. The second wiring BL at the time of the writing is set to 0 V; however, it may be in a floating state or may be charged to have a potential higher than 0 V. The third wiring S1 at the time of the reading is set to 0 V; however, it may be in a floating state or may be charged to have a potential higher than 0 V.

Note that data "1" and data "0" are defined for convenience and can be reversed. In addition, the above operation voltages are examples. The operation voltages are set so that the transistor 1164 is turned off in the case of data "0" and turned on in the case of data "1", the transistor 1161 is turned on at the time of writing and turned off in periods except the time of writing, and the transistor 1163 is turned on at the time of reading. A power supply potential VDD of a peripheral logic circuit may also be used instead of 2 V.

In this embodiment, the memory cell with a minimum storage unit (1 bit) is described for easy understanding; however, the structure of the memory cell is not limited thereto. It is also possible to make a more developed semiconductor device with a plurality of memory cells connected to each other as appropriate. For example, it is possible to make a NAND-type or NOR-type semiconductor device by using more than one of the above memory cells. The wiring structure is not limited to that in FIG. 19A or 19B and can be changed as appropriate.

Figure 20:
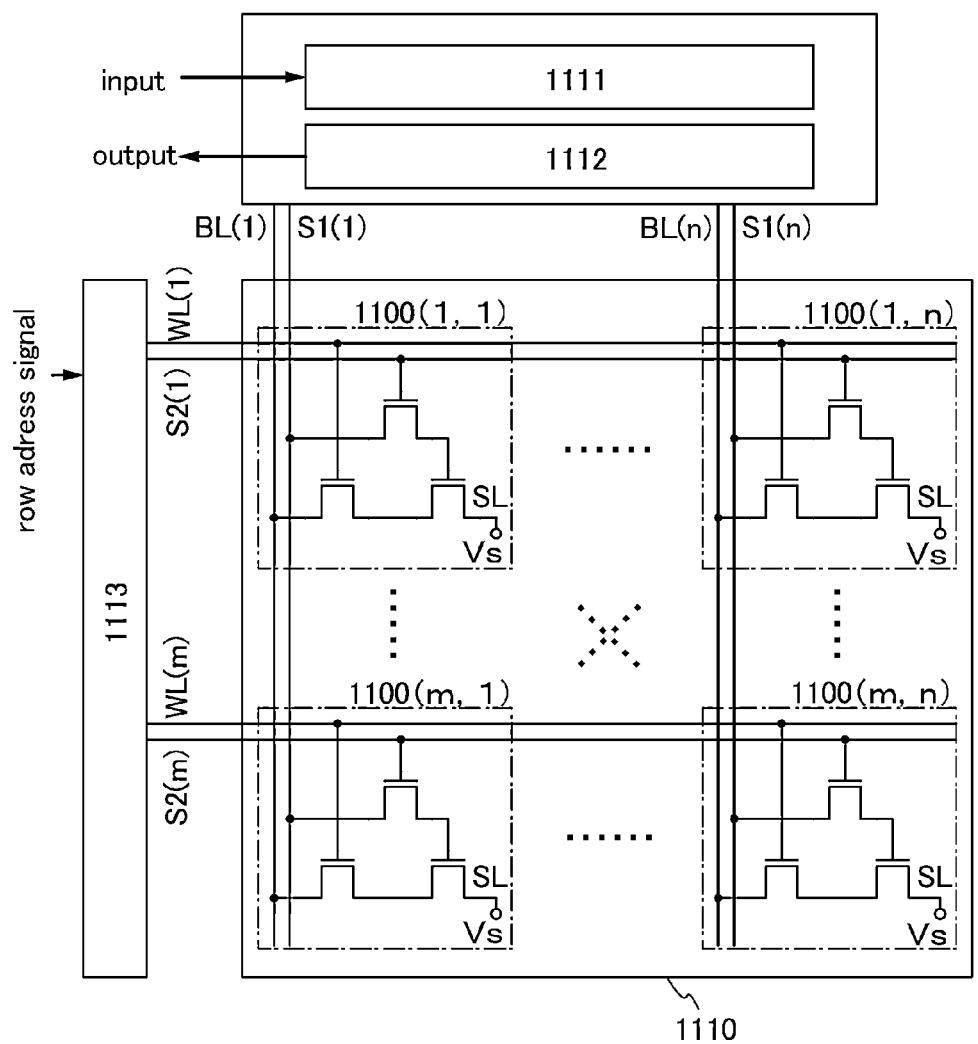
FIG. 20 is a circuit diagram illustrating one embodiment of the present invention.

FIG. 20 is a block circuit diagram of a semiconductor device according to one embodiment of the present invention. The semiconductor device has m×n bits of memory capacity.

The semiconductor device illustrated in FIG. 20 includes m fourth wirings S2, m fifth wirings WL, n second wirings BL, n third wirings S1, a memory cell array 1110 in which a plurality of memory cells 1100(1,1) to 1100(m,n) is arranged in a matrix of m rows by n columns (m and n are each a natural number), and peripheral circuits such as a driver circuit 1111 which is connected to the second wirings BL and the third wirings S1, a driver circuit 1113 which is connected to the fourth wirings S2 and the fifth wirings WL, and a reading circuit 1112. A refresh circuit or the like may be provided as another peripheral circuit.

A memory cell 1100(i,j) is considered as a typical example of the memory cell. Here, the memory cell 1100(i,j) (i is an integer greater than or equal to 1 and less than or equal to m and j is an integer greater than or equal to 1 and less than or equal to n) is connected to a second wiring BL(j), a third wiring S1(j), a fourth wiring S2(i), a fifth wiring WL(i), and a first wiring SL. A first wiring potential Vs is supplied to the first wiring SL. The second wirings BL(1) to BL(n) and the third wirings S1(1) to S1(n) are connected to the reading circuit 1112, and the driver circuit 1111 which are connected to the second wiring BL and the third wiring S1. The fifth wirings WL(1) to WL(m) and the fourth wirings S2(1) to S2(m) are connected to the driver circuit 1113 which are connected to the fourth wiring S2 and the fifth wiring WL.

The operation of the semiconductor device illustrated in FIG. 20 is described. In this structure, data is written and read per row.

When data is written into memory cells 1100(i,1) to 1100(i,n) of an i-th row, the potential Vs of the first wiring Vs is set to 0 V, the fifth wiring WL(i) is set to 0 V, the second wirings BL(1) to BL(n) are set to 0 V, and the fourth wiring S2(i) is set to 2 V. At this time, the transistors 1161 are turned on. Among the third wirings S1(1) to S1(n), the third wiring in a column in which data "1" is to be written is set to 2 V and the third wiring in a column in which data "0" is to be written is set to 0 V. Note that, to finish writing, the fourth wiring S2(i) is set to 0 V before the potentials of the third wirings S1(1) to S1(n) are changed, so that the transistors 1161 are turned off. Moreover, fifth wirings WL other than the fifth wiring WL(i) and fourth wirings S2 other than the fourth wiring S2(i) are set to 0 V.

As a result, the potential of the node (referred to as the node A) connected to the gate electrode of the transistor 1164 in the memory cell into which data "1" has been written is set to approximately 2 V, and the potential of the node A in the memory cell into which data "0" has been written is set to approximately 0 V. The potential of the node A of the non-selected memory cell is not changed.

When data is read from the memory cells 1100(i, 1) to 1100(i,n) of the i-th row, the potential Vs of the first wiring SL is set to 0 V, the fifth wiring WL(i) is set to 2 V, the fourth wiring S2(i) is set to 0 V, the third wirings S1(1) to S1(n) are set to 0 V, and the reading circuit connected to the second wirings BL(1) to BL(n) is set in an operation state. The reading circuit can read data "0" or data "1" in accordance with the difference in resistance state of the memory cell, for example. Note that the fifth wirings WL other than the fifth wiring WL(i) and the fourth wirings S2 other than the fourth wiring S2(i) are set to 0 V. The second wiring BL at the time of the writing is set to 0 V; however, it may be in a floating state or may be charged to have a potential higher than 0 V. The third wiring S1 at the time of the reading is set to 0 V; however, it may be in a floating state or may be charged to have a potential higher than 0 V.

Note that data "1" and data "0" are defined for convenience and can be reversed. In addition, the above operation voltages are examples. The operation voltages are set so that the transistor 1164 is turned off in the case of data "0" and turned on in the case of data "1", the transistor 1161 is turned on at the time of writing and turned off in periods except the time of writing, and the transistor 1163 is turned on at the time of reading. A power supply potential VDD of a peripheral logic circuit may also be used instead of 2 V.

This embodiment can be implemented combining with any of the other embodiments as appropriate.

Embodiment 8

Figure 21A:
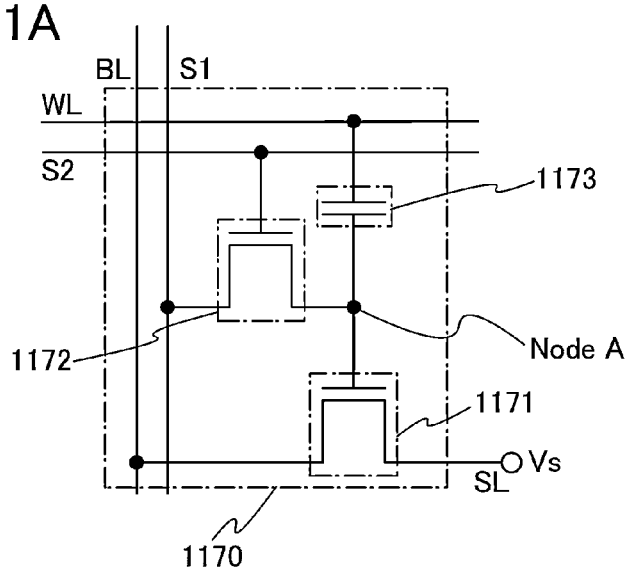
FIGS. 21A and 21B are circuit diagrams each illustrating one embodiment of the present invention.

In this embodiment, an example of a circuit diagram of a memory cell including a capacitor will be shown. A memory cell 1170 illustrated in FIG. 21A includes a first wiring SL, a second wiring BL, a third wiring S1, a fourth wiring S2, a fifth wiring WL, a transistor 1171 (a first transistor), a transistor 1172 (a second transistor), and a capacitor 1173. In the transistor 1171, a channel formation region is formed using a material other than an oxide semiconductor, and in the transistor 1172, a channel formation region is formed using an oxide semiconductor.

Here, a gate electrode of the transistor 1171, one of a source electrode and a drain electrode of the transistor 1172, and one electrode of the capacitor 1173 are electrically connected to each other. In addition, the first wiring SL and a source electrode of the transistor 1171 are electrically connected to each other. The second wiring BL and a drain electrode of the transistor 1171 are electrically connected to each other. The third wiring S1 and the other of the source electrode and the drain electrode of the transistor 1172 are electrically connected to each other. The fourth wiring S2 and a gate electrode of the transistor 1172 are electrically connected to each other. The fifth wiring WL and the other electrode of the capacitor 1173 are electrically connected to each other.

Next, operation of the circuit will be specifically described.

When data is written into the memory cell 1170, the first wiring SL is set to 0 V, the fifth wiring WL is set to 0 V, the second wiring BL is set to 0 V, and the fourth wiring S2 is set to 2 V. The third wiring S1 is set to 2 V in order to write data "1" and set to 0 V in order to write data "0". At this time, the transistor 1172 is turned on. Note that, to finish writing, the fourth wiring S2 is set to 0 V before the potential of the third wiring S1 is changed, so that the transistor 1172 is turned off.

As a result, the potential of a node (referred to as a node A) connected to the gate electrode of the transistor 1171 is set to approximately 2 V after the writing of data "1" and set to approximately 0 V after the writing of data "0".

When data is read from the memory cell 1170, the first wiring SL is set to 0 V, the fifth wiring WL is set to 2 V, the fourth wiring S2 is set to 0 V, the third wiring S1 is set to 0 V, and a reading circuit connected to the second wiring BL is set in an operation state. At this time, the transistor 1172 is turned off.

The state of the transistor 1171 in the case where the fifth wiring WL is set to 2 V will be described. The potential of the node A which determines the state of the transistor 1171 depends on capacitance C1 between the fifth wiring WL and the node A, and capacitance C2 between the gate electrode of the transistor 1171 and the source and drain electrodes of the transistor 1171.

Note that the third wiring S1 at the time of the reading is set to 0 V; however, it may be in a floating state or may be charged to have a potential higher than 0 V. Data "1" and data "0" are defined for convenience and can be reversed.

The potential of the third wiring S1 at the time of writing may be selected from the potentials of data "0" and data "1" as long as the transistor 1172 is turned off after the writing and the transistor 1171 is in an off state in the case where the potential of the fifth wiring WL is set to 0 V. The potential of the fifth wiring WL at the time of reading is set so that the transistor 1171 is turned off in the case of data "0" and turned on in the case of data "1". Furthermore, the threshold voltage of the transistor 1171 is an example. The transistor 1171 can have any threshold voltage as long as the transistor 1171 can operate in the above-described manner.

An example of a NOR-type semiconductor memory device in which a memory cell including a capacitor and a selection transistor having a first gate electrode and a second gate electrode (a back gate electrode) is used will be described with reference to FIG. 21B.

Figure 21B:
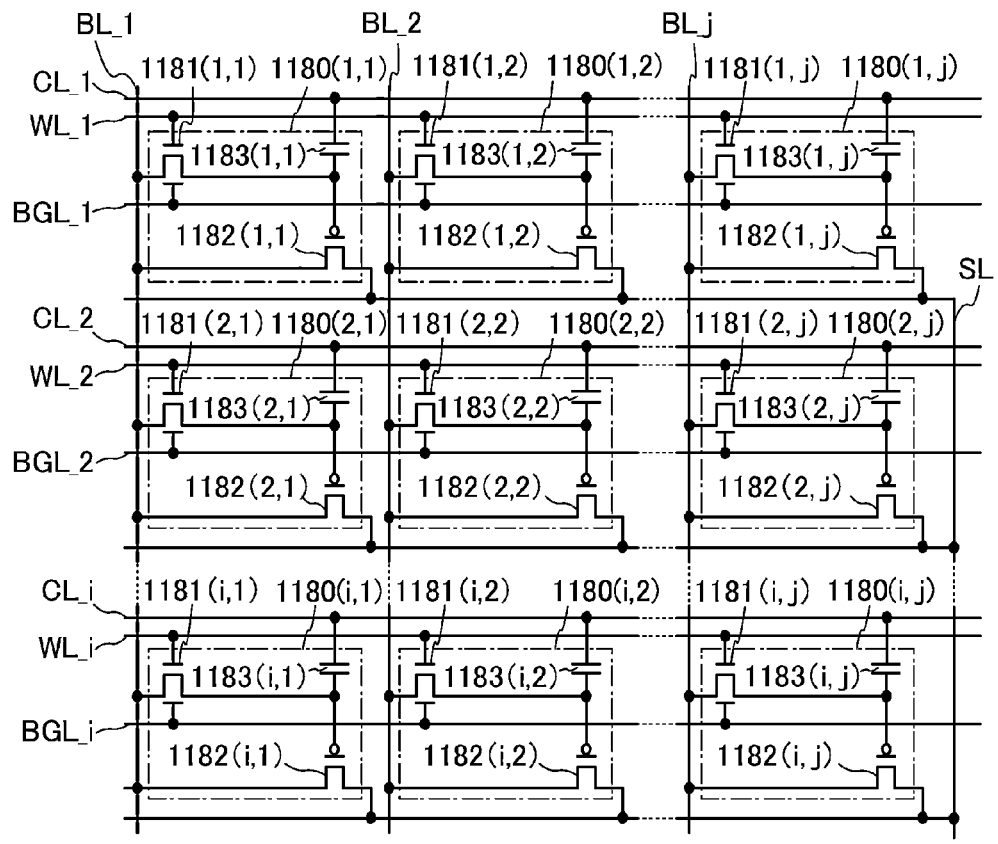

A semiconductor device according to one embodiment of the present invention illustrated in FIG. 21B includes a memory cell array including a plurality of memory cells arranged in matrix of I rows (I is a natural number of 2 or more) and J columns (J is a natural number).

The memory cell array illustrated in FIG. 21B includes a plurality of memory cells 1180 arranged in matrix of i rows (i is a natural number of 3 or more) and j columns (j is a natural number of 3 or more), i word lines WL (word lines WL_1 to WL_i), i capacitor lines CL (capacitor lines CL_1 to CL_i), i gate lines BGL (gate lines BGL_1 to BGL_i), j bit lines BL (bit lines BL_1 to BL_j), and a source line SL.

Further, each of the plurality of memory cells 1180 (also referred to as a memory cell 1180(M,N) (note that M is a natural number greater than or equal to 1 and less than or equal to i and that N is a natural number greater than or equal to 1 and less than or equal to j)) includes a transistor 1181(M,N), a capacitor 1183 (M,N), and a transistor 1182 (M,N).

Note that in the semiconductor memory device, the capacitor includes a first capacitor electrode, a second capacitor electrode, and a dielectric layer overlapping with the first capacitor electrode and the second capacitor electrode. Electric charge is accumulated in the capacitor in accordance with voltage applied between the first capacitor electrode and the second capacitor electrode.

The transistor 1181(M,N) is an n-channel transistor, which has a source electrode, a drain electrode, a first gate electrode, and a second gate electrode. Note that in the semiconductor memory device in this embodiment, the transistor 1181 does not necessarily need to be an n-channel transistor.

One of the source electrode and the drain electrode of the transistor 1181(M,N) is connected to a bit line BL_N. The first gate electrode of the transistor 1181(M,N) is connected to a word line WL_M. The second gate electrode of the transistor 1181(M,N) is connected to a gate line BGL_M. With the structure in which the one of the source electrode and the drain electrode of the transistor 1181(M,N) is connected to the bit line BL_N, data can be selectively read from memory cells.

The transistor 1181(M,N) serves as a selection transistor in the memory cell 1180(M,N).

As the transistor 1181(M,N), a transistor in which a channel formation region is formed using an oxide semiconductor can be used.

The transistor 1182(M,N) is a p-channel transistor. Note that in the semiconductor memory device in this embodiment, the transistor 1182 does not necessarily need to be a p-channel transistor.

One of a source electrode and a drain electrode of the transistor 1182(M,N) is connected to the source line SL. The other of the source electrode and the drain electrode of the transistor 1182(M,N) is connected to the bit line BL_N. A gate electrode of the transistor 1182(M,N) is connected to the other of the source electrode and the drain electrode of the transistor 1181(M,N).

The transistor 1182(M,N) serves as an output transistor in the memory cell 1180(M,N). As the transistor 1182(M,N), for example, a transistor in which a channel formation region is formed using single crystal silicon can be used.

A first capacitor electrode of the capacitor 1183(M,N) is connected to a capacitor line CL M. A second capacitor electrode of the capacitor 1183(M,N) is connected to the other of the source electrode and the drain electrode of the transistor 1181(M,N). Note that the capacitor 1183(M,N) serves as a storage capacitor.

The voltages of the word lines WL_1 to WL_i are controlled by, for example, a driver circuit including a decoder.

The voltages of the bit lines BL_1 to BL_j are controlled by, for example, a driver circuit including a decoder.

The voltages of the capacitor lines CL_1 to CL_i are controlled by, for example, a driver circuit including a decoder.

The voltages of the gate lines BGL_1 to BGL_i are controlled by, for example, a gate line driver circuit.

The gate line driver circuit is formed using a circuit which includes a diode and a capacitor whose first capacitor electrode is electrically connected to an anode of the diode and the gate line BGL, for example.

By adjustment of the voltage of the second gate electrode of the transistor 1181, the threshold voltage of the transistor 1181 can be adjusted. Accordingly, by adjustment of the threshold voltage of the transistor 1181 functioning as a selection transistor, current flowing between the source electrode and the drain electrode of the transistor 1181 in an off state can be made extremely small. Thus, a data retention period in the memory circuit can be made longer. In addition, voltage necessary for writing and reading data can be made lower than that of a conventional semiconductor device; thus, power consumption can be reduced.

This embodiment can be implemented combining with any of the other embodiments as appropriate.

Embodiment 9

In this embodiment, an example of a semiconductor device using the transistor described in the above embodiments will be described with reference to FIGS. 22A and 22B.

Figure 22A:
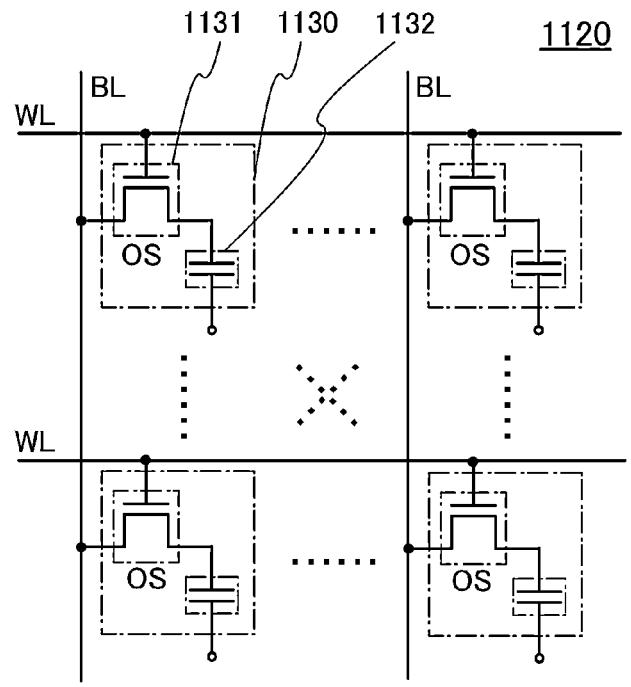
FIGS. 22A and 22B are circuit diagrams each illustrating one embodiment of the present invention.

FIG. 22A illustrates an example of a semiconductor device whose structure corresponds to that of a so-called dynamic random access memory (DRAM). A memory cell array 1120 illustrated in FIG. 22A has a structure in which a plurality of memory cells 1130 is arranged in a matrix. Further, the memory cell array 1120 includes m first wirings BL and n second wirings WL. Note that in this embodiment, the first wiring BL, the second wiring WL and the third wiring BLB are referred to as a bit line BL, a word line WL and a bit line BLB (a inverted bit line), respectively.

The memory cell 1130 includes a transistor 1131 and a capacitor 1132. A gate electrode of the transistor 1131 is connected to the second wiring WL. Further, one of a source electrode and a drain electrode of the transistor 1131 is connected to the first wiring BL. The other of the source electrode and the drain electrode of the transistor 1131 is connected to one electrode of the capacitor. The other electrode of the capacitor is connected to a capacitor line CL and is supplied with a predetermined potential. The transistor described in any of the above embodiments is applied to the transistor 1131.

The transistor whose channel formation region is formed using an oxide semiconductor, which is described in any of the above embodiments, is characterized by having small off-state current. Accordingly, when the transistor is applied to the semiconductor device illustrated in FIG. 22A, which is regarded as a so-called DRAM, a substantially nonvolatile memory can be obtained.

Figure 22B:
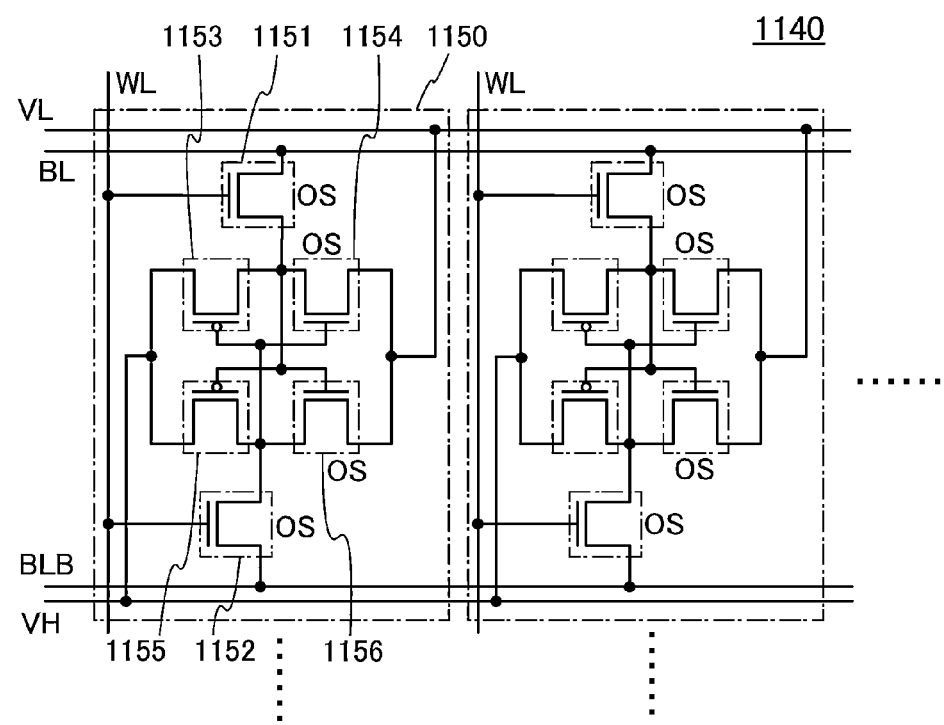

FIG. 22B illustrates an example of a semiconductor device whose structure corresponds to that of a so-called static random access memory (SRAM). A memory cell array 1140 illustrated in FIG. 22B can have a structure in which a plurality of memory cells 1150 is arranged in a matrix. Further, the memory cell array 1140 includes a plurality of first wirings BL, a plurality of second wirings WL, a plurality of third wirings BLB, a power source line VH to which a high level power source potential VDD is supplied and a power source line VL to which a low level power source potential VSS is supplied.

The memory cell 1150 includes a first transistor 1151, a second transistor 1152, a third transistor 1153, a fourth transistor 1154, a fifth transistor 1155, and a sixth transistor 1156. The first transistor 1151 and the second transistor 1152 function as selection transistors. One of the third transistor 1153 and the fourth transistor 1154 is an n-channel transistor (here, the fourth transistor 1154 is an n-channel transistor), and the other of the third transistor 1153 and the fourth transistor 1154 is a p-channel transistor (here, the third transistor 1153 is a p-channel transistor). In other words, the third transistor 1153 and the fourth transistor 1154 form a CMOS circuit. Similarly, the fifth transistor 1155 and the sixth transistor 1156 form a CMOS circuit.

The first transistor 1151, the second transistor 1152, the fourth transistor 1154, and the sixth transistor 1156 are n-channel transistors and the transistor described in any of the above embodiments can be applied to these transistors. Each of the third transistor 1153 and the fifth transistor 1155 is a p-channel transistor in which a channel formation region is formed using a material other than an oxide semiconductor (e.g., single-crystal silicon).

This embodiment can be implemented combining with any of the other embodiments as appropriate.

Embodiment 10

A central processing unit (CPU) can be formed using a transistor whose channel formation region is formed using an oxide semiconductor for at least part of the CPU.

Figure 23A:
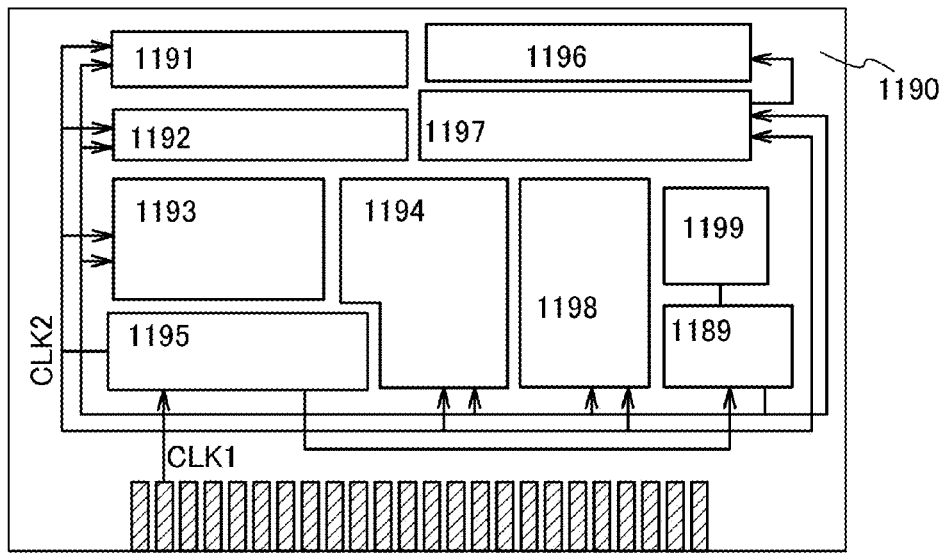
FIGS. 23A to 23C are a block diagram illustrating a specific example of a CPU and circuit diagrams each illustrating part of the CPU.

FIG. 23A is a block diagram illustrating a specific structure of a CPU. The CPU illustrated in FIG. 23A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM interface 1189 may be provided over a separate chip. Obviously, the CPU illustrated in FIG. 23A is only an example in which the structure is simplified, and an actual CPU may have various structures depending on the application.

An instruction that is input to the CPU through the Bus I/F 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/into the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the clock signal CLK2 to the above circuits.

In the CPU illustrated in FIG. 23A, a memory element is provided in the register 1196. The memory element described in Embodiment 7 can be used as the memory element provided in the register 1196.

In the CPU illustrated in FIG. 23A, the register controller 1197 selects operation of holding data in the register 1196 in accordance with an instruction from the ALU 1191. That is, the register controller 1197 selects whether data is held by a phase-inversion element or a capacitor in the memory element included in the register 1196. When data holding by the phase-inversion element is selected, power supply voltage is supplied to the memory element in the register 1196. When data holding by the capacitor is selected, the data is rewritten in the capacitor, and supply of power supply voltage to the memory element in the register 1196 can be stopped.

Figure 23B:
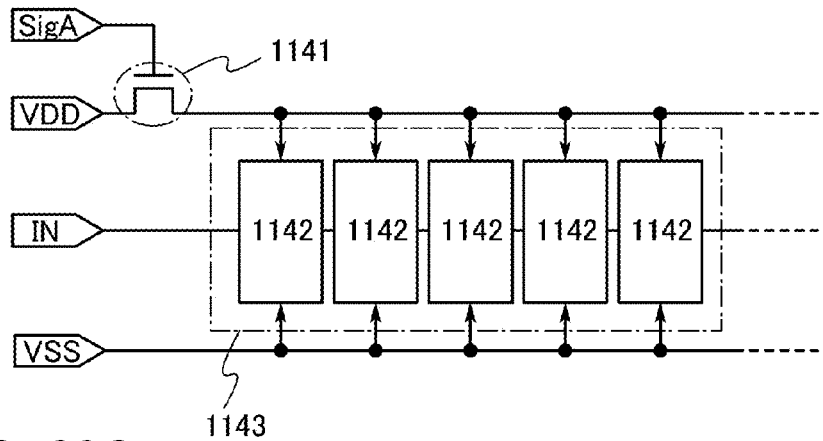
Figure 23C:
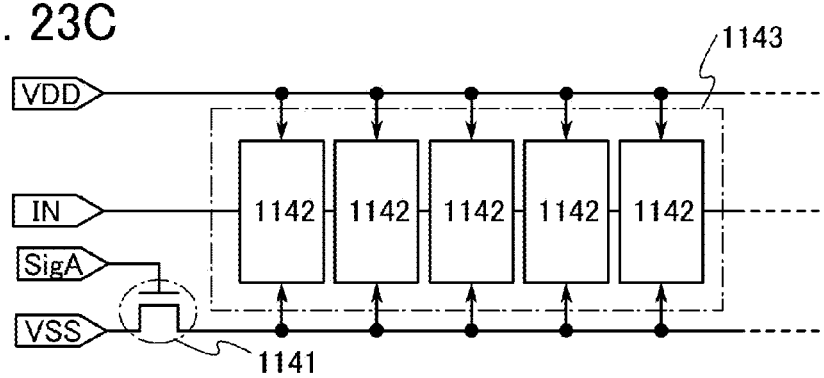

The power supply can be stopped by providing a switching element between a memory element group and a node to which a high-level power supply potential VDD or a low-level power supply potential VSS is supplied, as illustrated in FIG. 23B or FIG. 23C. Circuits illustrated in FIGS. 23B and 23C are described below.

FIGS. 23B and 23C each illustrate an example of a structure of a memory circuit including a transistor in which a channel formation region is formed using an oxide semiconductor as a switching element for controlling supply of a power supply potential to a memory element.

The memory device illustrated in FIG. 23B includes a switching element 1141 and a memory element group 1143 including a plurality of memory elements 1142. Specifically, as each of the memory elements 1142, the memory element described in Embodiment 5 can be used. Each of the memory elements 1142 included in the memory element group 1143 is supplied with the high-level power supply potential VDD via the switching element 1141. Further, each of the memory elements 1142 included in the memory element group 1143 is supplied with a potential of a signal IN and the low-level power supply potential VSS.

In FIG. 23B, a transistor in which a channel formation region is formed using an oxide semiconductor is used as the switching element 1141, and the switching of the transistor is controlled by a signal Sig A supplied to a gate electrode thereof.

Note that FIG. 23B illustrates the structure in which the switching element 1141 includes only one transistor; however, without limitation thereto, the switching element 1141 may include a plurality of transistors. In the case where the switching element 1141 includes a plurality of transistors which serves as switching elements, the plurality of transistors may be connected to each other in parallel, in series, or in combination of parallel connection and series connection.

Although the switching element 1141 controls the supply of the high-level power supply potential VDD to each of the memory elements 1142 included in the memory element group 1143 in FIG. 23B, the switching element 1141 may control the supply of the low-level power supply potential VSS.

In FIG. 23C, an example of a memory device in which each of the memory elements 1142 included in the memory element group 1143 is supplied with the low-level power supply potential VSS via the switching element 1141 is illustrated. The supply of the low-level power supply potential VSS to each of the memory elements 1142 included in the memory element group 1143 can be controlled by the switching element 1141.

When a switching element is provided between a memory element group and a node to which the high-level power supply potential VDD or the low-level power supply potential VSS is supplied, data can be held even in the case where operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example, the transistor can also be applied to an LSI such as a digital signal processor (DSP), a custom LSI, or a field programmable gate array (FPGA).

Note that this embodiment can be implemented in combination with any of the structures described in the other embodiments, as appropriate.

Embodiment 11

In this embodiment, an example of an electronic device including the semiconductor device described in the above embodiments will be described.

Figure 24A:
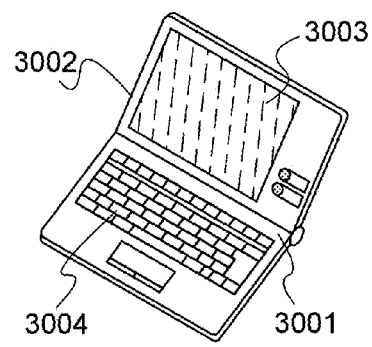
FIGS. 24A to 24F are diagrams each illustrating an example of an electronic device.

FIG. 24A illustrates a laptop personal computer, which includes a main body 3001, a housing 3002, a display portion 3003, a keyboard 3004, and the like. By using the semiconductor device described in any of the above embodiments, a laptop personal computer in which power consumption is low and reliability is high can be obtained.

Figure 24B:
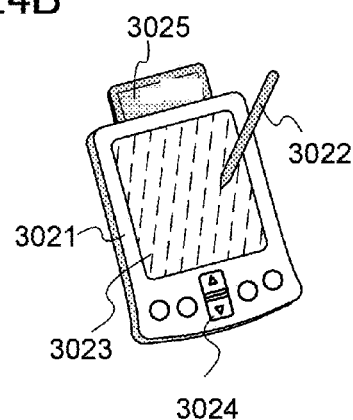

FIG. 24B illustrates a portable information terminal (PDA) including a display portion 3023, an external interface 3025, an operation button 3024, and the like in a main body 3021. A stylus 3022 is included as an accessory for operation. By using the semiconductor device described in any of the above embodiments, a personal digital assistant (PDA) in which power consumption is low and reliability is high can be obtained.

Figure 24C:
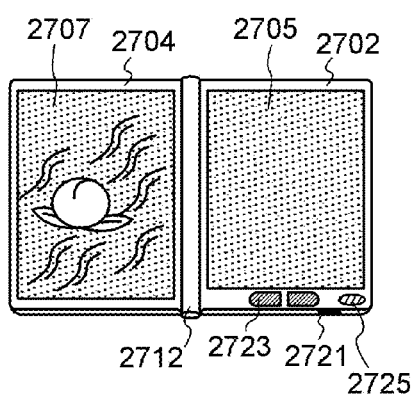

FIG. 24C illustrates an example of an e-book reader. For example, the e-book reader includes two housings, a housing 2702 and a housing 2704. The housing 2702 is combined with the housing 2704 by a hinge 2712, so that the e-book reader can be opened and closed using the hinge 2712 as an axis. With such a structure, the e-book reader 2700 can operate like a paper book.

A display portion 2705 and a display portion 2707 are incorporated in the housing 2702 and the housing 2704, respectively. The display portion 2705 and the display portion 2707 may display one image or different images. In the case where the display portion 2705 and the display portion 2707 display different images, for example, a display portion on the right side (the display portion 2705 in FIG. 24C) can display text and a display portion on the left side (the display portion 2707 in FIG. 24C) can display graphics. By using the semiconductor device described in any of the above embodiments, an e-book reader in which power consumption is low and reliability is high can be obtained.

FIG. 24C illustrates an example in which the housing 2702 is provided with an operation portion and the like. For example, the housing 2702 is provided with a power supply terminal 2721, operation keys 2723, a speaker 2725, and the like. With the operation key 2723, pages can be turned. Note that a keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Further, the electronic book device may have a function of an electronic dictionary.

The electronic book device may transmit and receive data wirelessly. Through wireless communication, desired book data or the like can be purchased and downloaded from an electronic book server.

Figure 24D:
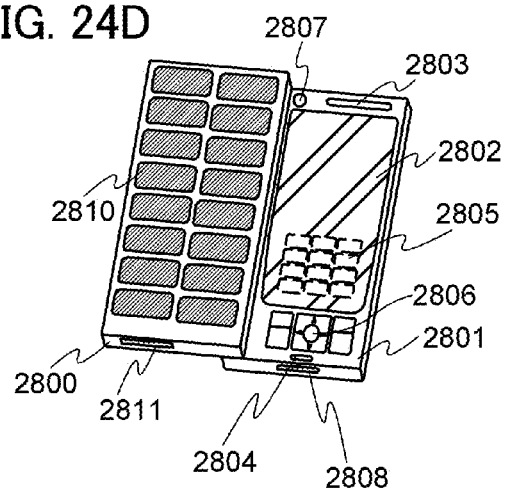

FIG. 24D illustrates a mobile phone, which includes two housings, a housing 2800 and a housing 2801. The housing 2801 includes a display panel 2802, a speaker 2803, a microphone 2804, a pointing device 2806, a camera lens 2807, an external connection terminal 2808, and the like. In addition, the housing 2800 includes a solar cell 2810 having a function of charge of the portable information terminal, an external memory slot 2811, and the like. Further, an antenna is incorporated in the housing 2801.

Further, the display panel 2802 is provided with a touch panel. A plurality of operation keys 2805 which are displayed as images are illustrated by dashed lines in FIG. 24D. Note that a boosting circuit by which a voltage output from the solar cell 2810 is increased to be sufficiently high for each circuit is also included.

In the display panel 2802, the display direction can be appropriately changed depending on a usage pattern. Further, the display device is provided with the camera lens 2807 on the same surface as the display panel 2802, and thus it can be used as a video phone. The speaker 2803 and the microphone 2804 can be used for videophone calls, recording and playing sound, and the like as well as voice calls. Moreover, the housings 2800 and 2801 in a state where they are developed as illustrated in FIG. 24D can shift by sliding so that one is lapped over the other; therefore, the size of the mobile phone can be reduced, which makes the mobile phone suitable for being carried.

The external connection terminal 2808 can be connected to an AC adapter and various types of cables such as a USB cable, and charging and data communication with a personal computer are possible. Moreover, a large amount of data can be stored by inserting a storage medium into the external memory slot 2811 and can be moved.

Further, in addition to the above functions, an infrared communication function, a television reception function, or the like may be provided. By using the semiconductor device described in any of the above embodiments, a mobile phone in which power consumption is low and reliability is high can be provided.

Figure 24E:
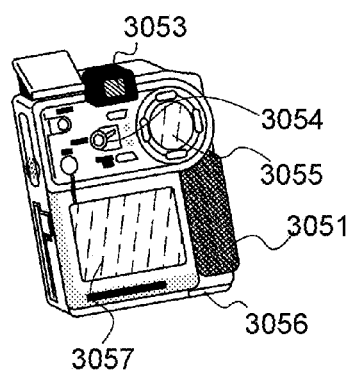

FIG. 24E is a digital video camera including a main body 3051, a display portion A 3057, an eye piece 3053, an operation switch 3054, a display portion B 3055, a battery 3056, and the like. By using the semiconductor device described in any of the above embodiments, a digital video camera in which power consumption is low and reliability is high can be provided.

Figure 24F:
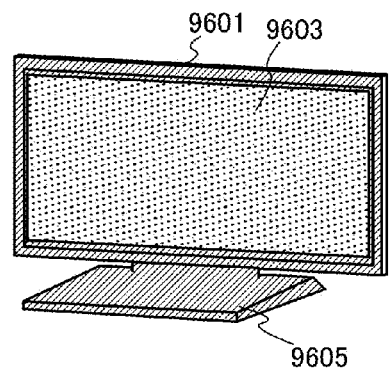

FIG. 24F illustrates an example of a television set. In the television set in FIG. 24F, a display portion 9603 is incorporated in a housing 9601. The display portion 9603 can display images. Here, the housing 9601 is supported by a stand 9605. By using the semiconductor device described in any of the above embodiments, a television set in which power consumption is low and reliability is high can be provided.

The television set can be operated by an operation switch of the housing 9601 or a separate remote controller. Further, the remote controller may be provided with a display portion for displaying data output from the remote controller.

Note that the television device is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

This embodiment can be implemented in appropriate combination with the structures described in any of the other embodiments.

Example 1

Figure 25:
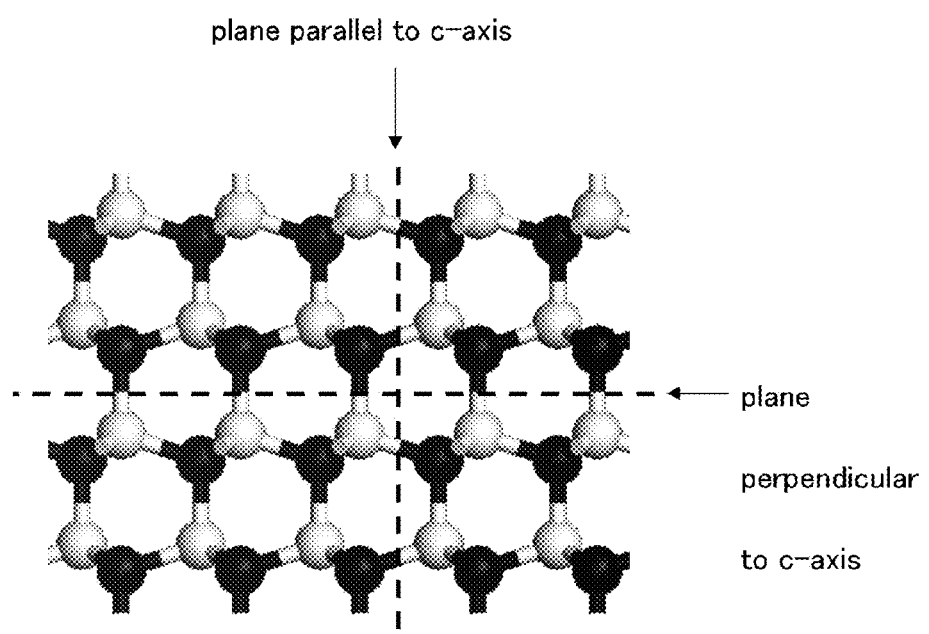
FIG. 25 is a diagram illustrating a model used for calculation.

Here, verification results on how easily oxygen vacancies are produced at a top surface and a side surface of an oxide semiconductor layer, obtained through calculation using the following model, will be described. Note that CAAC-OS is complicated to calculate due to having a plurality of crystal planes on one side surface. Therefore, calculation was conducted here using a ZnO single crystal that has a wurtzite structure having c-axis alignment. As crystal models, the (001) plane, the (100) plane, and the (110) plane obtained by cutting the crystal structure along planes parallel to the c-axis and a plane perpendicular to the c-axis as shown in FIG. 25 were used.

After making the surface structures, calculation of the cases in which oxygen is released from the (100) plane, the (110) plane, and the (001) plane as shown in FIGS. 26A to 26C was conducted, and the easiness of release was compared between the surface structures.

A model was made by cutting the crystal structure to have the (001) plane on the top surface. Since the calculation was conducted using a three-dimensional periodic structure, the model was a slab model having two (001) planes and having a vacuum region of 1 nm. Similarly, a slab model having the (100) plane on the surface and a slab model having the (110) plane on the surface were made as examples of the side surface because the side surface is assumed to be perpendicular to the (001) plane. By calculating these two planes, a tendency to release oxygen from planes perpendicular to the (001) plane can be analyzed. In this case also, the vacuum region is 1 nm. The number of atoms in the (100) plane model, the (110) plane model, and the (001) plane model were set to be 64, 108, and 108, respectively. Further, structures which were obtained by removing oxygen from the respective surfaces of the above three structures were made.

For the calculation, CASTEP, which is a program using the density functional theory, was used. A plane wave basis pseudopotential method was used as a method for the density functional theory, and GGA-PBE was used for a functional. First, in a four-atom unit cell of a wurtzite structure, the structure including a lattice constant was optimized. Next, based on the optimized structure, the surface structure was made. Then, the surface structure with oxygen vacancies and the surface structure without oxygen vacancies were subjected to structure optimization with a lattice constant fixed. Energy after the structure optimization was used.

The cut-off energy was assumed to be 380 eV in unit cell calculation and 300 eV in surface structure calculation. The k-points were 9×9×6 in the unit cell calculation, 3×2×1 in the (100) plane model calculation, 1×2×2 in the (110) plane model calculation, and 2×2×1 in the (001) plane model calculation.

The following calculation was performed on the above surface structures to obtain an energy difference (here, referred to as a bound energy): the energy of the structure with oxygen vacancies and half the energy of an oxygen molecule are added, and the energy of the structure without oxygen vacancies is subtracted therefrom. Oxygen is more likely to be released on the surface having a lower bound energy.

(Bound energy)=(Energy of the structure with oxygen vacancies)+(Half the energy of an oxygen molecule)−(Energy of the structure without oxygen vacancies) [Formula 2]

Bound energies of the respective surfaces obtained according to Formula 2 are shown in Table 1.

TABLE 1

|  | Bound energy |
|---|---|
| (100) plane model | 2.89 |
| (110) plane model | 2.64 |
| (001) plane model | 3.38 |

From the result in Table 1, it can be said that bound energies of the (100) plane and the (110) plane are lower than that of the (001) plane and oxygen is more likely to be released from the (100) plane and the (110) plane than from the (001) plane. In other words, it can be found that oxygen is more likely to be released from the side surface than the top surface of the ZnO film having c-axis alignment in a direction perpendicular to the top surface. Although ZnO, which is an example of CAAC-OS, has mixed various crystal planes, it has the same kind of planes as a ZnO single crystal on its side surface. Therefore, it can be said that a tendency to release oxygen of ZnO is similar to that of the ZnO single crystal.

This application is based on Japanese Patent Application serial no. 2011-004418 filed with Japan Patent Office on Jan. 12, 2011, the entire contents of which are hereby incorporated by reference.

What is claimed is:

1. A method for manufacturing a semiconductor device, comprising the steps of:
    forming a gate electrode over a substrate;
    forming a gate insulating layer over the gate electrode;
    forming an oxide semiconductor layer over the gate insulating layer;
    performing heat treatment on the oxide semiconductor layer;
    forming a source electrode and a drain electrode over the oxide semiconductor layer after the heat treatment;
    forming a resist mask over the oxide semiconductor layer;
    performing etching on the oxide semiconductor layer using the resist mask; and
    forming an insulating layer so as to cover the oxide semiconductor layer, the source electrode, and the drain electrode after performing the etching,
    wherein the resist mask overlaps with the gate electrode, the source electrode and the drain electrode, and
    wherein part of the source electrode and part of the drain electrode, the part not overlapping with the resist mask, are also used as masks for the etching.

2. The method for manufacturing a semiconductor device, according to claim 1, wherein the gate insulating layer contains excessive oxygen with respect to a stoichiometry proportion.

3. The method for manufacturing a semiconductor device, according to claim 1, wherein oxygen is supplied from the gate insulating layer to the oxide semiconductor layer by the heat treatment.

4. The method for manufacturing a semiconductor device, according to claim 1, wherein the heat treatment is performed at higher than or equal to 300° C. and lower than or equal to 450° C.

5. The method for manufacturing a semiconductor device, according to claim 1, wherein the oxide semiconductor layer comprises at least one element selected from In, Ga, Sn, and Zn.

6. The method for manufacturing a semiconductor device, according to claim 1, wherein the oxide semiconductor layer is non-single-crystal.

7. A method for manufacturing a semiconductor device, comprising the steps of:
    forming a gate electrode over a substrate;
    forming a gate insulating layer over the gate electrode;
    forming an oxide semiconductor layer over the gate insulating layer;
    forming a first insulating layer overlapping with the gate insulating layer with the oxide semiconductor layer interposed therebetween;
    performing heat treatment on the oxide semiconductor layer and the first insulating layer;
    forming a source electrode and a drain electrode over the oxide semiconductor layer and the first insulating layer;
    forming a resist mask over the oxide semiconductor layer, the first insulating layer, the source electrode and the drain electrode;
    performing etching on the oxide semiconductor layer using the resist mask; and
    forming a second insulating layer so as to cover the oxide semiconductor layer after performing the etching,
    wherein the resist mask overlaps with the gate electrode, and
    wherein part of the source electrode and part of the drain electrode are also used as masks for the etching.

8. The method for manufacturing a semiconductor device, according to claim 7, wherein the gate insulating layer contains excessive oxygen with respect to a stoichiometry proportion.

9. The method for manufacturing a semiconductor device, according to claim 7, wherein oxygen is supplied from the gate insulating layer and the first insulating layer to the oxide semiconductor layer by the heat treatment.

10. The method for manufacturing a semiconductor device, according to claim 7, wherein the heat treatment is performed at higher than or equal to 300° C. and lower than or equal to 450° C.

11. The method for manufacturing a semiconductor device, according to claim 7, wherein the oxide semiconductor layer comprises at least one element selected from In, Ga, Sn, and Zn.

12. The method for manufacturing a semiconductor device, according to claim 7, wherein the oxide semiconductor layer is non-single-crystal.

* * * * *